United States Patent
Beckman et al.

(10) Patent No.: US 10,727,865 B2
(45) Date of Patent: Jul. 28, 2020

(54) DATA STRIPING FOR MATCHING TECHNIQUES IN DATA COMPRESSION ACCELERATOR OF A DATA PROCESSING UNIT

(71) Applicant: Fungible, Inc., Santa Clara, CA (US)

(72) Inventors: Edward David Beckman, Santa Clara, CA (US); Satyanarayana Lakshmipathi Billa, Sunnyvale, CA (US); Rajan Goyal, Saratoga, CA (US)

(73) Assignee: Fungible, Inc., Santa Clara, CA (US)

( * ) Notice: Subject to any disclaimer, the term of this patent is extended or adjusted under 35 U.S.C. 154(b) by 69 days.

(21) Appl. No.: 16/195,617

(22) Filed: Nov. 19, 2018

(65) Prior Publication Data
US 2020/0162100 A1 May 21, 2020

(51) Int. Cl.
*G06F 15/16* (2006.01)
*H03M 7/30* (2006.01)
(Continued)

(52) U.S. Cl.
CPC ...... *H03M 7/3088* (2013.01); *G06F 12/0815* (2013.01); *G06F 13/1673* (2013.01);
(Continued)

(58) Field of Classification Search
CPC .. G06F 7/3088; G06F 12/0815; G06F 16/953; G06F 13/1673; G06F 16/9014; G06F 2212/401
See application file for complete search history.

(56) References Cited

U.S. PATENT DOCUMENTS

| 5,126,739 A | 6/1992 | Whiting et al. |
| 5,525,982 A | 6/1996 | Cheng et al. |

(Continued)

FOREIGN PATENT DOCUMENTS

EP 0913825 A2 6/1999

OTHER PUBLICATIONS

U.S. Appl. No. 15/949,692, filed Apr. 10, 2018, naming inventors Wael et al.
(Continued)

*Primary Examiner* — Moustafa M Meky
(74) *Attorney, Agent, or Firm* — Shumaker & Sieffert, P.A.

(57) ABSTRACT

A highly programmable device, referred to generally as a data processing unit, having multiple processing units for processing streams of information, such as network packets or storage packets, is described. The data processing unit includes one or more specialized hardware accelerators configured to perform acceleration for various data-processing functions. This disclosure describes a hardware-based programmable data compression accelerator for the data processing unit including a pipeline for performing string substitution. The disclosed string substitution pipeline, referred to herein as a "search block," is configured to perform string search and replacement functions to compress an input data stream. In some examples, the search block is a part of a compression process performed by the data compression accelerator. The search block may support single and multi-thread processing, and multiple levels of compression effort. In order to achieve high-throughput, the search block processes multiple input bytes per clock cycle per thread.

20 Claims, 26 Drawing Sheets

(51) Int. Cl.
  *G06F 12/0815* (2016.01)
  *G06F 16/953* (2019.01)
  *G06F 13/16* (2006.01)
  *G06F 16/901* (2019.01)
(52) U.S. Cl.
  CPC ........ *G06F 16/9014* (2019.01); *G06F 16/953* (2019.01); *G06F 2212/401* (2013.01)

(56) References Cited

U.S. PATENT DOCUMENTS

| | | | | |
|---|---|---|---|---|
| 9,077,368 | B2* | 7/2015 | Miller | H03M 7/30 |
| 9,166,620 | B2* | 10/2015 | Venkatachalam Jayaraman | H03M 7/40 |
| 9,325,813 | B2* | 4/2016 | Venkatachalam Jayaraman | H04W 8/06 |
| 9,363,339 | B2* | 6/2016 | Bhaskar | H03M 7/3088 |
| 9,584,155 | B1* | 2/2017 | Gopal | H03M 7/42 |
| 9,680,500 | B2* | 6/2017 | Bhaskar | H03M 7/3088 |
| 9,768,802 | B2* | 9/2017 | Gopal | H03M 7/42 |
| 9,825,648 | B1* | 11/2017 | Gopal | H03M 7/3086 |
| 9,853,660 | B1* | 12/2017 | Gopal | H03M 7/3086 |
| 10,224,956 | B2* | 3/2019 | Gopal | H03M 7/3086 |
| 10,277,716 | B2* | 4/2019 | Bhaskar | H03M 7/3088 |
| 10,528,539 | B2* | 1/2020 | Guilford | G06F 3/0604 |
| 10,567,458 | B2* | 2/2020 | Bhaskar | H04L 69/04 |
| 2009/0077252 | A1 | 3/2009 | Abdo et al. | |
| 2011/0307659 | A1 | 12/2011 | Hans et al. | |
| 2012/0262314 | A1 | 10/2012 | Carlson | |
| 2018/0287965 | A1 | 10/2018 | Sindhu et al. | |
| 2018/0293168 | A1 | 10/2018 | Noureddine et al. | |
| 2019/0012278 | A1 | 1/2019 | Sindhu et al. | |
| 2019/0012350 | A1 | 1/2019 | Sindhu et al. | |
| 2019/0013965 | A1 | 1/2019 | Sindhu et al. | |

OTHER PUBLICATIONS

U.S. Appl. No. 16/197,179, filed Nov. 20, 2018, naming inventors Grey et al.
U.S. Appl. No. 16/195,564, filed Nov. 19, 2018, naming inventors Beckman et al.
U.S. Appl. No. 16/195,209, filed Nov. 19, 2018, naming inventors Beckman et al.
U.S. Appl. No. 16/195,290, filed Nov. 19, 2018, naming inventors Beckman et al.
U.S. Appl. No. 16/200,484, filed Nov. 26, 2018, naming inventors Billa et al.
U.S. Appl. No. 16/195,644, filed Nov. 19, 2018, naming inventors Beckman et al.
Deutsch, "DEFLATE Compressed Data Format Specification version 1.3," Network Working Group, RFC 1951, May 1996, 15 pp.
"Range encoding," Wikipedia, the free encyclopedia, accessed from https://en.wikipedia.org/wiki/Range_encoding on or about May 7, 2019, last edit made Jan. 2, 2019, 6 pp.
"Lempel-Ziv-Markov chain algorithm," Wikipedia, the free encyclopedia, accessed from https://en.wikipedia.org/wiki/Lempel-Ziv-Markov_chain_algorithm on or about May 7, 2019, last edit made Mar. 17, 2019, 15 pages.
"Lloyd/ easylzma," GitHub, accessed from https://github.com/lloyd/easylzma on or about May 7, 2019, last commit made Apr. 1, 2009, 2 pp.
Martin, "Range encoding: an algorithm for removing redundancy from a digitised message," Video & Data Recording Conference, Mar. 1979, 11 pp.
Deutsch, "Deflate Compressed Data Format Specification version 1.3," Internet Draft Deflate 1.3, Feb. 1, 1996, 15 pp.
International Search Report and Written Opinion of International Application No. PCT/US2019/062026 dated Mar. 20, 2020, 76 pp.

* cited by examiner

| | | | | | |
|---|---|---|---|---|---|
| BANK 8 | 255,999 255,744 | ... | 4095 | 3840 | |
| | | | | 2047 | 1792 |
| BANK 7 | 255,743 255,488 | ... | 3839 | 3584 | |
| | | | | 1791 | 1536 |
| BANK 6 | 255,487 255,232 | ... | 3583 | 3328 | |
| | | | | 1535 | 1280 |
| BANK 5 | 255,231 254,976 | ... | 3327 | 3072 | |
| | | | | 1279 | 1024 |
| BANK 4 | 254,975 254,720 | ... | 3071 | 2816 | |
| | | | | 1023 | 768 |
| BANK 3 | 254,719 254,464 | ... | 2815 | 2560 | |
| | | | | 767 | 512 |
| BANK 2 | 254,463 254,208 | ... | 2559 | 2304 | |
| | | | | 511 | 256 |
| BANK 1 | 254,207 253,952 | ... | 2303 | 2048 | |
| | | | | 255 | 0 |

DATA STRIPING FOR MATCHING TECHNIQUES IN DATA COMPRESSION ACCELERATOR OF A DATA PROCESSING UNIT

TECHNICAL FIELD

The disclosure relates to processing packets of information, for example, in the fields of networking and storage.

BACKGROUND

In a typical computer network, a large collection of interconnected servers provides computing and/or storage capacity for execution of various applications. A data center is one example of a large-scale computer network and typically hosts applications and services for subscribers, i.e., customers of the data center. The data center may, for example, host all of the infrastructure equipment, such as compute nodes, networking and storage systems, power systems, and environmental control systems. In most data centers, clusters of storage systems and application servers are interconnected via a high-speed switch fabric provided by one or more tiers of physical network switches and routers. Data centers vary greatly in size, with some public data centers containing hundreds of thousands of servers, and are usually distributed across multiple geographies for redundancy.

Many devices within a computer network, e.g., storage/compute servers, firewalls, intrusion detection devices, switches, routers or other network attached devices, often use general purpose processors, including multi-core processing systems, to process data, such as network or storage data. However, general purpose processing cores and multi-processing systems are normally not designed for high-capacity network and storage workloads of modern network and can be relatively poor at performing packet stream processing.

SUMMARY

In general, this disclosure describes a highly programmable device, referred to generally as a data processing unit, having multiple processing units for processing streams of information, such as network packets or storage packets. In some examples, the processing units may be processing cores, and in other examples, the processing units may be virtual processors, hardware threads, hardware blocks, or other sub-processing core units. As described herein, the data processing unit includes one or more specialized hardware accelerators configured to perform acceleration for various data-processing functions.

In various examples, this disclosure describes a hardware-based programmable data compression accelerator of the data processing unit that includes a pipeline for performing history-based compression on streams of information, such as network packets. The data compression accelerator comprises computer hardware used by the data processing unit to perform data compression functions more efficiently than in typical software-based compression running on general-purpose processors. The disclosed history-based compression pipeline, referred to herein as a "search block," is configured to perform string search and replacement functions to compress an input data stream. In some examples, the search block performs a first stage of a two-stage compression process implemented by the data compression accelerator. The second stage of the compression process includes application of entropy coding, such as by using either a Huffman coding block or a Range coding block, as examples.

As further described herein, in various examples, the search block of the hardware-based accelerator replaces a string of bytes in the input data stream with a previous occurrence of the same string of bytes to achieve compression. To accomplish this, in example implementations, the search block includes hardware sub-blocks referred to as a hash block, a match block, and a path block. The hash block is configured to prepare a 'key' at each input byte position by selecting 'N' number of bytes starting with the input byte at the respective position and use the key to calculate a hash index into a hash table. The hash block uses the hash index to access a bucket of the hash table that contains history addresses of any previous occurrences of the same string of bytes in the input data stream. The hash block then sends the history addresses of the previous occurrences to the match block and records the current byte position address into the same bucket in the hash table. The match block is configured to match the string of bytes at the current position with the string of bytes at the previous occurrences identified by the history addresses and send the matches to the path block. The path block is configured to pick the best match at each position (i.e., longest and closest, in that order) and send the best match as compressed output of the search block. The search block may support single and multi-thread processing, and multiple levels of effort with the level of compression increasing with the effort level. In accordance with the techniques of this disclosure, in order to achieve high-throughput, the search block may process multiple byte positions per clock cycle per thread.

In one example, this disclosure is directed to a method comprising receiving, by a search engine implemented as a pipeline of a processing device, an input data stream to be compressed; identifying, by the search engine, one or more history addresses of potential previous occurrences of a current byte string beginning at a current byte position in the input data stream; determining, by the search engine, whether at least one match occurs for the current byte string from among one or more previous occurrences of byte strings at the history addresses; selecting, by the search engine, an output for the current byte position, wherein the output for the current byte position comprises one of a reference to a match for the current byte string or a literal of original data at the current byte position; and transmitting, by the search engine, the selected output for the current byte position in an output data stream.

In another example, this disclosure is directed to a processing device comprising a memory, and a search engine implemented as a pipeline of the processing device. The search engine is configured to receive an input data stream to be compressed, identify one or more history addresses of potential previous occurrences of a current byte string beginning at a current byte position in the input data stream, determine whether at least one match occurs for the current byte string from among one or more previous occurrences of byte strings stored at the history addresses, select an output for the current byte position, wherein the output for the current byte position comprises one of a reference to a match for the current byte string or a literal of original data at the current byte position, and transmit the selected output for the current byte position in the input data stream.

The hash block is configured to index a set of M keys generated using N-byte strings at M byte positions into the hash table in parallel during a single clock cycle by dividing the hash table into banks and accessing the banks in parallel.

In this way, the hash block will process up to M byte positions per clock cycle. In the case of a bank conflict when attempting to read the hash table for two or more keys in the same cycle, the hash block may assign a first key position as a previous occurrence for a second key position. The hash block may be configured to avoid hash collisions by performing adaptive hashing in which the key size is different for non-text or binary data than for text data. The hash block may be further configured to resolve hash collisions by generating a tag for each key and then comparing the tag for the respective key against the tags of the entries stored in the hash bucket, where the tag bits are unique among colliding keys. Furthermore, the hash block may include a configurable hash table that supports single or multi-thread processing and different hash table sizes depending on the level of compression or effort desired.

In one example, this disclosure is directed to a method comprising generating, by a hash block of a search engine of a processing device, a hash key from a current byte string beginning at a current byte position in an input data stream to be compressed; computing, by the hash block, a hash index from the hash key using a hash function; accessing, by the hash block, a hash bucket of a hash table identified by the hash index; reading, by the hash block and during the hash table access, one or more history addresses of potential previous occurrences of the current byte string in the input data stream from the hash bucket identified by the hash index, wherein the history addresses comprise byte positions of previous occurrences of byte strings; and sending, by the hash block and to a subsequent block of the search engine, the one or more history addresses for use in compressing the input data stream based on matches to the current byte string from among the respective previous occurrences of byte strings stored at the history addresses.

In another example, this disclosure is directed to a processing device comprising a memory configured to store a hash table, and a hash block of a search engine of the processing device. The hash block is configured to generate a hash key from a current byte string beginning at a current byte position in an input data stream to be compressed; compute a hash index from the hash key using a hash function; access a hash bucket of the hash table identified by the hash index; read, during the hash table access, one or more history addresses of potential previous occurrences of the current byte string in the input data stream from the hash bucket identified by the hash index, wherein the history addresses comprise byte positions of previous occurrences of byte strings; and send, to a subsequent block of the search engine, the one or more history addresses for use in compressing the input data stream based on matches to the current byte string from among the respective previous occurrences of byte strings stored at the history addresses.

The match block is configured to determine whether string matches have occurred beginning at each byte position in a forward direction by comparing the previously processed input data stored at the history addresses received from the hash block. As part of the match checking, the match block may also be configured to perform backward matching. For backward matching, the match block may be configured to determine whether a byte sequence of one or more bytes beginning at each byte position in a backward direction matches a string of bytes at the identified history address. In this way, for each byte position, the match block may determine match lengths in both the forward direction and the backward direction beginning at the current byte position.

In one example, this disclosure is directed to a method comprising receiving, by a match block of a search engine of a processing device, one or more history addresses of potential previous occurrences of a current byte string beginning at a current byte position in an input data stream; determining, by the match block, whether at least one forward match occurs between the current byte position of the current byte string and the history addresses of one or more previous occurrences of byte strings, the forward match including subsequent byte positions in a forward direction of the input data stream, wherein the history addresses comprise byte positions of the previous occurrences of byte strings stored in a history buffer; determining, by the match block, whether at least one backward match occurs between the current byte position of the current byte string and the history addresses of the one or more previous occurrences of byte strings, the backward match including preceding byte positions in a backward direction of the input data stream; and sending, by the match block and to a subsequent block of the search engine, an indication of whether the at least one forward match and the at least one backward match occur for the current byte string for use in compressing the input data stream based on the matches.

In another example, this disclosure is directed to a processing device comprising a memory configured to store a history buffer, and a match block of a search engine of the processing device. The match block is configured to receive one or more history addresses of potential previous occurrences of a current byte string beginning at a current byte position in an input data stream; determine whether at least one forward match occurs between the current byte position of the current byte string and the history addresses of one or more previous occurrences of byte strings, the forward match including subsequent byte positions in a forward direction of the input data stream, wherein the history addresses comprise byte positions of the previous occurrences of byte strings stored in the history buffer; determine whether at least one backward match occurs between the current byte position of the current byte string and the history address for the one or more previous occurrences of byte strings, the backward match including preceding byte positions in a backward direction of the input data stream; and send, to a subsequent block of the search engine, an indication of whether the at least one forward match and the at least one backward match occur for the current byte string for use in compressing the input data stream based on the matches.

In some examples, the memory banks of the match block may be large enough to hold the entire history size allowed by a specific compression algorithm. In other examples, however, the memory banks may be smaller than the allowed history size. The entire history may be stored in the memory banks by striping the history data across the memory banks. Since most of the previous occurrence matches are close to the current byte position, this data striping increases the available history size of smaller memory banks while reducing bank conflicts when attempting to access the history to perform match checking for two or more addresses in the same cycle.

In one example, this disclosure is directed to a method comprising storing, by a match block of a search engine of a processing device, a history of an input data stream in a history buffer across two or more memory banks of the history buffer depending on an operational mode of the match block and a size of the history; receiving, by the match block, one or more history addresses of potential previous occurrences of a current byte string beginning at a current byte position in the input data stream; determining, by the match block, whether at least one match occurs for the current byte string from among one or more previous occurrences of byte strings stored at the one or more history addresses in the history buffer; and sending, by the match block and to a subsequent block of the search engine, an indication of whether the at least one match occurs for the current byte string for use in compressing the input data stream based on the match.

In another example, this disclosure is directed to a processing device comprising a memory configured to store a history buffer, and a match block of a search engine of the processing device. The match block is configured to store a history of an input data stream in the history buffer across two or more memory banks of the history buffer depending on an operational mode of the match block and a size of the history; receive one or more history addresses of potential previous occurrences of a current byte string beginning at a current byte position in the input data stream; determine whether at least one match occurs for the current byte string from among one or more previous occurrences of byte strings stored at the one or more history addresses in the history buffer; and send, to a subsequent block of the search engine, an indication of whether the at least one match occurs for the current byte string for use in compressing the input data stream based on the match.

The path block is configured to select the longest and closest match at each byte position and merge consecutive matches to form a longer match. When selecting the longest and closest match, the path block may consider the following sources of potential matches: forward matches from the current byte position, backward matches from subsequent byte positions, and carry forward matches from previous byte positions. In the case of carry forward matches, the path block may be configured to determine whether any matches from previous byte positions in the input data stream overlap a current byte position, and, if so, determine a truncated length of the match at the current byte position. The path block may also be configured to support lazy match in which the path block determines whether it is better to output a length-distance pair to represent a match beginning at the current byte position or to output a literal for the current byte position based on matches at other byte positions within a configurable window. When a match initially selected as output for the current byte position has a maximum match length, the path block may determine whether matches at any subsequent byte positions extend the length of the initial match, and, if so, merge the matches to form a longer match at the current byte position.

In one example, this disclosure is directed to a method comprising receiving, by a path block of a search engine of a processing device, an indication of whether at least one match occurs between a current byte string beginning at a current byte position in an input data stream and one or more history addresses of one or more previous occurrences of byte strings; when the at least one match occurs for the current byte string, determining, by the path block, a best match for the current byte position; selecting, by the path block, an output for the current byte position, wherein the output for the current byte position comprises one of a reference to the best match for the current byte string or a literal of original data at the current byte position; and transmitting the selected output for the current byte position in an output data stream.

In another example, this disclosure is directed to a processing device comprising a memory, and a path block of a search engine of the processing device. The path block is configured to receive an indication of whether at least one match occurs between a current byte string beginning at a current byte position in an input data stream and one or more history addresses of one or more previous occurrences of byte strings; when the at least one match occurs for the current byte string, determine a best match for the current byte position; select an output for the current byte position, wherein the output for the current byte position comprises one of a reference to the best match for the current byte string or a literal of original data at the current byte position; and transmit the selected output for the current byte position in an output data stream.

The details of one or more examples are set forth in the accompanying drawings and the description below. Other features, objects, and advantages of the invention will be apparent from the description and drawings, and from the claims.

BRIEF DESCRIPTION OF DRAWINGS

FIG. 15 is a conceptual diagram illustrating an example of striping data across multiple memory banks of the large history buffer of FIG. 14B.

DETAILED DESCRIPTION

Figure 1:
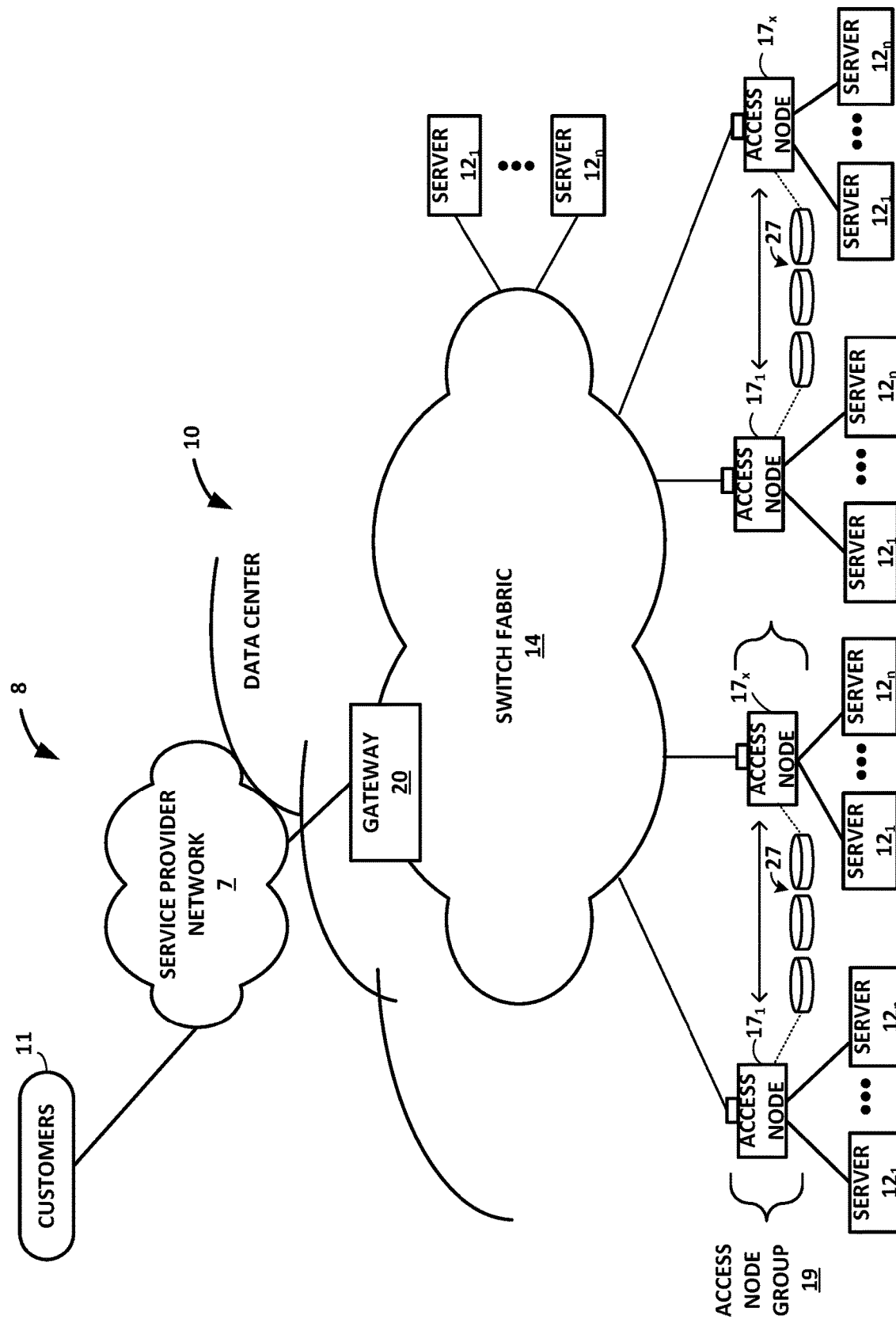
FIG. 1 is a block diagram illustrating an example system including one or more network devices configured to efficiently process a series of work units in a multiple core processor system.

FIG. 1 is a block diagram illustrating an example system 8 including one or more network devices configured to efficiently process a series of work units in a multiple core processor system. As described herein, techniques for caching and prefetching data from non-coherent memory may provide technical benefits that include improving the efficiency and utilization of processing cores within access nodes 17 in FIG. 1. Access nodes may also be referred to as data processing units (DPUs), or devices including DPUs, in this disclosure. In the example of FIG. 1, various data structures and processing techniques are described with respect to access nodes 17 within a data center 10. Other devices within a network, such as routers, switches, servers, firewalls, gateways and the like, having multiple core processor systems may readily be configured to utilize the data processing techniques described herein.

Data center 10 represents an example of a system in which various techniques described herein may be implemented. In general, data center 10 provides an operating environment for applications and services for customers 11 coupled to the data center by service provider network 7 and gateway device 20. Data center 10 may, for example, host infrastructure equipment, such as compute nodes, networking and storage systems, redundant power supplies, and environmental controls. Service provider network 7 may be coupled to one or more networks administered by other providers, and may thus form part of a large-scale public network infrastructure, e.g., the Internet.

In some examples, data center 10 may represent one of many geographically distributed network data centers. In the example of FIG. 1, data center 10 is a facility that provides information services for customers 11. Customers 11 may be collective entities such as enterprises and governments or individuals. For example, a network data center may host web services for several enterprises and end users. Other exemplary services may include data storage, virtual private networks, file storage services, data mining services, scientific- or super-computing services, and so on.

In the illustrated example, data center 10 includes a set of storage systems and application servers 12 interconnected via a high-speed switch fabric 14. In some examples, servers 12 are arranged into multiple different server groups, each including any number of servers up to, for example, n servers $12_1$-$12_n$. Servers 12 provide computation and storage facilities for applications and data associated with customers 11 and may be physical (bare-metal) servers, virtual machines running on physical servers, virtualized containers running on physical servers, or combinations thereof.

In the example of FIG. 1, each of servers 12 is coupled to switch fabric 14 by an access node 17 for processing streams of information, such as network packets or storage packets. In example implementations, access nodes 17 may be configurable to operate in a standalone network appliance having one or more access nodes. For example, access nodes 17 may be arranged into multiple different access node groups 19, each including any number of access nodes up to, for example, x access nodes $17_1$-$17_x$. In other examples, each access node may be implemented as a component (e.g., electronic chip) within a device, such as a compute node, application server, storage server, and may be deployed on a motherboard of the device or within a removable card, such as a storage and/or network interface card.

In general, each access node group 19 may be configured to operate as a high-performance I/O hub designed to aggregate and process network and/or storage I/O for multiple servers 12. As described above, the set of access nodes 17 within each of the access node groups 19 provide highly-programmable, specialized I/O processing circuits for handling networking and communications operations on behalf of servers 12. In addition, in some examples, each of access node groups 19 may include storage devices 27, such as solid state drives (SSDs) and/or hard disk drives (HDDs), configured to provide network accessible storage for use by applications executing on the servers 12. In some examples, one or more of the SSDs may comprise non-volatile memory (NVM) or flash memory. Each access node group 19, including its set of access nodes 17 and storage devices 27, and the set of servers 12 supported by the access nodes 17 of that access node group 19 may be referred to herein as a network storage compute unit.

As further described herein, in one example, each access node 17 is a highly programmable I/O processor specially designed for offloading certain functions from servers 12. In one example, each access node 17 includes a number of internal processor clusters, each including two or more processing cores and equipped with hardware engines that offload cryptographic functions, compression and regular expression (RegEx) processing, data storage functions including deduplication and erasure coding, and networking operations. In this way, each access node 17 includes components for fully implementing and processing network and storage stacks on behalf of one or more servers 12. In addition, access nodes 17 may be programmatically configured to serve as a security gateway for its respective servers 12, freeing up the processors of the servers to dedicate resources to application workloads. In some example implementations, each access node 17 may be viewed as a network interface subsystem that implements full offload of the handling of data packets (with zero copy in server memory) and storage acceleration for the attached server systems. In one example, each access node 17 may be implemented as one or more application-specific integrated circuit (ASIC) or other hardware and software components, each supporting a subset of the servers. In accordance with the techniques of this disclosure, any or all of access nodes 17 may include a data compression accelerator unit. That is, one or more computing devices may include an access node including one or more data compression accelerator units, according to the techniques of this disclosure.

The data compression accelerator unit of the access node, according to the techniques of this disclosure, may be configured to process payloads of packets during various services as the packets are exchanged by access nodes 17, e.g., between access nodes 17 via switch fabric 14 and/or between servers 12. That is, as packets are exchanged between the devices, either for networking or for data storage and retrieval, the access node may perform data compression on payloads of the packet. For example, the access node may use one or more data compression accelerator units to perform history-based compression followed by entropy encoding. According to the techniques of this disclosure, each of the hardware-based data compression accelerator units may include a pipeline for performing the history-based compression (i.e., string search and replacement) more efficiently than is possible in software running on a general purpose processor. Although primary described herein as history-based compression, dictionary-based compression operates substantially similar.

In the example of FIG. 1, each access node 17 provides connectivity to switch fabric 14 for a different group of servers 12 and may be assigned respective IP addresses and provide routing operations for the servers 12 coupled thereto. Access nodes 17 may interface with and utilize switch fabric 14 so as to provide full mesh (any-to-any) interconnectivity such that any of servers 12 may communicate packet data for a given packet flow to any other of the servers using any of a number of parallel data paths within the data center 10. In addition, access nodes 17 described herein may provide additional services, such as storage (e.g., integration of solid-state storage devices), security (e.g., encryption), acceleration (e.g., compression), I/O offloading, and the like. In some examples, one or more of access nodes 17 may include storage devices, such as high-speed solid-state drives or rotating hard drives, configured to provide network accessible storage for use by applications executing on the servers. More details on the data center network architecture and interconnected access nodes illustrated in FIG. 1 are available in U.S. Provisional Patent Application No. 62/514,583, filed Jun. 2, 2017, entitled "Non-Blocking Any-to-Any Data Center Network with Packet Spraying Over Multiple Alternate Data Paths," the entire content of which is incorporated herein by reference.

Two example architectures of access nodes 17 are described below with respect to FIGS. 2, 3, and 4. With respect to either example, the architecture of each access node 17 comprises a multiple core processor system that represents a high performance, hyper-converged network, storage, and data processor and input/output hub. The architecture of each access node 17 is optimized for high performance and high efficiency stream processing.

A stream is defined as an ordered, unidirectional sequence of computational objects that can be of unbounded or undetermined length. In a simple example, a stream originates in a producer and terminates at a consumer, is operated on sequentially, and is flow-controlled. In some examples, a stream can be defined as a sequence of stream fragments, each representing a portion of data communicated by a stream. In one example, a stream fragment may include a memory block contiguously addressable in physical address space, an offset into that block, and a valid length. Streams can be discrete, such as a sequence of packets received from a network, or continuous, such as a stream of bytes read from a storage device. A stream of one type may be transformed into another type as a result of processing. Independent of the stream type, stream manipulation requires efficient fragment manipulation. An application executing on one of access nodes 17 may operate on a stream in three broad ways: the first is protocol processing, which consists of operating on control information or headers within the stream; the second is payload processing, which involves significant accessing of the data within the stream; and third is some combination of both control and data access.

Stream processing is a specialized type of conventional general-purpose processing supporting specialized limitations with regard to both access and directionality. Processing typically only accesses a limited portion of the stream at any time, called a "window," within which it may perform random accesses. Objects outside of the window are not accessible through a streaming interface. In contrast, general purpose processing views the whole memory as randomly accessible at any time. In addition, stream processing generally progresses in one direction, called the forward direction. These characteristics make stream processing amenable to pipelining, as different processors within one of access nodes 17 can safely access different windows within the stream.

As described herein, data processing units of access nodes 17 may process stream information by managing "work units." In general, a work unit (WU) is a container that is associated with a stream state and used to describe (i.e. point to) data within a stream (stored in memory) along with any associated meta-data and operations to be performed on the data. In the example of FIG. 1, streams of data units may dynamically originate within a peripheral unit of one of access nodes 17 (e.g. injected by a networking unit, a host unit, or a solid state drive interface), or within a processor of the one of access nodes 17, in association with one or more streams of data, and terminate at another peripheral unit or another processor of the one of access nodes 17. Each work unit maintained by a data processing unit is associated with an amount of work that is relevant to the entity executing the work unit for processing a respective portion of a stream.

Stream processing is typically initiated as a result of receiving one or more data units associated with respective portions of the stream and constructing and managing work units for processing respective portions of the data stream. In protocol processing, a portion would be a single buffer (e.g. packet), for example. Within access nodes 17, work units may be executed by processor cores, hardware blocks, I/O interfaces, or other computational processing units. For instance, a processor core of an access node 17 executes a work unit by accessing the respective portion of the stream from memory and performing one or more computations in accordance with the work unit. A component of the one of access nodes 17 may receive, execute or generate work units. A succession of work units may define how the access node processes a flow, and smaller flows may be stitched together to form larger flows.

For purposes of example, DPUs within each access node 17 may execute an operating system, such as a general-purpose operating system or a special-purpose operating system, that provides an execution environment for data plane software for data processing. Moreover, each DPU may be configured to utilize a work unit (WU) stack data structure (referred to as a 'WU stack' in a multiple core processor system. As described herein, the WU stack data structure may provide certain technical benefits, such as helping manage an event driven, run-to-completion programming model of an operating system executed by the multiple core processor system. The WU stack, in a basic form, may be viewed as a stack of continuation WUs used in addition to (not instead of) a program stack maintained by the operating system as an efficient means of enabling program execution to dynamically move between cores of the access node while performing high-rate stream processing. As described below, a WU data structure is a building block in the WU stack and can readily be used to compose a processing pipeline and services execution in a multiple core processor system. The WU stack structure carries state, memory, and other information in auxiliary variables external to the program stack for any given processor core. In some implementations, the WU stack may also provide an exception model for handling abnormal events and a 'success bypass' to shortcut a long series of operations. Further, the WU stack may be used as an arbitrary flow execution model for any combination of pipelined or parallel processing.

As described herein, access nodes 17 may process WUs through a plurality of processor cores arranged as processing pipelines within access nodes 17, and such processing cores may employ techniques to encourage efficient processing of such work units and high utilization of processing resources. For instance, a processing core (or a processing unit within a core) may, in connection with processing a series of work units, access data and cache the data into a plurality of segments of a level 1 cache associated with the processing core. In some examples, a processing core may process a work unit and cache data from non-coherent memory in a segment of the level 1 cache. The processing core may also concurrently prefetch data associated with a work unit expected to be processed in the future into another segment of the level 1 cache associated with the processing core. By prefetching the data associated with the future work unit in advance of the work unit being dequeued from a work unit queue for execution by the core, the processing core may be able to efficiently and quickly process a work unit once the work unit is dequeued and execution of the work unit is to commence by the processing core. More details on work units and stream processing by data processing units of access nodes are available in U.S. Provisional Patent Application No. 62/589,427, filed Nov. 21, 2017, entitled "Work Unit Stack Data Structures in Multiple Core Processor System," and U.S. Provisional Patent Application No. 62/625,518, entitled "EFFICIENT WORK UNIT PROCESSING IN A MULTICORE SYSTEM", filed Feb. 2, 2018, the entire contents of both being incorporated herein by reference.

As described herein, the data processing unit for access nodes 17 includes one or more specialized hardware-based accelerators configured to perform acceleration for various data-processing functions, thereby offloading tasks from the processing units when processing work units. That is, each accelerator is programmable by the processing cores, and one or more accelerators may be logically chained together to operate on stream data units, such as by providing cryptographic functions, compression and regular expression (RegEx) processing, data storage functions and networking operations.

This disclosure describes a hardware-based programmable data compression accelerator of a data processing unit that includes a pipeline for performing history-based compression. The data compression accelerator comprises computer hardware used by the data processing unit to perform data compression functions more efficiently than is possible in software running on a general purpose processor. The disclosed history-based compression pipeline, referred to herein as a "search block," is configured to perform string search and replacement functions to compress an input data stream. In some examples, the search block performs a first stage of a two-stage compression process performed by the data compression accelerator. The second stage of the compression process includes entropy coding, which may be performed using either a Huffman coding block or a Range coding block.

The search block replaces a string of bytes in the input data stream with a previous occurrence of the same string of bytes to achieve compression. To accomplish this, the search block includes hardware sub-blocks referred to as a hash block, a match block, and a path block. The hash block is configured to prepare a 'key' at each input byte position by selecting 'N' number of bytes starting with the input byte at the respective position, and use the key to calculate a hash index into a hash table. The hash block uses the hash index to access a bucket of the hash table that contains history addresses of any previous occurrences of the same string of bytes in the input data stream. The hash block then sends the history addresses of the previous occurrences to the match block, and records the current byte position address into the same bucket in the hash table. If the hash bucket is already full, the hash block may first drop or remove a history address of one of the previous occurrences to make room for the current byte position address in the hash bucket. The match block is configured to match the string of bytes at the current position with the string of bytes at the previous occurrences identified by the history addresses, and send the matches to the path block. The path block is configured to pick the best match at each position (i.e., longest and closest, in that order) and send the best match as compressed output of the search block. The search block may support single and multi-thread processing, and multiple levels of effort with the level of compression increasing with the effort level. In accordance with the techniques of this disclosure, in order to achieve high-throughput, the search block may process multiple byte positions per clock cycle per thread. The pipeline of the search block is described in more detail with respect to FIG. 7B.

The hash block is configured to index a set of M keys generated using N-byte strings at M byte positions into the hash table in parallel in a single clock cycle by dividing the hash table into banks and accessing the banks in parallel. In this way, the hash block will process up to M byte positions per clock cycle. In the case of a bank conflict when attempting to read the hash table for two or more keys in the same cycle, the hash block may assign a first key position as a previous occurrence for a second key position. The hash block may be configured to avoid hash collisions by performing adaptive hashing in which the key size is different for non-text or binary data than for text data. The hash block may be further configured to resolve hash collisions by generating a tag for each key and then comparing the tag for the respective key against the tags of the entries stored in the hash bucket, where the tag bits are unique among colliding keys. Furthermore, the hash block may include a configurable hash table that supports single or multi-thread processing and different hash table sizes depending on the level of compression or effort desired. The hash block is described in more detail with respect to FIG. 10.

The match block is configured to determine whether string matches have occurred beginning at each byte position in a forward direction by comparing the previously processed input data stored at the history addresses received from the hash block. As part of the match checking, the match block may also be configured to perform backward matching. For backward matching, the match block may be configured to determine whether an earlier byte sequence of one or more bytes beginning at each byte position in a backward direction matches a string of bytes at the identified history address. In this way, for each byte position, the match block may determine match lengths in both the forward direction and the backward direction beginning at the current byte position. The match block is described in more detail with respect to FIG. 13.

In some examples, the memory banks of the match block may be large enough to hold the entire history size allowed by a specific compression algorithm. In other examples, however, the memory banks may be smaller than the allowed history size. The entire history may be stored in the memory banks by striping the history data across the memory banks. Since most of the previous occurrence matches are close to the current byte position, this data striping increases the available history size of smaller memory banks while reducing bank conflicts when attempting to access the history to perform match checking for two or more addresses in the same cycle. Data striping is described in more detail with respect to FIG. 15.

The path block is configured to select the longest and closest match at each byte position and merge consecutive matches to form a longer match. When selecting the longest and closest match, the path block may consider the following sources of potential matches: forward matches from the current byte position, backward matches from subsequent byte positions, and carry forward matches from previous byte positions. In the case of carry forward matches, the path block may be configured to determine whether any matches from previous byte positions in the input data stream overlap a current byte position, and, if so, determine a truncated length of the match at the current byte position. The path block may also be configured to support lazy match in which the path block determines whether it is better to output a length-distance pair to represent a match beginning at the current byte position or to output a literal for the current byte position based on matches at other byte positions within a configurable window. As one example, the path block may determine to output a literal because a better match that compresses a longer sequence of input bytes is available within the next few byte positions within the configurable window. When a match initially selected as output for the current byte position has a maximum match length, the path block may determine whether matches at any subsequent byte positions extend the length of the initial match, and, if so, merge the matches to form a longer match at the current byte position. The path block is described in more detail with respect to FIG. 18.

Figure 2:
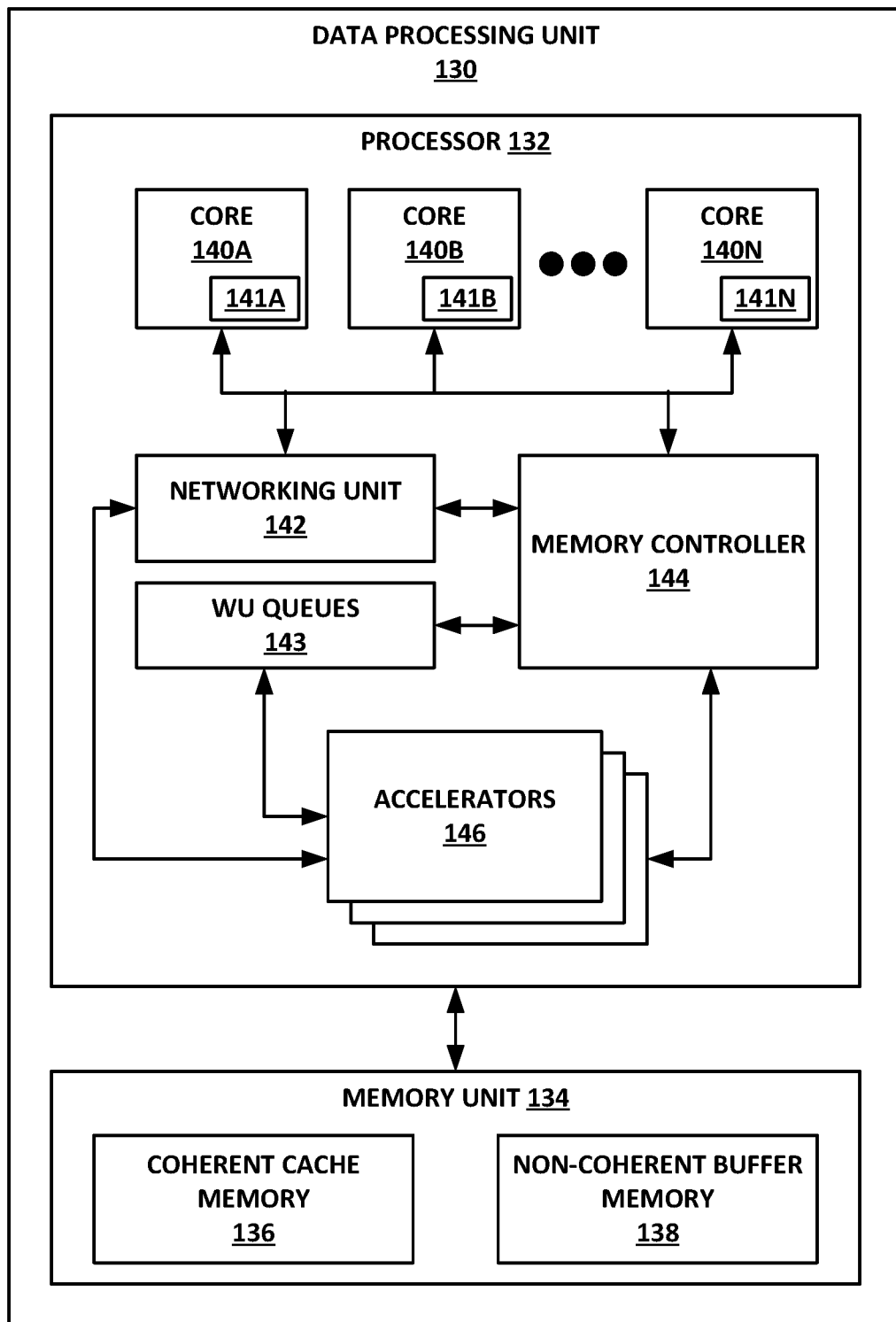
FIG. 2 is a block diagram illustrating an example data processing unit including two or more processing cores, in accordance with the techniques of this disclosure.

FIG. 2 is a block diagram illustrating an example data processing unit (DPU) 130 including two or more processing cores, in accordance with the techniques of this disclosure. DPU 130 generally represents a hardware chip implemented in digital logic circuitry and may be used in any computing or network device. DPU 130 may operate substantially similar to and generally represent any of access nodes 17 of FIG. 1. Thus, DPU 130 may be communicatively coupled to one or more network devices, server devices (e.g., servers 12), random access memory, storage media (e.g., solid state drives (SSDs)), a data center fabric (e.g., switch fabric 14), or the like, e.g., via PCI-e, Ethernet (wired or wireless), or other such communication media. Moreover, DPU 130 may be implemented as one or more application-specific integrated circuit (ASIC), may be configurable to operate as a component of a network appliance or may be integrated with other DPUs within a device.

In the illustrated example of FIG. 2, DPU 130 includes a multi-core processor 132 having a plurality of programmable processing cores 140A-140N ("cores 140") coupled to an on-chip memory unit 134. Each of cores 140 includes a level 1 cache 141 (level 1 caches 141a, 141b, and 141n are associated with cores 140a, 140b, and 140n, respectively).

Memory unit 134 may include two types of memory or memory devices, namely coherent cache memory 136 and non-coherent buffer memory 138. Processor 132 also includes a networking unit 142, work unit (WU) queues 143, a memory controller 144, and accelerators 146. As illustrated in FIG. 2, each of cores 140, networking unit 142, WU queues 143, memory controller 144, memory unit 134, and accelerators 146 are communicatively coupled to each other. In some examples, processor 132 of DPU 130 further includes one or more accelerators (not shown) configured to perform acceleration for various data-processing functions, such as look-ups, matrix multiplication, cryptography, compression, regular expressions, or the like.

In this example, DPU 130 represents a high performance, hyper-converged network, storage, and data processor and input/output hub. For example, networking unit 142 may be configured to receive one or more data packets from and transmit one or more data packets to one or more external devices, e.g., network devices. Networking unit 142 may perform network interface card functionality, packet switching, and the like, and may use large forwarding tables and offer programmability. Networking unit 142 may expose Ethernet ports for connectivity to a network, such as switch fabric 14 of FIG. 1. DPU 130 may also include one or more interfaces for connectivity to host devices (e.g., servers) and data storage devices, e.g., solid state drives (SSDs) via PCIe lanes. DPU 130 may further include one or more high bandwidth interfaces for connectivity to off-chip external memory.

Processor 132 further includes accelerators 146 configured to perform acceleration for various data-processing functions, such as look-ups, matrix multiplication, cryptography, compression, regular expressions, or the like. For example, accelerators 146 may comprise hardware implementations of look-up engines, matrix multipliers, cryptographic engines, compression engines, or the like. In accordance with the techniques of this disclosure, at least one of accelerators 146 represents a hardware implementation of a data compression engine. In particular, according to the techniques of this disclosure, accelerators 146 include at least one hardware-based data compression accelerator that includes a pipeline for performing history-based compression (i.e., string search and replacement functions) on an input data stream, as discussed in greater detail below.

Memory controller 144 may control access to on-chip memory unit 134 by cores 140, networking unit 142, and any number of external devices, e.g., network devices, servers, external storage devices, or the like. Memory controller 144 may be configured to perform a number of operations to perform memory management in accordance with the present disclosure. For example, memory controller 144 may be capable of mapping accesses from one of the cores 140 to either of coherent cache memory 136 or non-coherent buffer memory 138. More details on the bifurcated memory system included in the DPU are available in U.S. Provisional Patent Application No. 62/483,844, filed Apr. 10, 2017, and titled "Relay Consistent Memory Management in a Multiple Processor System," the entire content of which is incorporated herein by reference.

Cores 140 may comprise one or more microprocessors without interlocked pipeline stages (MIPS) cores, advanced reduced instruction set computing (RISC) machine (ARM) cores, performance optimization with enhanced RISC—performance computing (PowerPC) cores, RISC Five (RISC-V) cores, or complex instruction set computing (CISC or x86) cores. Each of cores 140 may be programmed to process one or more events or activities related to a given data packet such as, for example, a networking packet or a storage packet. Each of cores 140 may be programmable using a high-level programming language, e.g., C, C++, or the like.

Each of level 1 caches 141 may include a plurality of cache lines logically or physically divided into cache segments. Each of level 1 caches 141 may be controlled by a load/store unit also included within the core. The load/store unit may include logic for loading data into cache segments and/or cache lines from non-coherent buffer memory 138 and/or memory external to DPU 130. The load/store unit may also include logic for flushing cache segments and/or cache lines to non-coherent buffer memory 138 and/or memory external to DPU 130. In some examples, the load/store unit may be configured to prefetch data from main memory during or after a cache segment or cache line is flushed.

As described herein, processor cores 140 may be arranged as processing pipelines, and such processing cores may employ techniques to encourage efficient processing of such work units and high utilization of processing resources. For instance, any of processing cores 140 (or a processing unit within a core) may, in connection with processing a series of work units retrieved from WU queues 143, access data and cache the data into a plurality of segments of level 1 cache 141 associated with the processing core. In some examples, a processing core 140 may process a work unit and cache data from non-coherent memory 138 in a segment of the level 1 cache 141. As described herein, concurrent with execution of work units by cores 140, a load store unit of memory controller 144 may be configured to prefetch, from non-coherent memory 138, data associated with work units within WU queues 143 that are expected to be processed in the future, e.g., the WUs now at the top of the WU queues and next in line to be processed. For each core 140, the load store unit of memory controller 144 may store the prefetched data associated with the WU to be processed by the core into a standby segment of the level 1 cache 141 associated with the processing core 140.

In some examples, the plurality of cores 140 executes instructions for processing a plurality of events related to each data packet of one or more data packets, received by networking unit 142, in a sequential manner in accordance with one or more work units associated with the data packets. As described above, work units are sets of data exchanged between cores 140 and networking unit 142 where each work unit may represent one or more of the events related to a given data packet.

As one example use case, stream processing may be divided into work units executed at a number of intermediate processors between source and destination. Depending on the amount of work to be performed at each stage, the number and type of intermediate processors that are involved may vary. In processing a plurality of events related to each data packet, a first one of the plurality of cores 140, e.g., core 140A may process a first event of the plurality of events. Moreover, first core 140A may provide to a second one of plurality of cores 140, e.g., core 140B a first work unit of the one or more work units. Furthermore, second core 140B may process a second event of the plurality of events in response to receiving the first work unit from first core 140B.

As another example use case, transfer of ownership of a memory buffer between processing cores may be mediated by a work unit message delivered to one or more of processing cores 140. For example, the work unit message may be a four-word message including a pointer to a memory buffer. The first word may be a header containing information necessary for message delivery and information used for work unit execution, such as a pointer to a function for execution by a specified one of processing cores 140. Other words in the work unit message may contain parameters to be passed to the function call, such as pointers to data in memory, parameter values, or other information used in executing the work unit.

In one example, receiving a work unit is signaled by receiving a message in a work unit receive queue (e.g., one of WU queues 143). The one of WU queues 143 is associated with a processing element, such as one of cores 140, and is addressable in the header of the work unit message. One of cores 140 may generate a work unit message by executing stored instructions to addresses mapped to a work unit transmit queue (e.g., another one of WU queues 143). The stored instructions write the contents of the message to the queue. The release of a work unit message may be interlocked with (gated by) flushing of the core's dirty cache data and in some examples, prefetching into the cache of data associated with another work unit for future processing.

Figure 3:
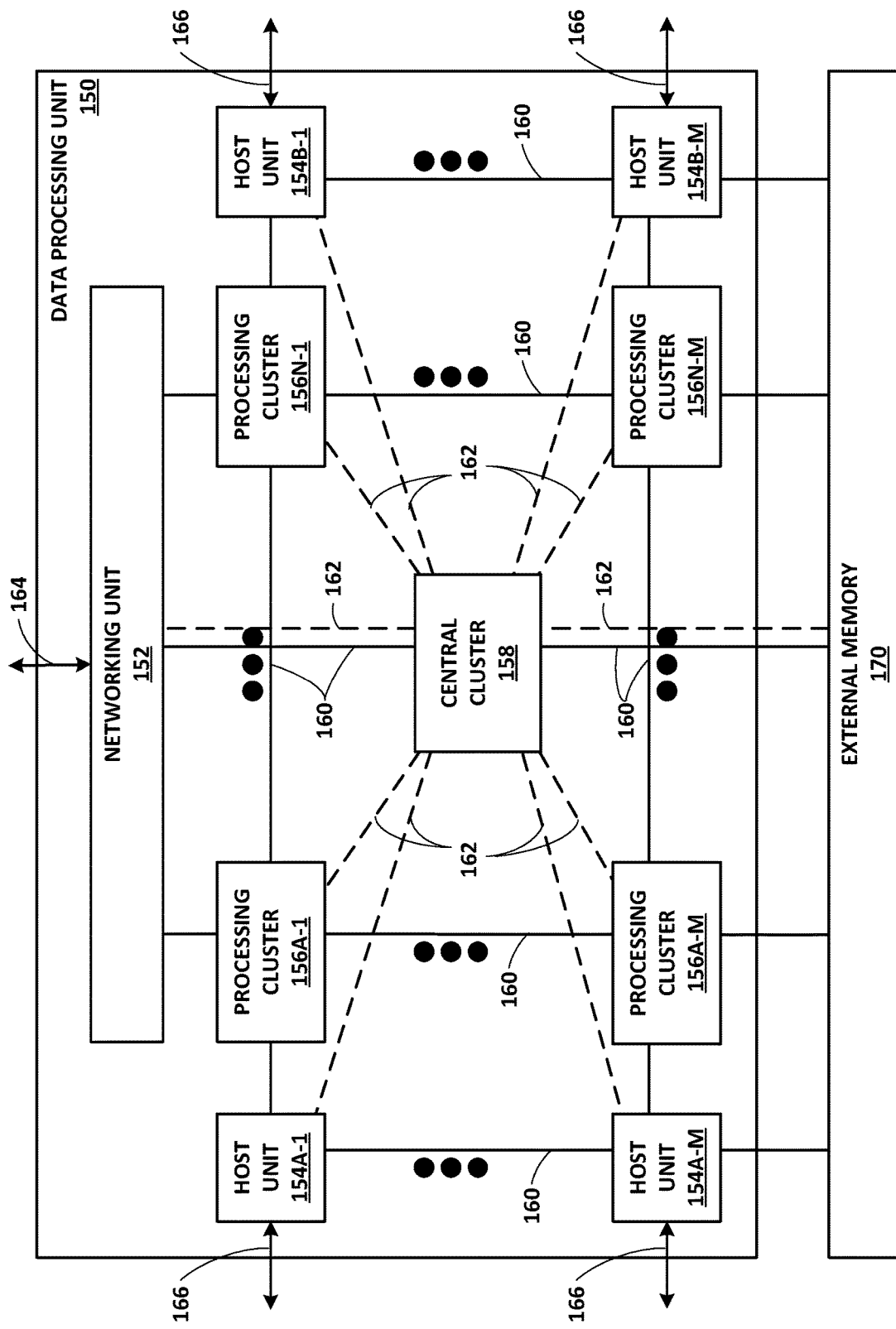
FIG. 3 is a block diagram illustrating another example data processing unit including two or more processing clusters, in accordance with the techniques of this disclosure.

FIG. 3 is a block diagram illustrating another example of a DPU 150 including two or more processing clusters, in accordance with the techniques of this disclosure. DPU 150 may operate substantially similar to any of the access nodes 17 of FIG. 1. Thus, DPU 150 may be communicatively coupled to a data center fabric (e.g., switch fabric 14), one or more server devices (e.g., servers 12), storage media (e.g., SSDs), one or more network devices, random access memory, or the like, e.g., via PCI-e, Ethernet (wired or wireless), or other such communication media in order to interconnect each of these various elements. DPU 150 generally represents a hardware chip implemented in digital logic circuitry. As various examples, DPU 150 may be provided as an integrated circuit mounted on a motherboard of a computing, networking and/or storage device or installed on a card connected to the motherboard of the device.

In general, DPU 150 represents a high performance, hyper-converged network, storage, and data processor and input/output hub. As illustrated in FIG. 3, DPU 150 includes networking unit 152, processing clusters 156A-1 to 156N-M (processing clusters 156), host units 154A-1 to 154B-M (host units 154), and central cluster 158, and is coupled to external memory 170. Each of host units 154, processing clusters 156, central cluster 158, and networking unit 152 may include a plurality of processing cores, e.g., MIPS cores, ARM cores, PowerPC cores, RISC-V cores, or CISC or x86 cores. External memory 170 may comprise random access memory (RAM) or dynamic random access memory (DRAM).

As shown in FIG. 3, host units 154, processing clusters 156, central cluster 158, networking unit 152, and external memory 170 are communicatively interconnected via one or more specialized network-on-chip fabrics. A set of direct links 162 (represented as dashed lines in FIG. 3) forms a signaling network fabric that directly connects central cluster 158 to each of the other components of DPU 150, that is, host units 154, processing clusters 156, networking unit 152, and external memory 170. A set of grid links 160 (represented as solid lines in FIG. 3) forms a data network fabric that connects neighboring components (including host units 154, processing clusters 156, networking unit 152, and external memory 170) to each other in a two-dimensional grid.

Networking unit 152 has Ethernet interfaces 164 to connect to the switch fabric, and interfaces to the data network formed by grid links 160 and the signaling network formed by direct links 162. Networking unit 152 provides a Layer 3 (i.e., OSI networking model Layer 3) switch forwarding path, as well as network interface card (NIC) assistance. One or more hardware direct memory access (DMA) engine instances (not shown) may be attached to the data network ports of networking unit 152, which are coupled to respective grid links 160. The DMA engines of networking unit 152 are configured to fetch packet data for transmission. The packet data may be in on-chip or off-chip buffer memory (e.g., within buffer memory of one of processing clusters 156 or external memory 170), or in host memory.

Host units 154 each have PCI-e interfaces 166 to connect to servers and/or storage devices, such as SSD devices. This allows DPU 150 to operate as an endpoint or as a root. For example, DPU 150 may connect to a host system (e.g., a server) as an endpoint device, and DPU 150 may connect as a root to endpoint devices (e.g., SSD devices). Each of host units 154 may also include a respective hardware DMA engine (not shown). Each DMA engine is configured to fetch data and buffer descriptors from host memory, and to deliver data and completions to host memory.

DPU 150 provides optimizations for stream processing. DPU 150 executes an operating system that facilitates run-to-completion processing, which may eliminate interrupts, thread scheduling, cache thrashing, and associated costs. For example, an operating system may run on one or more of processing clusters 156. Central cluster 158 may be configured differently from processing clusters 156, which may be referred to as stream processing clusters. In one example, central cluster 158 executes the operating system kernel (e.g., Linux kernel) as a control plane. Processing clusters 156 may function in run-to-completion thread mode of a data plane software stack of the operating system. That is, processing clusters 156 may operate in a tight loop fed by work unit queues associated with each processing core in a cooperative multi-tasking fashion.

DPU 150 operates on work units (WUs) that associate a buffer with an instruction stream to reduce dispatching overhead and allow processing by reference to minimize data movement and copy. The stream-processing model may structure access by multiple processors (e.g., processing clusters 156) to the same data and resources, avoid simultaneous sharing, and therefore, reduce contention. A processor may relinquish control of data referenced by a work unit as the work unit is passed to the next processor in line. Central cluster 158 may include a central dispatch unit responsible for work unit queuing and flow control, work unit and completion notification dispatch, and load balancing and processor selection from among processing cores of processing clusters 156 and/or central cluster 158.

As described above, work units are sets of data exchanged between processing clusters 156, networking unit 152, host units 154, central cluster 158, and external memory 170. Each work unit may be represented by a fixed length data structure, or message, including an action value and one or more arguments. In one example, a work unit message includes four words, a first word having a value representing an action value and three additional words each representing an argument. The action value may be considered a work unit message header containing information necessary for message delivery and information used for work unit execution, such as a work unit handler identifier, and source and destination identifiers of the work unit. The other arguments of the work unit data structure may include a frame argument having a value acting as a pointer to a continuation work unit to invoke a subsequent work unit handler, a flow argument having a value acting as a pointer to state that is relevant to the work unit handler, and a packet argument having a value acting as a packet pointer for packet and/or block processing handlers.

In some examples, one or more processing cores of processing clusters 180 may be configured to execute program instructions using a work unit (WU) stack. In general, a work unit (WU) stack is a data structure to help manage event driven, run-to-completion programming model of an operating system typically executed by processing clusters 156 of DPU 150, as further described in U.S. Patent Application Ser. No. 62/589,427, filed Nov. 21, 2017, the entire content of which is incorporated herein by reference.

As described herein, in some example implementations, load store units within processing clusters 156 may, concurrent with execution of work units by cores within the processing clusters, identify work units that are enqueued in WU queues for future processing by the cores. In some examples, WU queues storing work units enqueued for processing by the cores within processing clusters 156 may be maintained as hardware queues centrally managed by central cluster 158. In such examples, load store units may interact with central cluster 158 to identify future work units to be executed by the cores within the processing clusters. The load store units prefetch, from the non-coherent memory portion of external memory 170, data associated with the future work units. For each core within processing clusters 156, the load store units of the core may store the prefetched data associated with the WU to be processed by the core into a standby segment of the level 1 cache associated with the processing core.

Figure 4:
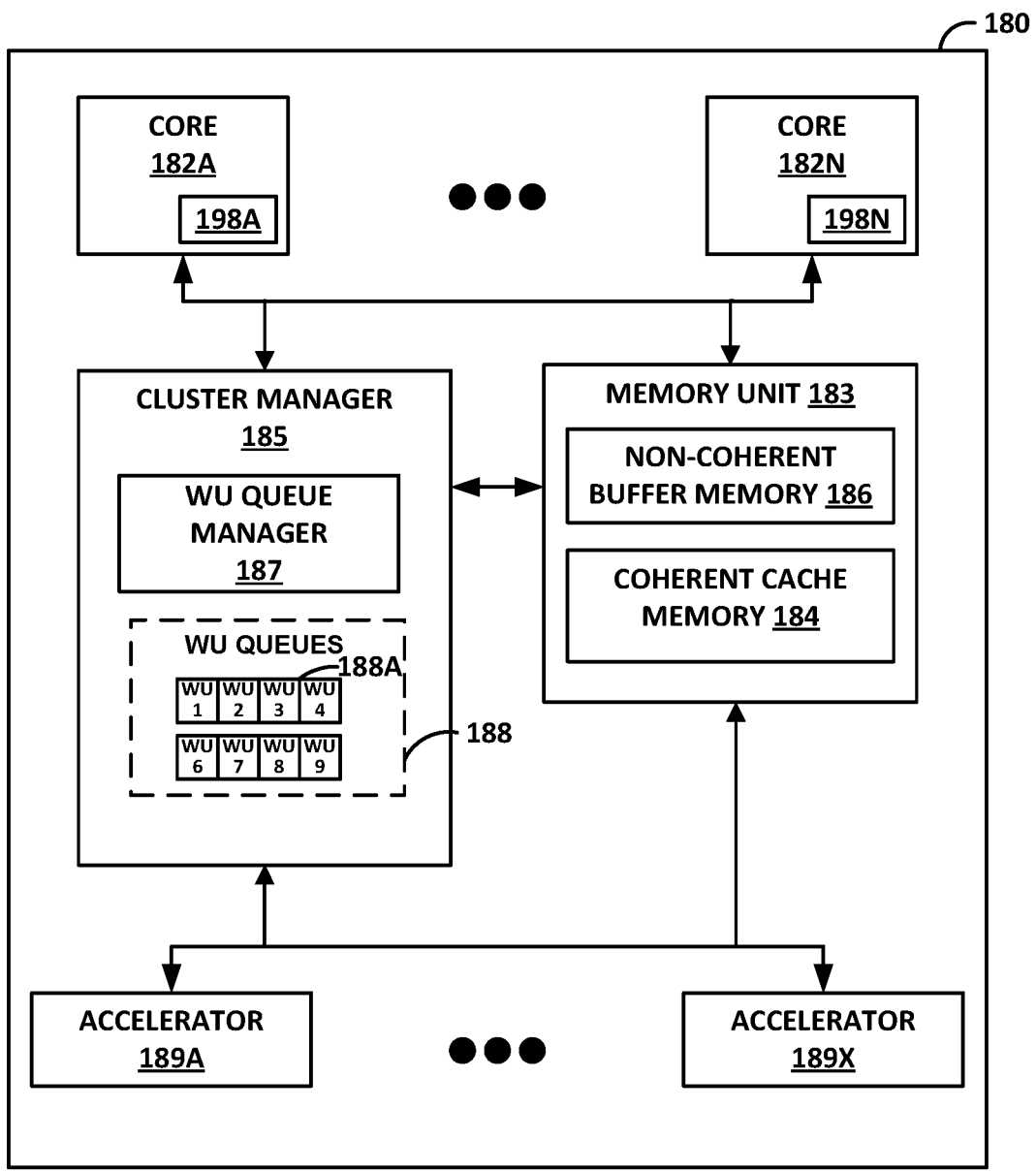
FIG. 4 is a block diagram illustrating an example processing cluster including two or more processing cores.

FIG. 4 is a block diagram illustrating an example processing cluster 180 including two or more processing cores 182A-182N. Each of processing clusters 156 of DPU 150 of FIG. 3 may be configured in a manner substantially similar to that shown in FIG. 4. In the example of FIG. 4, processing cluster 180 includes cores 182A-182N ("cores 182"), a memory unit 183 including a coherent cache memory 184 and a non-coherent buffer memory 186, a cluster manager 185 including WU queue manager 187 for maintaining (e.g., within hardware registers of processing cluster 180) and manipulating WU queues 188, and accelerators 189A-189X ("accelerators 189"). Each of cores 182 includes L1 buffer cache 198 (i.e., core 182 includes L1 buffer cache 198A and in general, core 182N includes L1 buffer cache 198N). In some examples, cluster manager 185 is alternatively located within central cluster 158, and/or WU queues 188 are alternatively maintained within central cluster 158 (e.g., within hardware registers of central cluster 158).

An access node or DPU (such as access nodes 17 of FIG. 1, DPU 130 of FIG. 2, or DPU 150 of FIG. 3) may support two distinct memory systems: a coherent memory system and a non-coherent buffer memory system. In the example of FIG. 4, coherent cache memory 184 represents part of the coherent memory system while non-coherent buffer memory 186 represents part of the non-coherent buffer memory system. Cores 182 may represent the processing cores discussed with respect to DPU 150 of FIG. 3. Cores 182 may share non-coherent buffer memory 186. As one example, cores 182 may use non-coherent buffer memory 186 for sharing streaming data, such as network packets.

In general, accelerators 189 perform acceleration for various data-processing functions, such as table lookups, matrix multiplication, cryptography, compression, regular expressions, or the like. That is, accelerators 189 may comprise hardware implementations of lookup engines, matrix multipliers, cryptographic engines, compression engines, regular expression interpreters, or the like. For example, accelerators 189 may include a lookup engine that performs hash table lookups in hardware to provide a high lookup rate. The lookup engine may be invoked through work units from external interfaces and virtual processors of cores 182, and generates lookup notifications through work units. Accelerators 189 may also include one or more cryptographic units to support various cryptographic processes. Accelerators 189 may also include one or more compression units to perform compression and/or decompression.

An example process by which a processing cluster 180 processes a work unit is described here. Initially, cluster manager 185 of processing cluster 180 may queue a work unit (WU) in a hardware queue of WU queues 188. When cluster manager 185 "pops" the work unit from the hardware queue of WU queues 188, cluster manager 185 delivers the work unit to one of accelerators 189, e.g., a lookup engine. The accelerator 189 to which the work unit is delivered processes the work unit and determines that the work unit is to be delivered to one of cores 182 (in particular, core 182A, in this example) of processing cluster 180. Thus, the one of accelerators 189 forwards the work unit to a local switch of the signaling network on the DPU, which forwards the work unit to be queued in a virtual processor queue of WU queues 188.

As noted above, in accordance with the techniques of this disclosure, one or more of accelerators 189 may be configured to perform data compression. A hardware-based data compression accelerator of accelerators 189, in accordance with the techniques of this disclosure, may include a pipeline for performing history-based compression. The disclosed history-based compression pipeline is configured to perform string search and replacement functions to compress an input data stream, as indicated by one or more work units. That is, the history-based compression pipeline scans the input data stream for repeated strings within a history window based on a local history buffer, and replaces the repeated strings with length-distance pairs that point to previous occurrences of the strings, as discussed in greater detail below.

After cluster manager 185 pops the work unit from the virtual processor queue of WU queues 188, cluster manager 185 delivers the work unit via a core interface to core 182A, in this example. An interface unit of core 182A then delivers the work unit to one of the virtual processors of core 182A.

Core 182A processes the work unit, which may involve accessing data, such as a network packet or storage packet, in non-coherent memory 156A and/or external memory 170. Core 182A may first look for the corresponding data in cache 198A, and in the event of a cache miss, may access the data from non-coherent memory 156A and/or external memory 170. In some examples, while processing the work unit, core 182A may store information (i.e., the network packet or data packet) associated with the work unit in an active segment of cache 198A. Further, core 182A may, while processing the work unit, prefetch data associated with a second work unit into a different, standby segment of cache 198A. When core 182A completes processing of the work unit, core 182A initiates (or causes initiation of) a cache flush for the active segment, and may also initiate prefetching of data associated with a third work unit (to be processed later) into that active segment. Core 182A (or a virtual processor within core 182A) may then swap the active segment and the standby segment so that the previous standby segment becomes the active segment for processing of the next work unit (i.e., the second work unit). Because data associated with the second work unit was prefetched into this now active segment, core 182A (or a virtual processor within core 182A) may be able to more efficiently process the second work unit. Core 182A then outputs corresponding results (possibly including one or more work unit messages) from performance of the work unit back through the interface unit of core 182A.

As described herein, in some example implementations, load store units within memory unit 183 may, concurrent with execution of work units by cores 182 within the processing cluster 180, identify work units that are enqueued in WU queues 188 for future processing by the cores. The load store units prefetch, from a non-coherent memory portion of external memory 170, data associated with the future work units and store the prefetched data associated with the WUs to be processed by the cores into a standby segment of the level 1 cache associated with the particular processing cores.

Figure 5:
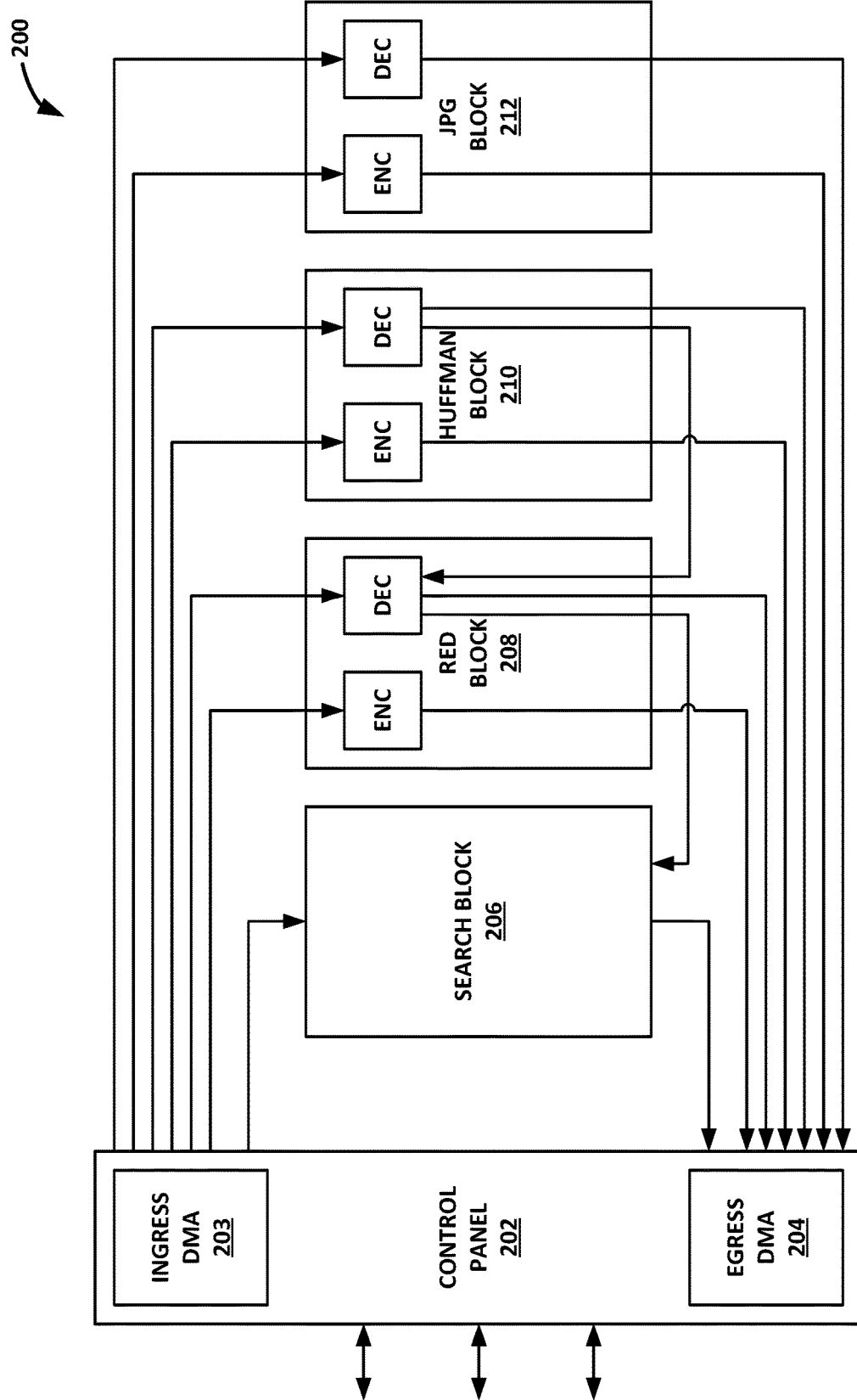
FIG. 5 is a block diagram illustrating an example data compression accelerator.

FIG. 5 is a block diagram illustrating an example data compression accelerator 200. For example, data compression accelerator 200 may be one of accelerators 146 of data processing unit 130 from FIG. 3, or one of accelerators 189 of processing cluster 180 from FIG. 4. In some examples, data compression accelerator 200 may be included in each of processing clusters 156 of data processing unit 150 from FIG. 3 for local, hardware-based execution of compression work units generated by software executing on the processing cores of the respective cluster Data compression accelerator 200 is configured to accelerate the computationally intensive data compression and decompression operations conventionally performed by software running on general-purpose processors. As illustrated in FIG. 5, in this example, data compression accelerator 200 includes a control panel 202, a search block 206, a range encode/decode (RED) block 208, a Huffman encode/decode block 210, and a JPG re-encode/decode block 212, each of which represent different hardware circuitry within, for example, an integrated circuit device. With these components, as described in more detail below, data compression accelerator 200 may support DEFLATE compression and decompression used by gzip and zlib, support Lempel-Ziv-Markov chain algorithm (LZMA) compression and decompression, and support JPG re-compression and decompression. DEFLATE compression comprises a lossless data compression algorithm that uses a combination of a history-based compression scheme performed by search block 206 and Huffman encoding performed by Huffman block 210. For example, the history-based compression scheme may comprise one of the LZ77, LZ78, LZW, LZ4, LZO, or LZS algorithms. The DEFLATE compression and decompression is described in more detail in P. Deutsch, "DEFLATE Compressed Data Format Specification version 1.3," IETF Network Working Group, R F C 1951, May 1996. LZMA compression comprises another lossless data compression algorithm that uses a combination of a history-based compression scheme performed by search block 206 and range encoding performed by RED block 208. JPG re-compression comprises lossy compression for digital images performed by JPG block 212.

Control panel (CP) 202 of data compression accelerator 200 operates as an interface to the other blocks in data compression accelerator 200, and is the only block in data compression accelerator 200 with external interfaces. CP 202 controls the mode of operation, manages WUs, and tracks resources and schedules jobs for each of the engine blocks (i.e., search block 206, RED block 208, Huffman block 210, and JPG block 212) within data compression accelerator 200. CP 202 also provides ingress DMA 203 and egress DMA 204. The engine blocks within data compression accelerator 200 work on a stream of data and there are no random accesses to external memories or to external blocks. External interfaces of CP 202 are used for receiving WUs, sending WUs, receiving payload data, sending result data, and receiving configuration data. Internal interfaces between the engine blocks within data compression accelerator 200 are mostly streaming interfaces. The internal interfaces may use credit-based flow control. For example, at the beginning of a job there may be N flow control units ('flits') of header data that describe the job.

CP 202 is responsible for controlling access to shared resources that can be used by multiple of the engine blocks within data compression accelerator 200. Any scheduling of resources local to a specific one of the engine blocks may be done locally by that engine block. For example, search block 206 and RED block 208 may share a history buffer local to search block 206. As another example, RED block 208 and Huffman block 210 may share one or more history buffers local to RED block 208. Certain WUs may depend on one or more of the shared resources. As such, CP 202 may control the resource assignment and only schedule WUs that do not conflict with the current resource assignment. The engine blocks within data compression accelerator 200 may not be able to detect or resolve shared resource conflicts themselves. In addition, several of the engine blocks within data compression accelerator 200, e.g., search block 206, RED block 208, and Huffman block 210, may have multiple threads. Some of the engine blocks, e.g., at least search block 206, may have both a single thread mode and a multi thread mode, depending on the type of job being processed.

Search block 206 may be the first stage of a two-stage compression process performed by data compression accelerator 200. For example, search block 206 may be configured to perform a history-based compression algorithm (e.g., the LZ77 algorithm or variants thereof) to search for and replace repeated occurrences of strings of bytes in an input data stream. Search block 206 uses a local a history buffer that includes previously seen data as the history for the compression algorithm. Search block 206 is configured to scan the input data stream for repeated strings within a history window, and replace the repeated strings with length-distance pairs that point to previous occurrences of the strings. The output of search block 206 includes one or both of literals (i.e., strings of bytes) and length-distance pairs used to replace repeated strings of bytes. The output of search block 206 may then goes through a second stage of compression using entropy encoding, either using Huffman encoding performed by Huffman block 210 or range encoding performed by RED block 208.

The history-based decompression operation involves expanding the length-distance pairs into strings of bytes based on a history buffer. For example, the history-based decompression operation may be performed by RED block 208 since the latency of the decompression operation affects the throughput of search block 206. In the case where the history buffer for the history-based decompression operation is small (e.g., less than or equal to 32 KB), RED block 208 may use a history buffer that is local to RED block 208. In the case where the history buffer for the history-based decompression operation is large (e.g., greater than 32 KB), RED block 208 may use its local buffer as a cache and use the history buffer at search block 206 for up to the maximum supported history buffer size, e.g., 256 KB. When RED block 208 uses the history buffer at search block 206, search block 206 may be disabled. Therefore, the history-based encode/decode operation using a small history buffer may be full duplex, and the history-based encode/decode operation using a large history buffer is half duplex.

Following the history-based compression (e.g., the LZ77 algorithm) performed by search block 206, the encode (ENC) portion of Huffman block 210 may perform the second stage of the two-stage compression process for DEFLATE compression used by gzip and zlib. The output of search block 206 is the input to the encode portion of Huffman block 210. The encode portion of Huffman block 210 performs Huffman encoding, which is a type of entropy encoding that replaces high frequency symbols with shorter codes and low frequency symbols with longer codes. As a first step, the encode portion of Huffman block 210 gathers a frequency histogram for every symbol in a block of data, and stores the data in a buffer as the statistics are counted. As a second step, the encode portion of Huffman block 210 assigns codes based on the frequency of each symbol. In parallel with this step, the next block of data arrives in a second buffer. As a third step, the encode portion of Huffman block 210 outputs the encoding table, which also gets compressed. As a fourth step, the encode portion of Huffman block 210 outputs the encoded data. As the buffer is being drained, the next block begins filling the buffer. There are two buffers per thread. In some examples, Huffman block 210 has two threads such that there is a total of four buffers.

The decode (DEC) portion of Huffman block 210 may perform a first stage of a decompression process for DEFLATE format compressed data used by gzip and zlib. The decode portion of Huffman block 210 decodes a binary bit stream of encoded symbols and replaces them with the original symbols. The encoded symbols are of variable length, so the length of the previous symbol determines where the next symbol to be decoded begins in the bit stream. This chain of dependencies typically makes fast decoding challenging. The output of the decode portion of Huffman block 210 is a sequence of literals and/or length-distance pair symbols. The literals directly represent the original data (i.e., strings of bytes), and the length-distance pairs are pointers to previous occurrences of a string of bytes within a sliding history window. The second stage of the decompression process for DEFLATE is to expand the length-distance pairs. For DEFLATE, the symbol decode and the expansion are independent operations and, therefore, the operations may be performed by separate engine blocks. As discussed above with respect to the history-based decompression operation, the expansion may be performed by RED block 208.

RED block 208 performs range encoding and range decoding. The range encode (ENC) portion of RED block 208 is a bit stream encoder that compresses one bit at a time. The range encoding algorithm is comparable to arithmetic encoding. The range encode portion of RED block 208 uses a context memory that provides a probability of a 1 or 0 based the current context. The context memory is updated on the fly during compression and that process is precisely mirrored during decompression. In general, range encoding provides higher compression than Huffman encoding at the cost of lower throughput, larger area, and higher complexity.

Following the history-based compression (e.g., the LZ77 algorithm) performed by search block 206, the encode portion of RED block 208 may perform the second stage of the two-stage compression process for LZMA compression. Data compression accelerator 200 may have two modes of operation for LZMA compression. In a streaming mode, the output of search block 206 is directly sent to RED block 208 using one WU. In some cases, however, there may be a speed mismatch where search block 206 is running faster than RED block 208. To optimize this case, a second mode of operation decouples the search stage from the RED stage using a separate WU for each stage. In the second mode of operation, the intermediate results are directly stored to and accessed from an external memory via ingress DMA 203 and egress DMA 204. In the second mode of operation, RED block 208 may use multiple encoding threads to better match the throughput of search block 206.

The decode (DEC) portion of RED block 208 may perform a first stage of a decompression process for LZMA format compressed data. The decode portion of RED block 208 receives the data to be decoded from ingress DMA 203 and sends the results out over egress DMA 204. Depending on the size of the history buffer used during LZMA compression, RED block 208 may use small internal history buffers, which allows for full duplex encode/decode, or RED block 208 may use a large external history buffer from search block 206, which only allows for half duplex encode/decode. Search block 206 may be disabled when RED block 208 is decoding using the large external history buffer local to search block 206.

Similar to Huffman decoding for DEFLATE, range decoding for LZMA decompression involves decoding symbols and expanding symbols that reference a history buffer. Unlike Huffman decoding, the expansion of the symbols in range decoding may affect the context used to decode the next symbol. In addition to performing range decoding for LZMA decompression, the decode portion of RED block 208 also performs the second stage of Huffman decoding for DEFLATE, i.e., the length-distance pair expansion. In this case, the decode portion of RED block 208 receives the input from Huffman block 210, and generates the final result that is sent out over egress DMA 204.

JPG block 212 may losslessly re-encode jpg files into a proprietary format. Standard jpg files may be compressed in two phases, first a lossy phase and then second a lossless phase using Huffman encoding. JPG block 212 is configured to replace the lossless phase with a more advanced compression algorithm. Similar to RED block 208, JPG block 212 uses an adaptive context-based bit-wise encoder, but it has been specifically optimized for image data. JPG block 212 performs compression and decompression of image data independently from the other engine blocks within data compression accelerator 200 and is only in communication with CP 202.

Figure 6B:
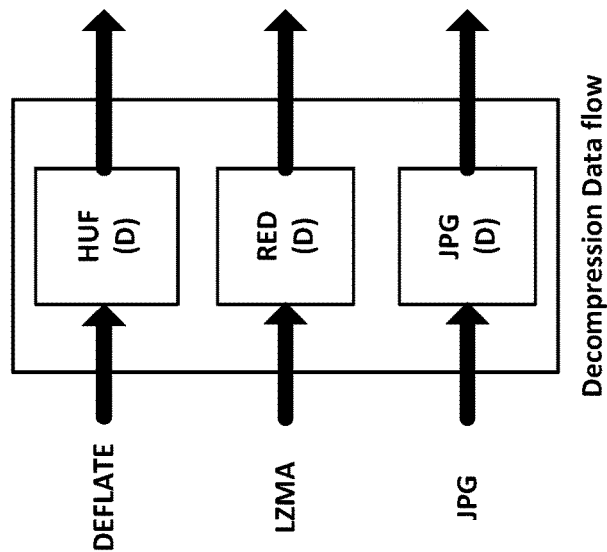
FIGS. 6A and 6B are conceptual diagrams illustrating example data flows through engine blocks within the data compression accelerator of FIG. 5.
Figure 6A:
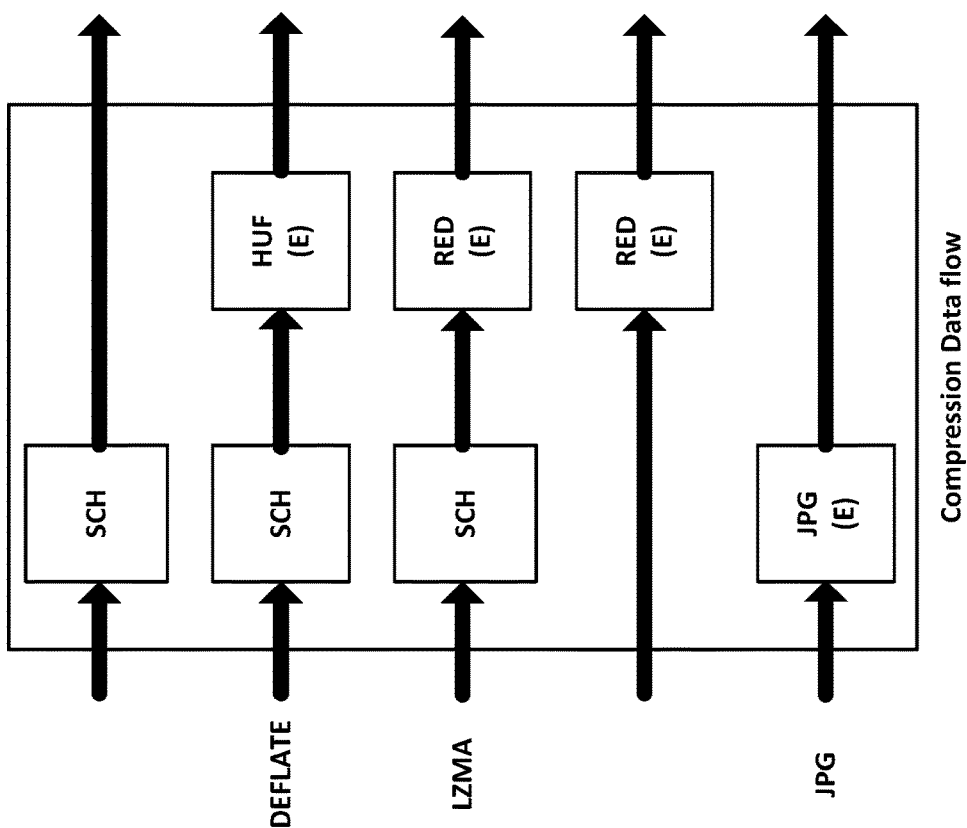

FIGS. 6A and 6B are conceptual diagrams illustrating example data flows through engine blocks within data compression accelerator 200 of FIG. 5. FIG. 6A illustrates example compression data flows. As illustrated in FIG. 6A, data compression accelerator 200 may perform history-based compression alone using only search block 206, DEFLATE compression using a combination of search block 206 and the encode portion of Huffman block 210, LZMA compression using a combination of search block 206 and the encode portion of RED block 208, range encoding alone using RED block 208, or JPG re-compression using JPG block 212. FIG. 6B illustrates example decompression data flows. As illustrated in FIG. 6B, data compression accelerator 200 may perform the first stage of DEFLATE decompression using the decode portion of Huffman block 210, the first stage of LZMA decompression using the decode portion of RED block 208, or JPG decompression using JPG block 212. In the case of both DEFLATE and LZMA decompression, RED block 208 may perform the second stage of decompression, i.e., length-distance pair expansion.

Figure 7A:
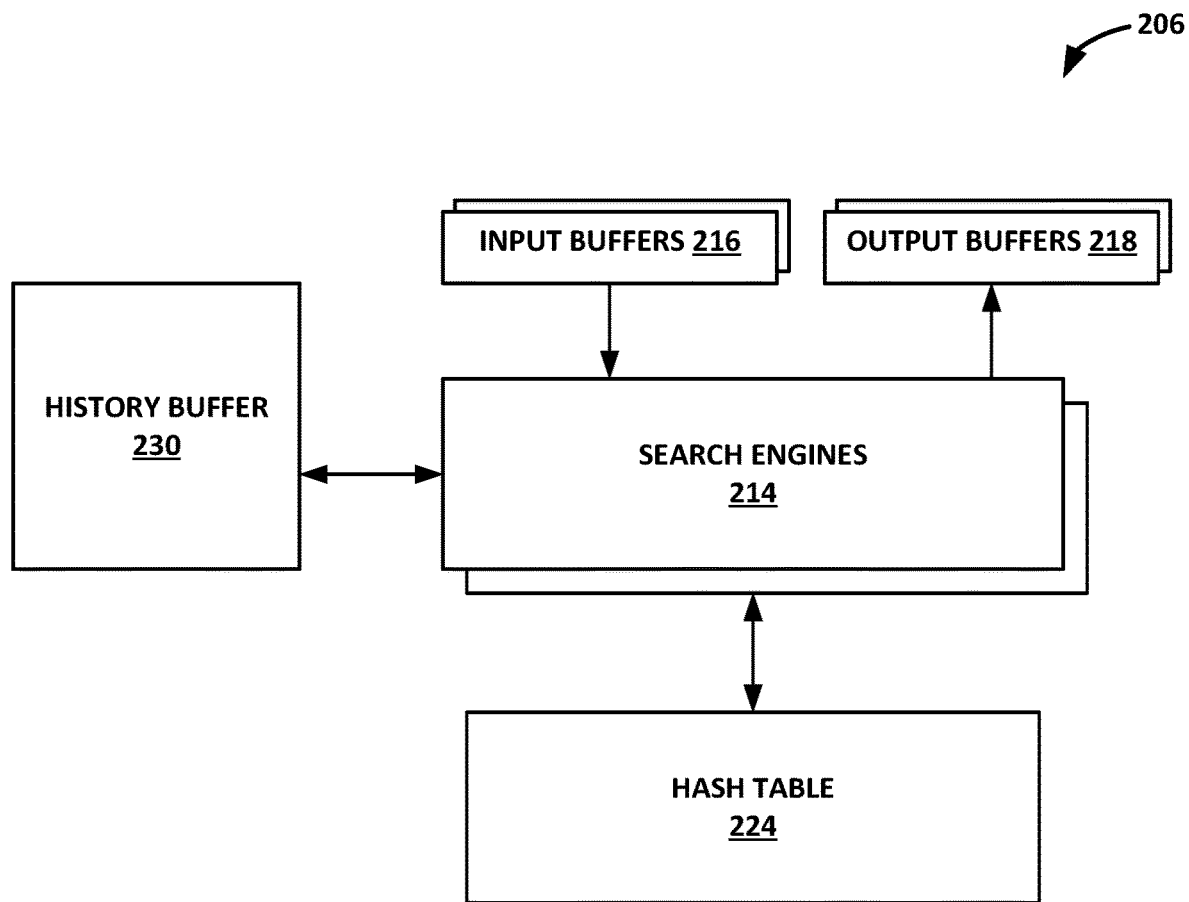
FIG. 7A is a block diagram illustrating an example architecture of a search block of the data compression accelerator from FIG. 5.

FIG. 7A is a block diagram illustrating an example architecture of search block 206 of data compression accelerator 200 from FIG. 5. According to the disclosed techniques, search block 206 includes multiple hardware search engines (i.e., threads) 214 each configured to perform history-based compression of an input data stream. As illustrated, search block 206 also includes input buffers 216, output buffers 218, a hash table 224, and a history buffer 230. The architecture of search block 206 illustrated in FIG. 7A is shown for exemplary purposes only. In other examples, search block 206 may be configured in a variety of ways.

In some examples, search block 206 may include multiple search engines 214, multiple input buffers 216, and multiple output buffers 218. Each of the input buffers 216 includes a current block of data to be compressed by the respective one of search engines 214, and each of output buffers 216 includes a current block of compressed data output from the respective one of search engines 214. Search engines 214 may compress multiple separate input data streams in parallel, or a single input data stream may be split into multiple blocks and search engines 214 may work independently on separate blocks in parallel to improve throughput for the single input data stream. In the case of using multiple engines for a single input data stream, the output of each of search engines 214 will be merged after compression into a single output data stream. In either case, when using multiple engines, the portions of history buffer 230 used by each of search engines 214 cannot be shared between the threads.

Search block 206 may operate in at least two different modes including a high throughput mode that uses the multiple search engines 214 (i.e., multi-thread), and a high compression mode that uses only one of search engines 214 (i.e., single thread). Hash table 224 and history buffer 230 may each be configured differently depending on the operational mode of search block 206.

In the high throughput mode, search block 206 may compress data faster, e.g., at 25 Gbps, with a moderate compression ratio. The higher throughput may be achieved by processing multiple byte positions of the input data stream per clock cycle per thread. In addition, the byte position processing may be performed using fewer history addresses, e.g., 4 addresses, of potential byte string matches included in each bucket of hash table 224 and a smaller history, e.g., up to 32 KB, copied into multiple memory banks of history buffer 230. Each of search engines 214 may drop conflicting hash entries in the case of a bank conflict.

As an example, in the high throughput mode, at each byte position of the data to be compressed, one of search engines 214 creates a hash key of the current byte and the next few bytes depending on the byte values. The one of search engines 214 then looks up the hash key in hash table 224 to get addresses of the most recent occurrences in history buffer 230 of a byte string beginning at the current byte position. The one of search engines 214 then matches the byte string identified by the addresses in history buffer 230 with the byte string at the current byte position in the data to be compressed. The one of search engines 214 is configured to perform this hashing and matching for multiple byte positions in the same clock cycle. The one of search engines 214 then selects the best option for the current byte position. For example, if the longest and closest match at the current byte position has a length that is greater than the hash key size, then the one of search engines 214 outputs a length-distance pair for the current byte position. Otherwise, the one of search engines 214 outputs a literal for the current byte position and repeats the process described above at the next byte position.

In the high compression mode, search block 206 may achieve a higher compression ratio at a lesser throughput, for example, approximately 1 Gbps. The higher compression ratio may be achieved by processing multiple byte positions per clock cycle for the single thread using a larger number of history addresses (e.g., 16 or 32 history addresses) of potential byte string matches included in each bucket of hash table 224 and a larger history, e.g., up to 256 KB, that is stripped across multiple memory banks of history buffer 230. In some cases, in the high compression mode, the one of search engines 214 may use multiple cycles to retry byte string matches in hash table 224 in the case of a bank conflict.

Figure 7B:
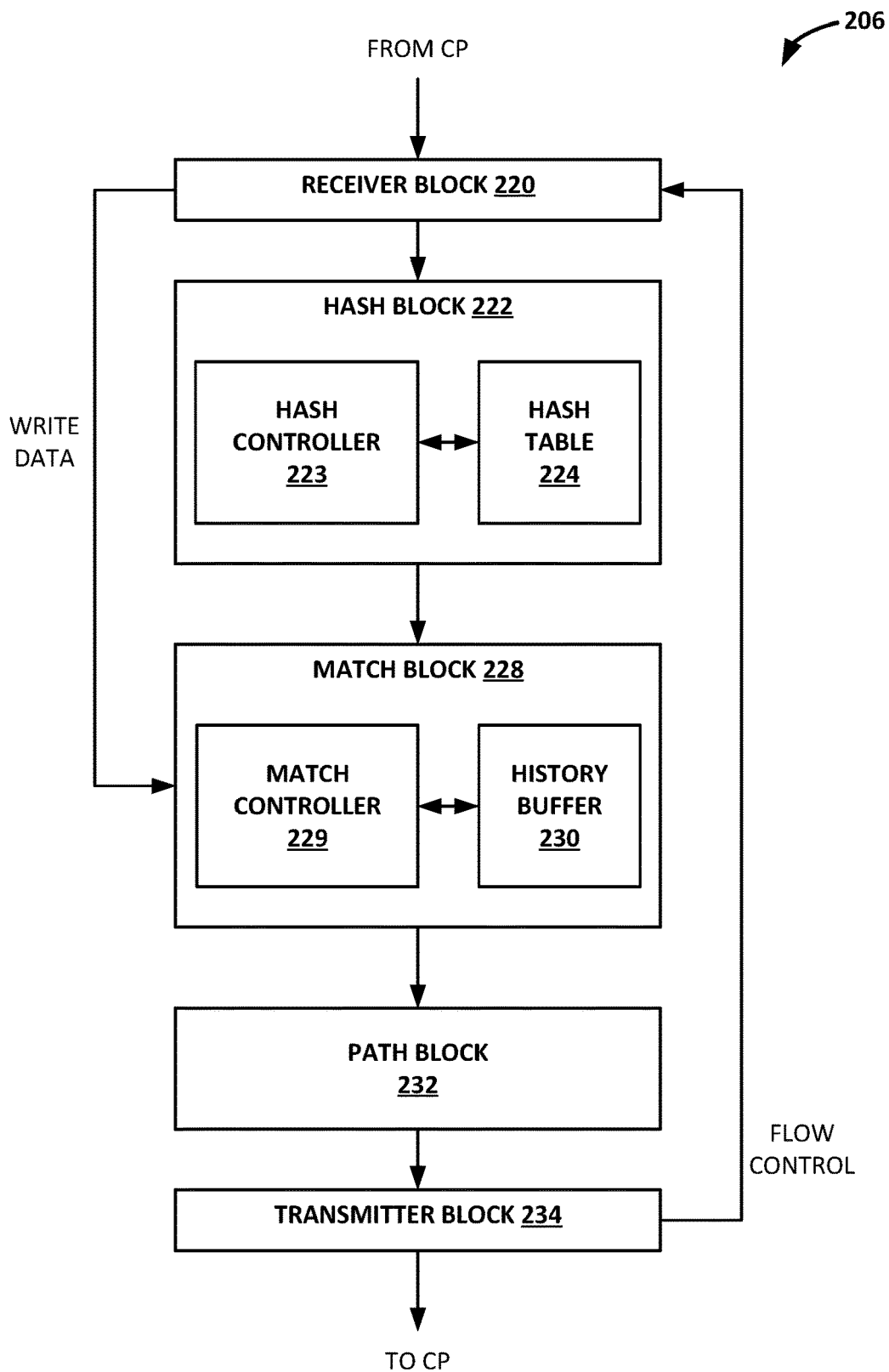
FIG. 7B is a block diagram illustrating another example architecture of the search block of the data compression accelerator from FIG. 5.

FIG. 7B is a block diagram illustrating another example architecture of search block 206 of data compression accelerator 200 from FIG. 5. According to the disclosed techniques, search block 206 comprises a pipeline for performing history-based compression of an input data stream. As illustrated, search block 206 includes a receiver block 220, a hash block 222, a match block 228, a path block 232, and a transmitter block 234. In general, search engines 214 from FIG. 7A may be configured to perform the functions of the pipeline illustrated in FIG. 7B. The architecture of search block 206 illustrated in FIG. 7B is shown for exemplary purposes only. In other examples, search block 206 may be configured in a variety of ways.

As described above, search block 206 is configured to perform history-based compression, e.g., one of the LZ77, LZ78, LZW, LZ4, LZO, or LZS algorithms, to search for and replace repeated occurrences of strings of bytes in an input data stream. Search block 206 uses a history buffer 230 that includes previously seen data as a dynamic, self-referential history for the history-based compression algorithm. In history-based compression, the history is maintained as a sequence of bytes, and byte strings in the input data stream are replaced by indices, e.g., length-distance pairs, that identify locations of the same byte strings in the history byte sequence. In the case of a dynamic, self-referential history, the history is built as the input data stream is being compressed. In some examples, search block 206 may perform the history-based compression as a first stage of a two-stage compression process. The second stage of the two-stage compression process may be entropy coding of the output of search block 206, which may be performed by either Huffman block 210 for DEFLATE compression or RED block 208 for LZMA compression.

The overall history-based compression algorithm performed by search block 206 will now be described. In general, the algorithm starts at byte position 0 of the input data stream and continues to the end of the file. The input data stream to be compressed is received by receiver block 220 of search block 206 from ingress DMA 203 of CP 202. Receiver block 220 is configured to handle flow control with CP 202 for the ingress interface and respond to flow control from transmitter block 234 for the pipeline of search block 206. Receiver block 220 also writes data of the input data stream to a lookahead buffer in match block 228 and sends the data to hash block 222 for the main pipeline. Receiver block 220 is described in more detail with respect to FIG. 9.

As illustrated in FIG. 7B, hash block 222 includes hash controller 223 and hash table 224. Hash controller 223 is configured to prepare a hash key at a current byte position of the input data stream by selecting 'N' number of bytes starting with the current byte. Hash controller 223 then uses the hash key to calculate a hash index into hash table 224. Hash controller 223 then uses the hash index to access a bucket of hash table 224 that includes history addresses of any previous occurrences of the same string of bytes from the input data stream. History addresses that result from hash collisions may be filtered out. Hash controller 223 sends the history addresses of the previous occurrences to the match block 228, and writes the current byte position address into the same bucket in hash table 224. If the bucket is full, the oldest history address is dropped from the bucket in hash table 224 to add the current byte position address. Additional functions of hash block 222, including different processing modes, adaptive hashing, and collision handling, are described in more detail below with respect to FIG. 10.

As illustrated in FIG. 7B, match block 228 includes match controller 229 and history buffer 230. For each of the history addresses received from hash block 222, match controller 229 is configured to read a string of bytes of previously seen data identified by the respective history address from history buffer 230. The retrieved string of bytes of the previously seen data is compared to current data starting from the current byte position in a forward direction of the input data stream to determine forward matches. Backward matches may also be detected between the previously seen data and the current data starting from the current byte position in a backward direction of the input data stream. In some examples, matches longer than M bytes may be truncated, where M is a function of data alignment. Match controller 229 receives a list of matches between the current input data stream and the previously seen data included in history buffer 230. Match controller 229 determines match length for each of the matches. For example, for each of the matches, match controller 229 may detect a "match byte" as a first non-matching byte after a match or a "previous byte" as the last byte that gets matched. Match controller 229 sends the match lengths for the list of matches to path block 232. Additional functions of match block 228, including different processing modes and backward matching, are described in more detail below with respect to FIG. 13. In certain processing modes, data striping may be used to spread accesses evenly across multiple banks of history buffer 230. The data striping is described in more detail with respect to FIG. 15.

Path block 232 is configured to pick the best match (i.e., longest and closest, in that order) for each byte position of the input data stream from the match lengths received from match block 228. For example, path block 232 may be configured to find the longest match, if any, for the current byte position of the input data stream, including any overlapping history buffer matches from adjacent byte positions. For example, path block 232 may be configured to assemble longer matches by merging multiple smaller matches at previous and subsequent byte positions with the match at the current byte position. Path block 232 may support lazy optimizations in order to pick the best match based on multiple byte positions within a configurable window, as opposed to picking the best match based only on the current byte position.

For the selected matches at each byte position, path block 232 outputs length-distance pairs that replace the matched byte stings in the input data stream with pointers to the previous occurrences of the byte strings in the history. If a match is not selected for a given byte position, path block 232 instead sends a literal that directly represents the byte at the given byte position. When search block 206 is performing LZMA compression, path block 232 may also report the first non-matching byte after the selected match and the previous byte, i.e., the last byte of the selected match. Path block 232 sends the literals and length-distance pairs to transmitter block 234. Additional functions of path block 232, including carry forward matching and consecutive match merging, are described in more detail below with respect to FIG. 18.

Transmitter block 234 is configured to pack the output received from path block 232 into a data stream that includes a sequence of literals and length-distance pairs for matches in history buffer 230. Transmitter block 234 is also configured to handle flow control with receiver block 220 for the pipeline of search block 206 and respond to flow control from CP 202 for the egress interface. The packed data stream of the history compressed output is transmitted by transmitter block 234 to CP 202. The transmitter block is described in more detail with respect to FIG. 20. At CP 202, the history compressed output may be directly stored to an external memory via egress DMA 204, recirculated to RED block 208, or recirculated to Huffman block 210.

In accordance with techniques of this disclosure, the engine blocks within search block 206 are configurable to operate in different modes depending on the level of compression or effort desired for the input data stream. For example, in order to achieve high-throughput, each of the engine blocks within search block 206 may operate according to a multi-thread mode, which supports processing of multiple input data streams in parallel, and process multiple input byte positions per clock cycle per thread at lower compression levels. In the high-throughput mode, hash block 222 may perform multiple hash table accesses per cycle per thread but return a relatively small number of history addresses per access as potential matches, and match block 228 may support a relatively small history buffer 230 with which to determine the string matches from the history addresses. If a higher level of compression is desired, each of the engine blocks within search block 206 may operate according to a single thread mode, which supports processing of a single input data stream, and process multiple input byte positions per clock cycle for only the single thread using a more compute intensive string matching process. In the high-compression mode, hash block 222 may perform multiple hash table accesses per cycle for the single thread but return a relatively large number of history addresses as potential matches, and match block 228 may support a relatively large history buffer 230 with which to determine the string matches from the history addresses. The different operational modes of the engine blocks within search block 206, and related hashing and matching solutions, are described in more detail below.

Figure 8:
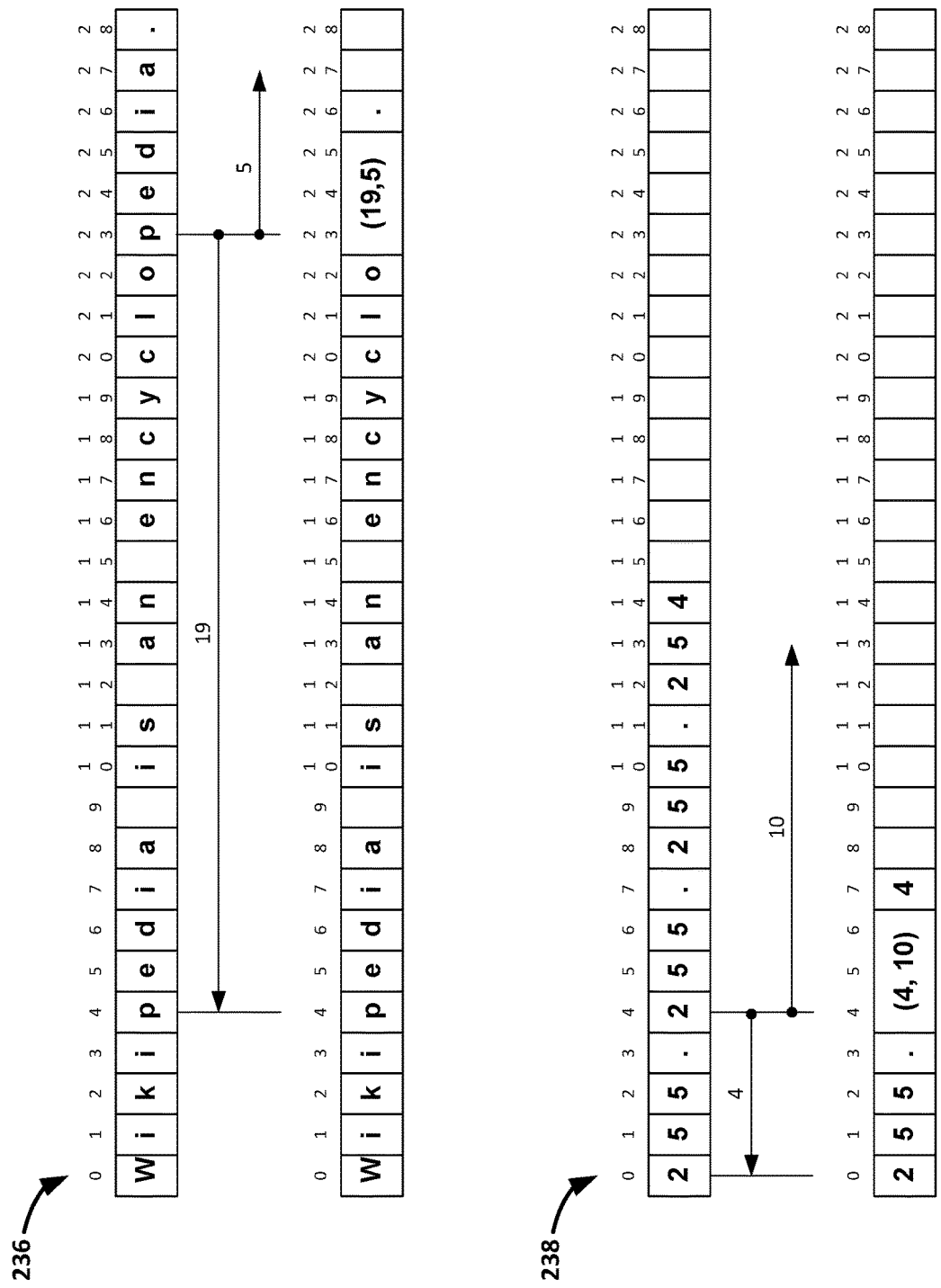
FIG. 8 is a conceptual diagram illustrating examples of history-based compression.

FIG. 8 is a conceptual diagram illustrating examples of history-based compression. The examples illustrated in FIG. 8 are compressed according to the LZ77 algorithm that uses a dynamic, self-referential history that is built using the input data being compressed. For example, the history may include a sequence of words that each has an index that indicates the location of the word in the history byte sequence. Each of the words may have a length of 2 to 6 bytes. During compression, if a repeated string of bytes is found, then the repeated string of bytes in the input data stream is replaced by a back reference to the previous location in the history where the identical string of bytes is present. The back reference comprises a length-distance pair that indicates a distance from the current byte to the start of the identical string of bytes in the history and a length of the repeated byte string.

As a first example, FIG. 8 illustrates a first sequence of bytes 232. In the uncompressed form, first sequence of bytes 236 comprises text that reads "Wikipedia is an encyclopedia." In this example, the byte string of "pedia" appears for the first time beginning at byte position "4" and is repeated a second time towards the end of the sequence beginning at byte position "23". In the compressed form, the second instance of the byte string "pedia" is replaced with a back reference to the earlier instance of the byte string "pedia" using the (distance, length) pair (19, 5). As illustrated, the distance to the beginning of the first, earlier instance of the byte string (i.e., byte position 4) is 19 bytes from the beginning of the second, repeat instance of the byte string (i.e., byte position 23), and the length of the repeated byte string "pedia" is 5.

As a second example, FIG. 8 illustrates a second sequence of bytes 238. In the uncompressed form, second sequence of bytes 238 comprises text that reads "255.255.255.254". In this example, the byte string "255." appears for the first time beginning at byte position "0" and is repeated two times beginning at byte positions "4" and "8" followed by byte string "25" beginning at byte position "12". The distance to the beginning of the first, earliest instance of the byte string "255." (i.e., byte position 0) is 4 bytes from the beginning of the second, repeat instance of the byte string "255." (i.e., byte position 4), but the length of the repeated byte string "255.255.25" is 10 bytes, i.e., the repeated byte string is overlapping with itself. In the compressed form, therefore, the subsequent two instances of the byte string "255." beginning at byte position 4 and 8 and the byte string "25" beginning at byte position 12 are replaced with a back reference to the earliest instance of the byte string "255." using the (distance, length) pair (4, 10).

Figure 9:
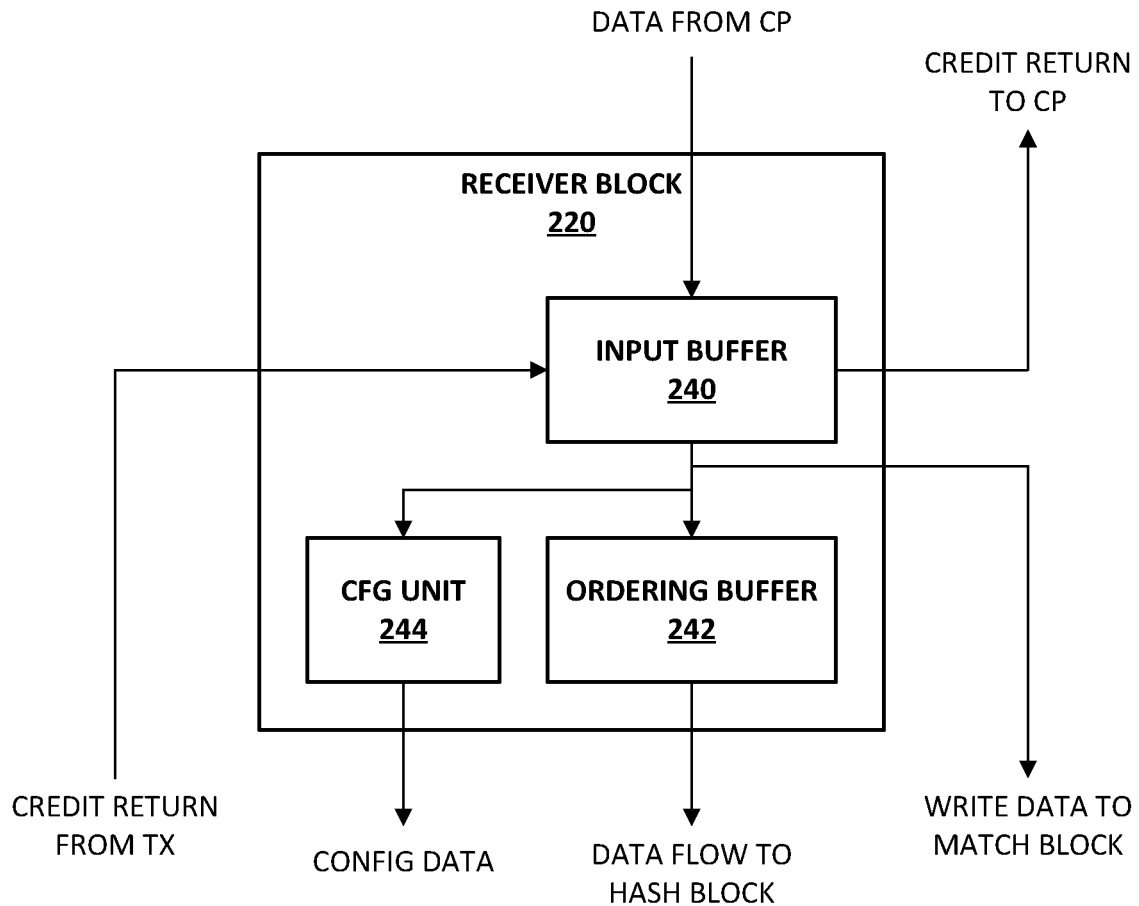
FIG. 9 is a block diagram illustrating an example architecture of a receiver block of the search block from FIG. 7B.

FIG. 9 is a block diagram illustrating an example architecture of receiver block 220 of search block 206 from FIG. 7B. In the illustrated example, receiver block 220 includes an input buffer 240, an ordering buffer 242, and a configuration (CFG) unit 244. The architecture of receiver block 220 illustrated in FIG. 9 is shown for exemplary purposes only. In other examples, receiver block 220 may be configured in a variety of ways.

Input buffer 240 of receiver block 220 receives an input data stream of an input data stream to be compressed from ingress DMA 203 of CP 202 of FIG. 5. Input buffer 240 may comprise a small multi-entry FIFO (first in, first out) buffer. Input buffer 240 is configured to handle flow control with CP 202 for the ingress interface. More specifically, input buffer 240 uses credit-based flow control by returning credits to CP 202 based on the amount of space available to store data in input buffer 240. In this way, CP 202 will not send more input data than receiver block 220 and, thus, the pipeline of search block 206 can handle. Input buffer 240 is also configured to respond to flow control from transmitter block 234 for the pipeline of search block 206 to avoid processing more data than transmitter block 234 can handle. Input buffer 240 again uses credit-based flow control based on credits returned from transmitter block 234 based on the amount of space available to store data in an output buffer of transmitter block 234.

Configuration unit 244 is configured to process control flits and distribute control signals to provide overall control for the pipeline of search block 206. As an example, a first flit of header data for the input data stream may include configuration data used to configure the pipeline of search block 206 for that input data stream. Configuration block 244 receives the first flit at the start of the input data stream from input buffer 240 and distributes the configuration data to the rest of the pipeline of search block 206. The first flit may include configuration data that indicates a level of effort or compression for the input data stream, a hash key size, a history buffer size, a lazy match window size, checksum information, a compression type, and other commands and information.

From input buffer 240, the input data stream is written to a lookahead buffer in match block 228 and also sent to hash block 222 for the main pipeline via ordering buffer 242. Ordering buffer 242 is configured to handle ordering constraints between the input data streams sent to hash block 222 and to match block 228. In general ordering buffer 242 is configured to have a certain size such that the size of the ordering buffer and a size of a hash key buffer within hash block 222 are greater than or equal to a size of the lookahead buffer in match block 228.

Hash block 222 operates on a current byte position in the input data stream and operates using a hash key buffer of a certain size, e.g., 16 bytes. In this example, the input data to hash block 222 needs to be 16 bytes ahead of the current byte position. In match block 228, the lookahead buffer includes a certain amount of the input data, e.g., 32 bytes, starting at the current byte position. In accordance with this disclosure, and as described in more detail below, search block 206 is configured to process multiple bytes of current position, e.g., 4, per cycle. As such, match block may need at least 35 bytes of data starting from the current byte position. Using the numbers provided in this example, ordering buffer 242 may be configured to hold 20 bytes of the input data, so that 20 bytes in ordering buffer 242 plus 16 bytes in the hash key buffer of hash block 222 is greater than or equal to 35 bytes in the lookahead buffer of match block 228. If the ordering between the input data streams is not maintained, match block 228 may not have correct data with which to attempt to perform a match.

Figure 10:
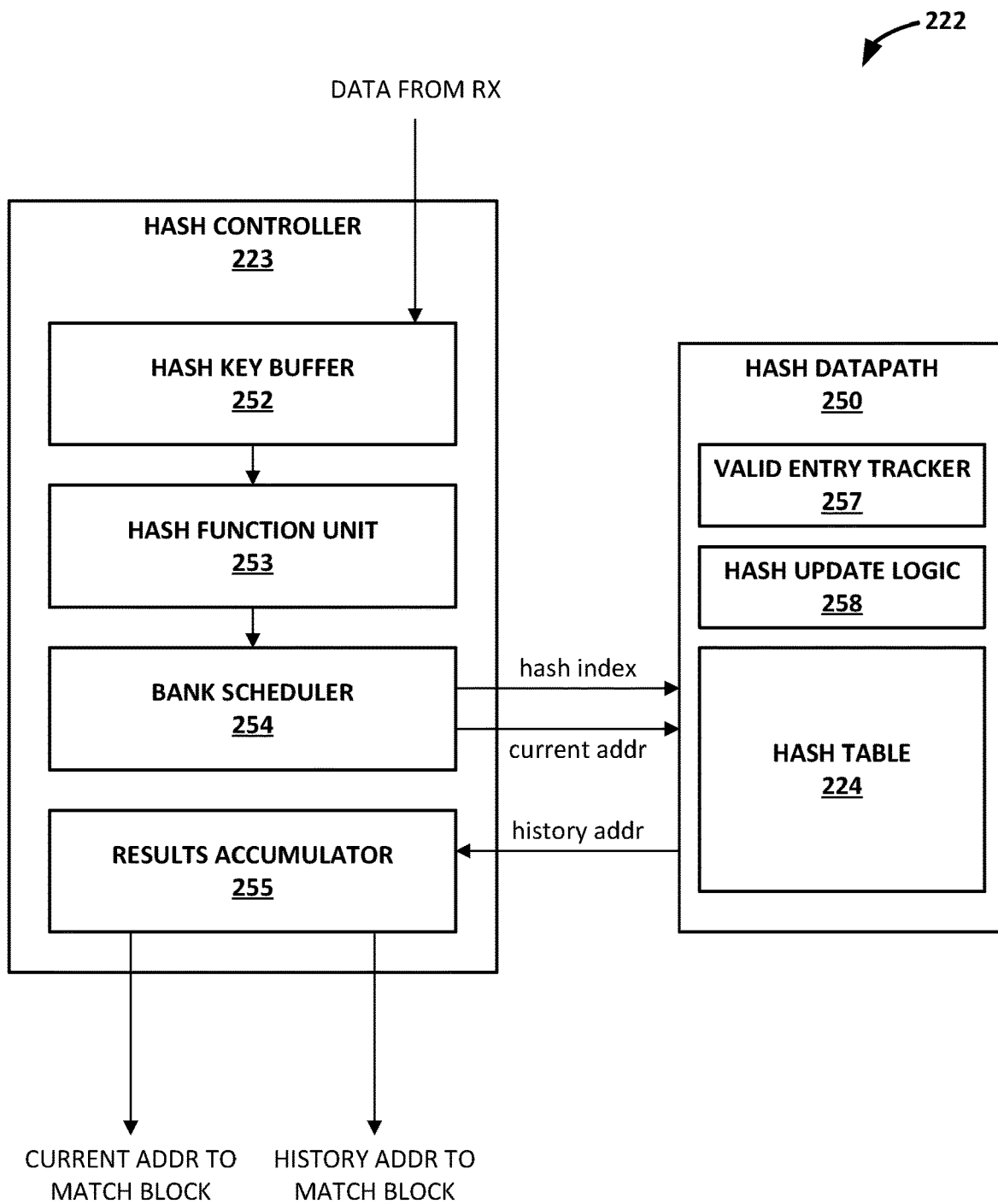
FIG. 10 is a block diagram illustrating an example architecture of a hash block of the search block from FIG. 7B.

FIG. 10 is a block diagram illustrating an example architecture of hash block 222 of search block 206 from FIG. 7B. In the illustrated example, hash controller 223 of hash block 222 includes a hash key buffer 252, a hash function unit 253, a bank scheduler 254, and a results accumulator 255. Hash datapath 250 of hash block 222 includes hash table 224 along with a valid entry tracker 257 and hash update logic 258. The architecture of hash block 222 illustrated in FIG. 10 is shown for exemplary purposes only. In other examples, hash block 222 may be configured in a variety of ways.

Hash block 222 is configurable to operate in different modes depending on the level of compression or effort desired for the input data stream. Hash table 224 is also configurable to support single or multi-thread processing and different hash table sizes depending on an operational mode of hash block 222. Hash table 224 includes a list of potential matches between byte strings of the current input data stream received from receiver block 220 and previously processed data stored in history buffer 230. More specifically, hash table 224 includes a plurality of hash buckets that each holds the most recent history addresses of previous occurrences of a same byte string in history buffer 230.

In one example, hash table 224 may have a total storage of 128k history addresses. For a dual thread mode, hash table 224 may be configured to include 16 banks each having 2k rows or hash buckets, with each of the hash buckets including 4 hash entries (i.e., history addresses). Hash table 224 may be partitioned into two memories, one for each thread, that are isolated from each other such that each thread may only access its designated memory. In order to process multiple byte positions per clock cycle per thread, which requires multiple hash accesses per cycle per thread, each of the memories of hash table 224 may be configured into multiple banks (e.g., 8 banks of 2k rows for a total of 16k hash buckets with each of the hash buckets holding 4 history addresses). For a higher effort single thread mode, hash table 224 may comprise a single memory configured to include 8k hash buckets with each of the hash buckets holding 16 history addresses. For the highest effort single thread mode, hash table 224 may comprise a single memory configured to include 4k hash buckets with each of the hash buckets holding 32 history addresses. In order to process multiple byte positions per clock cycle for the single thread, the single memory of hash table 224 may similarly be configured into multiple banks (e.g., 8 banks, 4 banks, or 2 banks). In other examples, hash table 224 may be arranged in additional or different configurations.

Hash key buffer 252 of hash controller 223 is configured to prepare a hash key at a current byte position of the input data stream received from receiver block 220 by selecting 'N' number of bytes starting with the current byte. In some examples, hash key buffer 252 may be a shift register that provides the hash key to hash function unit 253. Hash key buffer 252 may support multiple hash key sizes 'N', e.g., 2 to 6 bytes, including an adaptive key size described in more detail below. Hash key buffer 252 may prepare multiple hash keys per clock cycle per thread. For example, in a dual thread mode, hash key buffer 252 may be configured to prepare up to four hash keys per cycle per thread. The multiple hash keys may be an overlapping set of N-byte strings.

Figure 11:
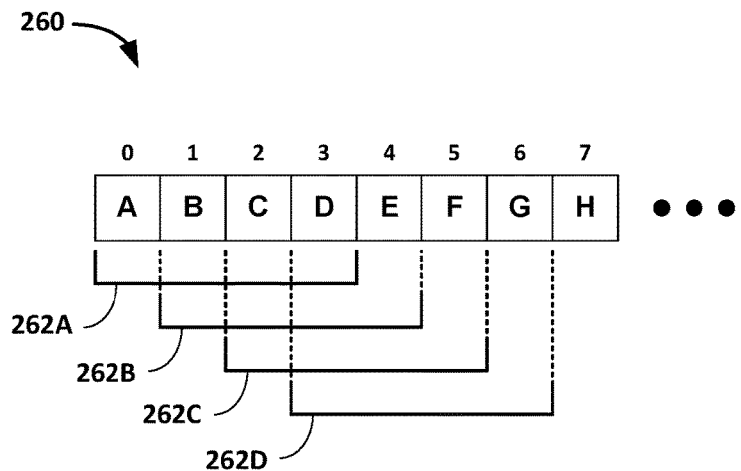
FIG. 11 is a conceptual diagram illustrating an example of an overlapping set of 4-byte strings in an input data stream.

FIG. 11 is a conceptual diagram illustrating an example of an overlapping set of 4-byte strings 262A-262D in input data stream 260. As illustrated in FIG. 11, hash key buffer 252 may prepare a first hash key at position 0 of input data stream 260 by selecting 4-byte string "ABCD" 262A starting with byte position 0. Hash key buffer 252 may prepare a second hash key at position 1 of input data stream 260 by selecting 4-byte string "BCDE" 262B starting with byte position 1. Hash key buffer 252 may prepare a third hash key at position 2 of input data stream 260 by selecting 4-byte string "CDEF" 262C starting with byte position 2. Hash key buffer 252 may also prepare a fourth hash key at position 3 of input data stream 260 by selecting 4-byte string "DEFG" 262D starting with byte position 3. In this example, each of the four hash keys is 4 bytes, which is equivalent to 7 bytes of output with overlapping keys. In other examples, each of the four hash keys may be up to 6 bytes, which is equivalent to 9 bytes of output with overlapping keys.

In accordance with techniques of this disclosure, hash key buffer 252 may also support an adaptive key size in which the hash key size may be different at each byte position of the input data stream based on whether the data starting at the respective byte position is binary or text. Use of the adaptive key size may reduce a number of hash collisions for the respective type of data. In general, a larger hash key size tends to cause fewer hash collisions for text data (i.e., data having byte values 0-127) whereas a smaller hash key size tends to cause fewer hash collisions for binary data (i.e., data having byte values 0-255). As one example, in the adaptive mode, the hash key size may be 4 bytes if the data is binary or non-text, and the hash key size may be 5 bytes if the data is text.

In order to select the appropriate hash key size for the data, hash key buffer 252 may determine a most significant bit (MSB) for each of the first 4 bytes of the hash key starting at a given byte position. If the MSBs for all of the first 4 bytes are 0, i.e., indicating byte values less than or equal to 127, then hash key buffer 252 considers the data to be text and uses a hash key size of 5 bytes. If the MSBs for at least one of the first 4 bytes is 1, i.e., indicating byte values greater than 127, then hash key buffer 252 considers the data to be binary and uses a hash key size of 4 bytes. In the adaptive mode, hash key buffer 252 may perform this determination at each byte position of the input data stream. The determination may not be stateful such that the determination at each byte position is independent and does not depend on the determinations made at previous byte positions in the input data stream.

Returning to FIG. 10, hash function unit 253 of hash controller 223 receives the hash key from hash key buffer 252, and applies a hash function to the hash key to calculate a hash index into hash table 224. The hash function may be XOR (exclusive or operation) based. Hash function unit 253 may receive multiple hash keys per clock cycle per thread from hash key buffer 252, and may calculate multiple hash indices per clock cycle per thread. For example, in the dual thread mode, hash function unit 253 may calculate up to four hash indices for up to four byte positions per cycle per thread.

The hash function applied by hash function unit 253 may generate Y bits of output for the hash key. A first portion of those Y bits may be used for the hash index. A second portion of those Y bits may be used to generate a tag that is stored in hash table 224 and used to detect hash collisions on a per-entry basis. For example, in the case of a hash collision in which different hash keys result in the same hash index, the hash collision may be resolved by comparing the tag generated for the hash key against the tags of the entries (i.e., history addresses) stored in the hash bucket identified by the hash index. The tag bits are unique among colliding hash keys. For example, the hash index for a given hash key may comprise the lower bits of the output of the hash function for the hash key while the tag for the given hash key may comprise the upper bits of the output of the hash function for the hash key. The tag may be considered a fingerprint of the hash key. If the tag for the given hash key does not match the tags of one or more of the entries stored in the hash bucket, then the entries with the non-matching tags will not be returned as potential matches for the given hash key. In this way, the tags may be used to resolve hash collisions without storing the complete hash key for each byte position.

Bank scheduler 254 of hash controller 223 is configured to schedule accesses to hash table 224 using the hash indices calculated by hash function unit 253. More specifically, hash datapath 250 uses the hash index to access a bucket of hash table 224 that includes the most recent history addresses of previous occurrences of a same string of bytes as at the current byte position of the input data stream. Bank scheduler 254 also sends the current byte position address to hash datapath 250 to write the current byte position address in the same bucket of hash table 224 identified by the hash index to make the current byte string available for future matching.

Bank scheduler 254 may be most useful when processing more than one byte position per clock cycle due to the potential for bank conflicts, in which more than one hash access is attempted in the same memory bank of hash table 224 in the same clock cycle. Processing more than one byte position per clock cycle requires more than one hash table access per clock cycle as bank scheduler 254 attempts to read hash table 224 for all of the keys prepared per clock cycle. In one of the examples discussed above, in the dual thread mode, hash table 224 may be partitioned into two memories, one for each thread, with the memory for each of the threads being partitioned into 8 banks and with each of the banks having 2k hash buckets each holding 4 history addresses. In this example, bank scheduler 254 is configured to attempt to schedule up to 4 hash accesses per clock cycle per thread.

Bank scheduler 254 attempts to schedule the multiple hash table accesses in the same clock cycle to independent banks of hash table 224, thereby avoiding bank conflicts. For example, bank scheduler 254 may include 8 entries and schedule accesses to 8 banks of hash table 224. Bank scheduler 254 may use a portion of the bits of each of the hash indices to select the one of the hash banks of hash table 224 to which to schedule the access for the given hash index. For a highest throughput mode, hash scheduler 254 may run in a no-stall mode and discard any entries that do not get scheduled due to hash bank conflicts. For higher effort modes, hash scheduler 254 may take additional clock cycles to retry hash accesses in order to reschedule as many entries as possible before discarding the unscheduled entries.

In some examples, in the case of a hash bank conflict when attempting to read hash table 224 for two or more keys in the same clock cycle, instead of ignoring or discarding unscheduled entries, bank scheduler 254 may attempt to reuse the read hash entries for the keys that were not able to be read due to the hash bank conflict. For example, if a first key 'key-x' and a second key 'key-(x+y)' prepared in the same clock cycle have the same hash index, then the first key may result in a read hash entry while the second key may be unscheduled due to the hash bank conflict. In this example, bank scheduler 254 may assign the position of the first key as a previous occurrence for the position of the second key. This short distance hashing solution may be useful in detecting repeated byte strings (e.g., "aaaaaaaa . . . "), which would typically result in repeated bank conflicts.

Entries in bank scheduler 254 will have corresponding entries in result accumulator 255. Entries in bank scheduler 254 are written in order, but hash table accesses can happen out of order. A given entry in bank scheduler 254 may remain busy until the corresponding entry in result accumulator 255 has been cleared, which also happens in order. In the case where multiple scheduler entries are accessing the same hash index, then only one hash access is required for that group of entries.

Bank scheduler 254 may also insert bubbles in the pipeline to accommodate history buffer writes, depending on the mode. As a function of effort level, bank scheduler 254 may insert bubbles into the pipeline to allow history buffer writes to be scheduled without affecting history buffer reads. At the highest throughput mode (e.g., a multi-thread mode), bubbles may not be inserted for history writes and writes may instead be scheduled ahead of reads, as needed.

Hash datapath 250 includes valid entry tracker 257, hash update logic 258, and hash table 224. As described above, hash table 224 is configurable to support single or dual thread processing and different hash table sizes depending on an operational mode of hash block 222. In the example where hash table 224 has a total storage of 128k history addresses, hash table 224 may be arranged in three different configurations. For a dual thread mode, hash table 224 may comprise two memories, one for each thread, each configured to include 16k hash buckets with each of the hash buckets holding 4 history addresses. For a higher effort single thread mode, hash table 224 may comprise a single memory configured to include 8k hash buckets with each of the hash buckets holding 16 history addresses. For a highest effort single thread mode, hash table 224 may comprise a single memory configured to include 4k hash buckets with each of the hash buckets holding 32 history addresses.

Hash table 224 may need to be initialized at the start of a new input data stream to remove any stale data left in hash table 224 and avoid security implications. In one example, hash datapath 250 may use a state machine to clear hash table 224 at the start of every stream, but that would require thousands of clock cycles, e.g., 2k clock cycles. In another example, hash datapath 250 may use valid entry tracker 257, i.e., an auxiliary data structure, to hold the initialization state of each word of each row. For example, valid entry tracker 257 may hold 32k bits of initialization state, e.g., 2k bits per bank for 16 banks with each bit representing a row in the respective bank. When valid entry tracker 27 indicates that a word has not been initialized, hash datapath 250 may replace the read data with a default value.

Figure 12:
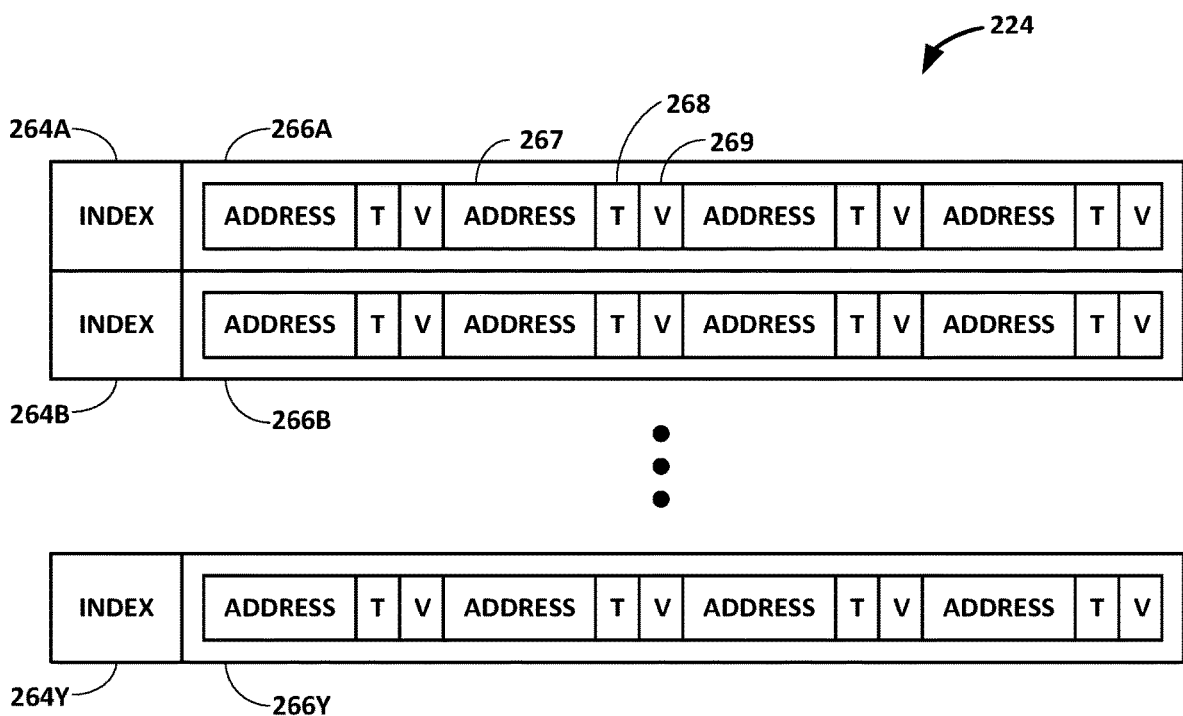
FIG. 12 is a conceptual diagram illustrating an example hash table in greater detail.

FIG. 12 is a conceptual diagram illustrating an example hash table 224 in greater detail. As illustrated in FIG. 12, hash table 224 includes hash indices 264A-264Y (collectively, "hash indices 264") and corresponding hash buckets 266A-266Y (collectively, "hash buckets 266"). Each of hash buckets 266 includes, for example, four entries where each of the entries includes a history address 267, a tag ("T") 268, and a valid bit ("V") 269. As described above, tag 268 may comprise 4 bits of the output of the hash function for a hash key. Tag 268 may be considered a fingerprint of the corresponding hash key that can be used in place of the full hash key to detect hash collisions on a per-entry basis. For any newly added entry in hash buckets 266, the respective valid bit 269 is initially set to indicate the entry as being invalid. Each newly added entry, therefore, must be validated in order to reset the valid bit 269. As described in more detail below, the tag 267 of the respective entry in hash buckets 266 may be used to qualify valid bit 269 for the respective entry.

Each of hash buckets 266 holds the most recent N addresses, four in the example of FIG. 12, that have that same index. When accessing hash table 224, hash update logic 258 of hash datapath 250 performs two operations. First, hash update logic 258 uses a hash index to read a corresponding one of hash buckets 266 of hash table 224 to get a list of history addresses that are potential matches for the data at the current byte position of the input data stream. Second, hash update logic 258 writes the current byte position to the same one of hash buckets 266 of hash table 224, dropping the oldest address if the hash bucket is already full. Hash datapath 250 returns the history addresses read from hash table 224 during each hash access per cycle per thread to results accumulator 255 of hash controller 223.

As described above, hash collisions, in which different hash keys result in the same hash index, may be reduced by use of adaptive hashing in which the key size is different based on the respective type of data, i.e., text or binary, used to prepare the hash key. When hash collisions occur, however, hash update logic 258 may be configured to filter out any invalid history addresses that result from the hash collisions. For example, an invalid history address may be a history address that is stored in a hash bucket identified by a hash index determined from a given hash key, but that points to a previous occurrence of data represented by a different hash key that results in the same hash index.

Hash update logic 258 may compare tag bits generated for the given hash key against tag 268 for each history address 267 stored in the hash bucket identified by the hash index. If the tag bits for the given hash key do not match tag 268 of the history address 267, then hash update logic 258 determines that the history address is invalid. Hash update logic 258 may then not return that history address as a potential previous occurrence of the byte string represented by the given hash key. Hash update logic 258 may make this determination on a per-entry basis within the hash bucket identified by the hash index. In this way, hash update logic 258 may return more accurate history addresses for the given hash key regardless of the occurrence of hash collisions. Regardless of whether the tag bits match, hash update logic 258 writes the current byte position as the newest history address 267 in the same hash bucket and also writes the corresponding key bits for the given hash key as the key 268 of the history address 267. The newly added entry in the hash bucket is then validated in order to reset the valid bit 269 to indicate that the new entry is valid to enable subsequent hash collision processing.

Returning to FIG. 10, results accumulator 255 of hash controller 223 receives the history addresses from hash datapath 250 and, in turn, sends the history addresses of the previous occurrences to the match block 228. Result accumulator 255 holds the output of the hash table reads (i.e., the history addresses) until it is time to send the history addresses to match block 228. Results accumulator 255 may reorder the results when processing multiple byte positions per cycle per thread. In some examples, results accumulator 255 may send up to 16 history addresses per cycle per thread to match block 228. Results accumulator 255 also sends each of the byte position addresses processed per cycle to match block 228.

Figure 13:
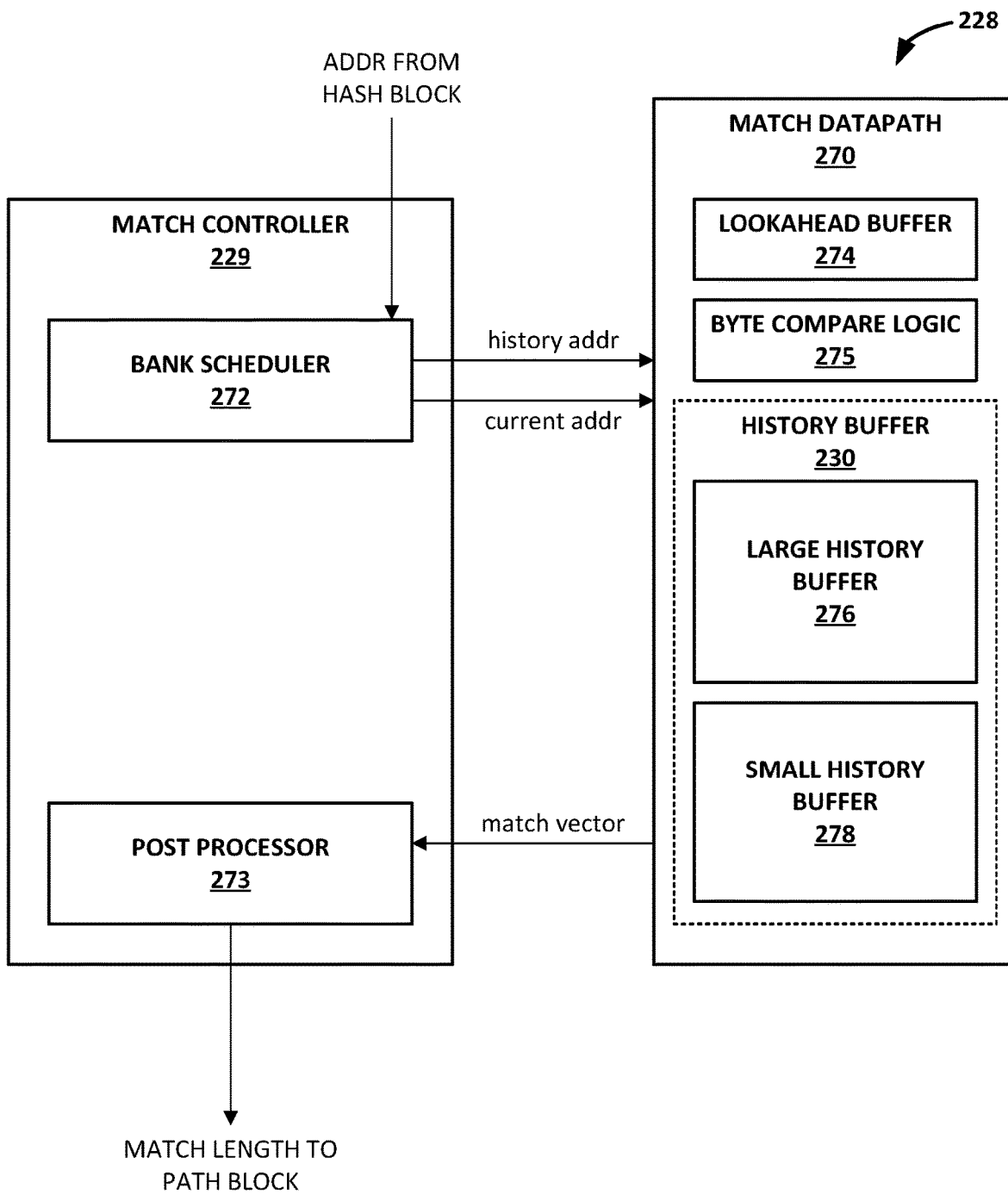
FIG. 13 is a block diagram illustrating an example architecture of a match block of the search block from FIG. 7B.

FIG. 13 is a block diagram illustrating an example architecture of match block 228 of search block 206 from FIG. 7B. In the illustrated example, match controller 229 of match block 228 includes a bank scheduler 272 and a post processor 273. Match datapath 270 of match block 228 includes history buffer 230 having a large history buffer 276 and a small history buffer 278, along with a lookahead buffer 274 and byte compare logic 275. The architecture of match block 228 illustrated in FIG. 13 is shown for exemplary purposes only. In other examples, match block 228 may be configured in a variety of ways.

Match block 228 is configurable to operate in different modes depending on the level of compression or effort desired for the input data stream. History buffer 230 is also configurable to support single or multi-thread processing with different memory bank arrangements in large history buffer 276 and small history buffer 278 depending on an operational mode of match block 228. For example, history buffer 230 may support large history buffer 276 having a size of up to 256 KB, and a small history buffer 278 having a size of up to 32 KB. Across both large history buffer 276 and small history buffer 278, history buffer 230 may include 16 banks with independent read ports each supporting 16 byte unaligned accesses or 32 byte aligned accesses.

Figure 14A:
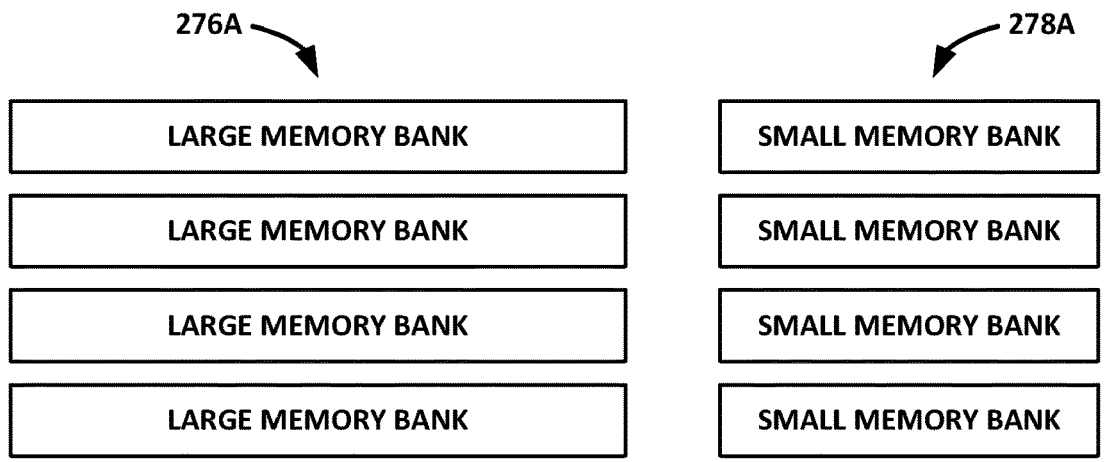
FIGS. 14A and 14B are conceptual diagrams illustrating different example configurations of a large history buffer and a small history buffer for a dual thread mode and a single thread mode, respectively.
Figure 14B:
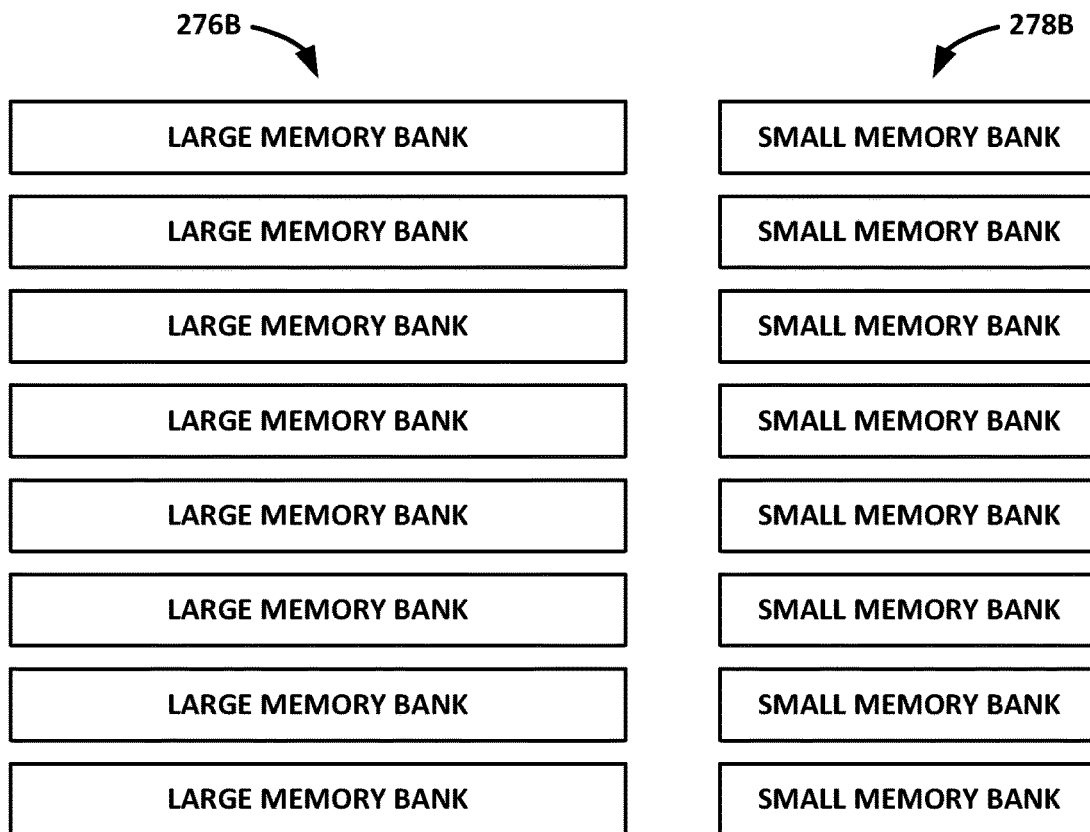

FIGS. 14A and 14B are conceptual diagrams illustrating different example configurations of large history buffer 276 and small history buffer 278 for a dual thread mode and a single thread mode, respectively. In other examples, large history buffer 276 and small history buffer 278 may be arranged in additional or different configurations.

For the dual thread mode, FIG. 14A illustrates an example history buffer configuration per thread. As one example, for the dual thread mode, a maximum history size may be 32

KB. In that example, a large history buffer 276A is configured to include a set of 4 large memory banks, each containing the full 32 KB history, per thread. In addition, a small history buffer 278A is configured to include a set of 4 small memory banks, each containing 4 KB for a total of 16 KB, per thread. The 16 KB included in small history buffer 278A may be the most recent 16 KB of the full history included in each of the large memory banks of large memory buffer 276A. The most recent history may be spread across the small memory banks in the set of small memory banks per thread using memory striping to spread access evenly across the banks. For example, the 16 KB may be spread across the 4 small memory banks using a 256 byte stripe size.

For the single thread mode, FIG. 14B illustrates an example history buffer configuration. As one example, for the single thread mode, a maximum history size may be 256 KB. In that example, a large history buffer 276B is configured to include a set of 8 large memory banks each containing 32 KB for a total of 256 KB. The full history may be spread across the large memory banks of large history buffer 276B using memory striping to spread access evenly across the banks. In addition, a small history buffer 278B is configured to include a set of 8 small memory banks each containing 4 KB for a total of 32 KB. The 32 KB included in small history buffer 278B may be the most recent 32 KB of the full history included in large memory buffer 276B. The most recent history may be spread across the small memory banks of small history buffer 278B using memory striping to spread access evenly across the banks. For example, all banks in both large history buffer 276B and small history buffer may use a 256 byte stripe size.

FIG. 15 is a conceptual diagram illustrating an example of striping data across multiple memory banks of a history buffer. Data striping, as described herein, may be used in scenarios where the memory banks of the history buffer are smaller than the allowed history size for a specific compression algorithm and where the history buffer accesses tend to be close together. According to the disclosed techniques, the entire history may be stored in the smaller memory banks by striping the history data across the memory banks. Since most of the previous occurrence matches are close to the current byte position, the data striping increases the available history size of the smaller memory banks while reducing bank conflicts when attempting to access the history to perform match checking for two or more addresses in the same cycle. This configuration may be desirable as it makes more useful history data that is closer to the current byte position available to match block 228 without dropping potential matches at longer distances from the current byte position.

In the example of FIG. 15, the full history of 256 KB for the single thread mode is spread across 8 memory banks of large history buffer 276B of FIG. 14B using a 256-byte stripe size. In other examples, a similar data striping technique may be applied to differently configured memories using different stripe sizes. For example, similar data striping techniques may be applied to small history buffer 278A of FIG. 14A or 278B of FIG. 14B to spread the small history across the small memory banks in either the dual thread mode or the single thread mode, respectively.

A single memory may be partitioned into multiple banks to enable multiple accesses to the single memory in the same clock cycle, e.g., one access per bank per cycle. Conventionally, each of the banks may hold a contiguous portion of the memory. For example, in the case of a 256 KB memory, each of 8 banks may hold a contiguous 32 KB of data. This may work well in scenarios where the multiple accesses per cycle are evenly distributed across the single memory such that the probability of bank conflicts is low. In the case of history-based compression as described in this disclosure, the history addresses for the potential matches for a current byte position are likely to be close to each other within the history buffer. In this scenario, the multiple accesses attempted per cycle are likely to hit within the same memory bank of a conventionally partitioned history.

In accordance with the described techniques, instead of partitioning a history buffer into multiple banks of contiguous data, the history buffer is partitioned into multiple banks and the data is striped across the multiple banks. In this way, each of the memory banks includes a plurality of non-contiguous stripes or bands with each of the stripes holding a fixed amount of contiguous data. As illustrated in FIG. 15, large history buffer 276B is partitioned into 8 large memory banks (Banks 1-8). Starting at Bank 1, the history data is stored in consecutive stripes of a relatively small fixed length, e.g., 256 bytes, in each of the memory banks up to Bank 8. Once the eighth stripe of data is stored in Bank 8, the process returns to Bank 1 to store the next consecutive data stripe. More specifically, as shown in FIG. 15, Bank 1 includes data stripe of bytes 0 to 255, Bank 2 includes data stripe of bytes 256 to 511, Bank 3 includes data stripe of bytes 512 to 767, Bank 4 includes data stripe of bytes 768 to 1023, Bank 5 includes data stripe of bytes 1024 to 1279, Bank 6 includes data stripe of bytes 1280 to 1535, Bank 7 includes data stripe of bytes 1536 to 1791, and Bank 8 includes data stripe of bytes 1792 to 2047 followed by returning to Bank 1 for data stripe of bytes 2048 to 2303. The striping of data into each memory bank continues until the full history, e.g., 256 KB, is stored in history buffer 276B. For example, the last data stripe in Bank 8 is for bytes 255,744 to 255,999.

Striping the history data across multiple banks of the history buffer, as described above, may help to distribute the attempted accesses per clock cycle to the different memory banks of the history buffer. Even in the case where addresses of the attempted accesses tend to be close to each other within the history buffer, the relatively small stripe size compared to the full size of each of the memory banks may effectively spread out the attempted accesses to hit within different memory banks. In this way, the striping technique may avoid bank conflicts and ensure a higher number of history buffer accesses per clock cycle.

Returning to FIG. 13, bank scheduler 272 of match controller 229 is configured to schedule accesses to history buffer 230 in match datapath 270 using the history addresses received from hash block 222. Byte compare logic 275 of match datapath 270 uses the history addresses to read a byte string of previously processed data from history buffer 230, and then compares the retrieved byte string of the previously processed data to a byte string starting from the current byte position address in the input data stream to determine potential matches. As described above with respect to FIG. 9, the input data stream is written to lookahead buffer 274 of match datapath 270 by receiver block 220 of search block 206. Bank scheduler 272 may compute a lookahead address in lookahead buffer 274 based on the current byte position address received from hash block 222 to be used by byte compare logic 275 for the comparisons to the potential matches in history buffer 230.

Bank scheduler 272 may operate in different modes depending on the level of compression or effort desired for the input data stream. For a highest throughput mode, bank scheduler 272 attempts to schedule as many accesses to history buffer 230 as possible in one clock cycle. For example, in the dual thread mode, large history buffer 276 and small history buffer 278 may be configured as shown in FIG. 14A to include 8 memory banks per thread. In this example, bank scheduler 272 may receive up to 16 history addresses from hash block 222 per cycle per thread, and schedule as many accesses as possible to the 8 banks of history buffer 230 per cycle per thread. Any scheduling entries for the history addresses that cannot be scheduled during the single clock cycle, e.g., due to bank conflicts, may be discarded.

Continuing the example in the dual thread mode, if the distances between the current byte position and the received history addresses are less than or equal to 16 KB such that the history addresses are within the most recent 16 KB of the full history included small history buffer 278A from FIG. 14A, then bank scheduler 272 may schedule up to 8 accesses per thread across the 8 banks of large history buffer 276A and small history buffer 278A. On the other hand, if the distances between the current byte position and the received history addresses are greater than 16 KB such that the history addresses are not included in small history buffer 278A, then bank scheduler 272 may only schedule up to 4 accesses per thread to across the 4 banks of large memory buffer 276A. In this way, since most of the previous occurrence matches are close to the current byte position, bank scheduler 272 is able to schedule accesses to more memory banks for those history addresses that are closer to the current byte position.

For higher effort modes, bank scheduler 272 attempts to schedule as many accesses to history buffer 230 as possible over a fixed number of clock cycles, e.g., 1 or 2 or 4 clock cycles. For example, in the single thread mode, large history buffer 276 and small history buffer 278 may be configured as shown in FIG. 14B to include 16 memory banks. In this example, bank scheduler 272 may receive up to 16 history addresses from hash block 222 per cycle, and schedule as many accesses as possible to the 16 banks of history buffer 230 over the fixed number of cycles. Any scheduling entries for the history addresses that cannot be scheduled during the fixed number of clock cycles, e.g., due to bank conflicts, may be discarded.

Continuing the example in the single thread mode, if the distances between the current byte position and the received history addresses are less than or equal to 32 KB such that the history addresses are within the most recent 32 KB of the full history included small history buffer 278B from FIG. 14B, then bank scheduler 272 may schedule up to 16 accesses per thread across the 16 banks of large history buffer 276B and small history buffer 278B. On the other hand, if the distances between the current byte position and the received history addresses are greater than 32 KB such that the history addresses are not included in small history buffer 278B, then bank scheduler 272 may only schedule up to 8 accesses per thread to across the 8 banks of large memory buffer 276B. In this way, since most of the previous occurrence matches are close to the current byte position, bank scheduler 272 is able to schedule accesses to more memory banks for those history addresses that are closer to the current byte position.

Bank scheduler 272 is also configured to schedule writes of the byte strings at the current byte position addresses of the input data stream to history buffer 230 in match datapath 270. In this way, match block 228 may continually add the most recent data from the input data stream to the self-referential history. The writes may be scheduled from lookahead buffer 274 to history buffer 230. Lookahead buffer 274 may be a 128-byte buffer configured to hold the input data stream. Lookahead buffer 274 may also function as a write buffer with support of write-to-read bypass. Once a given chunk of write data has accumulated in lookahead buffer 274, e.g., 32-bytes, and the current byte position in the input data stream has moved passed that data chunk, bank scheduler 272 may schedule a write of that data from lookahead buffer 274 to history buffer 230. For the highest throughput mode, bank scheduler 272 may track when a write is needed and schedule the write at higher priority than a read. For higher effort modes, hash block 222 may schedule a bubble for every chunk, e.g., 32-bytes, of data processed so that match block 228 has time to schedule the write to the history buffer 230 without interfering with reads. Hash block 222 may only explicitly insert bubbles if it detects the chunk of data processed without any other source of bubble.

Figure 16:
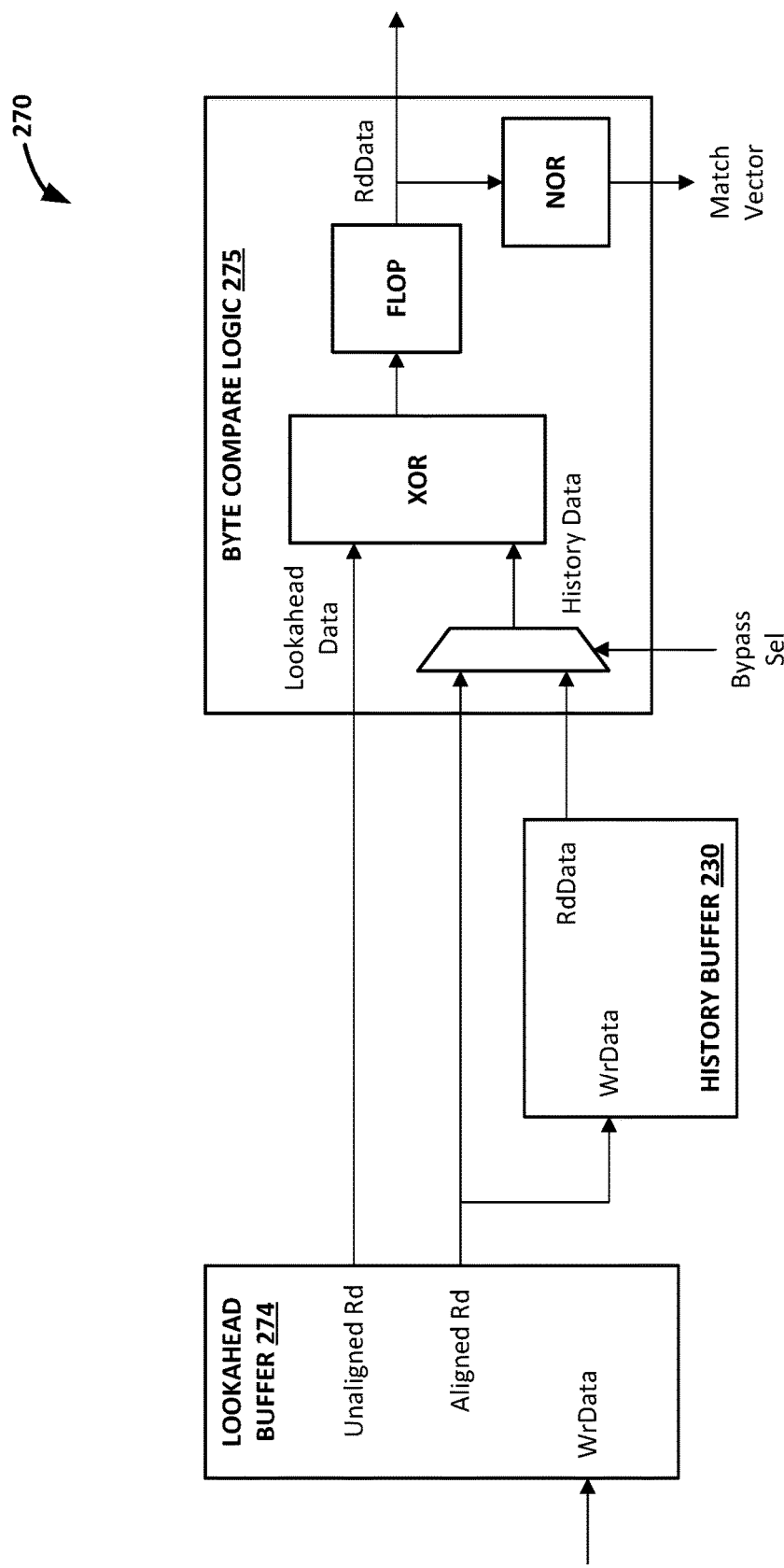
FIG. 16 is a conceptual diagram illustrating an example of a match datapath in more detail.

FIG. 16 is a conceptual diagram illustrating an example of match datapath 270 in more detail. As illustrated, match datapath 270 includes history buffer 230, lookahead buffer 274, and byte compare logic 275. Although match datapath 270 is illustrated in FIG. 16 as including only a single instance of each the components, in other examples, match datapath 270 may include multiple instances of each of the history buffer, lookahead buffer, and byte compare logic. For example, match datapath 270 may comprise a total of two banks consisting of two sub-banks or four memory instances. In one example, history buffer 230 may include two sub-banks that are each 16-bytes wide to support up to 16 byte unaligned reads or 32 byte aligned reads. Even when a read is not aligned, any data read from history buffer 230 may be used for matching by byte compare logic 275.

As described above, lookahead buffer 274 holds the input data stream and operates as a history write buffer. In the example of having four memory instances, lookahead buffer 274 may include one aligned read port and one unaligned read port per sub-bank, so a total of four aligned read ports and four unaligned read ports. As one example, all of the read ports may be 16 bytes wide. The aligned read port of lookahead buffer 274 may be used to send write data to history buffer 230, and in some cases, may be used to bypass write data to the read path of history buffer 230. The unaligned read port of lookahead buffer 274 may be used for lookahead buffer reads. The unaligned read allows the lookahead buffer read to match the alignment of the history buffer read, so that a byte level comparison can be performed by byte compare logic 275.

Byte compare logic 275 compares the data in lookahead buffer 274 to the data in history buffer 230 to find a matching sequence of bytes. More specifically, byte compare logic 275 is configured to compare a byte string on byte-by-byte basis starting from a current byte position of the input data stream stored within lookahead buffer 274 with the potential byte string matches in the previously processed data stored within history buffer 230 at the history addresses received from hash block 222. Byte compare logic 275 creates a list of matches, i.e., a match vector, between the current data stream and history buffer 230. In the example of having four memory instances, byte compare logic 275 may also have four instances with one instance per sub-bank. As one example, one instance of byte compare logic 275 may be configured to compare 16 bytes of data and generate a 16-bit match vector. The match vector is sent back to match controller 229 for the match length to be counted by post processor 273 of match controller 229.

Returning to FIG. 13, as part of the match checking process, match block 228 may be configured to perform backward matching. Backward matching may be used to determine whether one or more bytes immediately preceding a current byte position in the input data stream also match the data within history buffer 230. In some example, a potential match beginning at one of the preceding byte positions may have been missed due to a bank conflict or hash collision at hash block 222. The result of backward matching may be identification of a longer history match for a byte string in the input data stream and, hence, higher compression of the input data stream.

Figure 17:
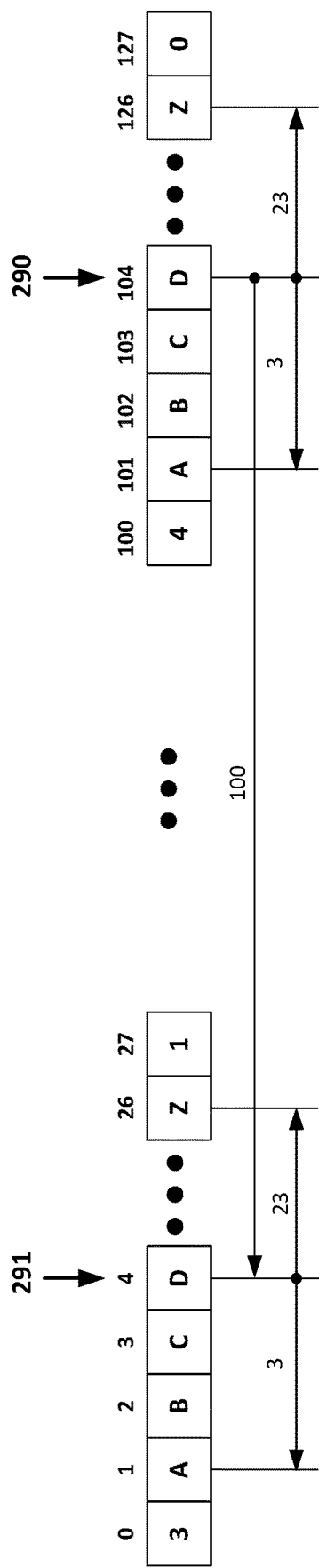
FIG. 17 is a conceptual diagram illustrating an example of backward matching performed by the match block of FIG. 13.

FIG. 17 is a conceptual diagram illustrating an example of backward matching performed by match block 228 of FIG. 13. For backward matching, bank scheduler 272 of match controller 229 may modify a history address received from hash block 222. As one example, bank scheduler 272 may be configured to modify each of the received history addresses to support matching up to 4 bytes preceding the byte position pointed to by the original history address. In other words, bank scheduler 272 may subtract up to 4 bytes from the original history address prior to scheduling the access to history buffer 230. In some cases, if this modification causes the address to cross into a different memory bank of history buffer 230, then the original history address may be used instead.

In the illustrated example of FIG. 17, the current byte position 290 of the input data stream is position 104 (the second instance of the letter "D") and the original history address 291 received from hash block 222 for the current byte position is position 4 (the first instance of the letter "D"). As shown, starting from both position 4 and position 104, the byte strings include the English alphabet from letter "D" to letter "Z" and are followed by non-matching bytes (i.e., the number "1" at position 27 and the number "0" at position 127, respectively). Byte compare logic 275, therefore, identifies a match between current byte position 290 and original history address 291 including subsequent byte positions having a length of 23 bytes in the forward direction of the input data stream.

As can be seen in the example of FIG. 17, the full match between the current byte string and the previous byte string actually begins three positions earlier in the input data stream. This match beginning at one of the preceding byte positions may have been missed due to one or more unscheduled or unsuccessful hash reads due to bank conflicts or hash collisions at hash block 222. In order to find this earlier match and, thus, generate a longer match for the current data, bank scheduler 272 may modify the original history address 291 received from hash block 222 by subtracting up to 4 positions from the original history address (e.g., from byte position 4 to byte position 0). Byte compare logic 275 may then perform the byte-by-byte comparison in the backward direction up to the modified history address at byte position 0 to identify any additional matches. As shown in FIG. 17, byte compare logic 275 identifies an additional match between current byte position 290 and original history address 291 including preceding byte positions having a length of 3 bytes in the backward direction of the input data stream. In the example of FIG. 17, this backward match is followed by non-matching bytes (i.e., the number "3" at position 0 (i.e., the modified history address) and the number "4" at position 100, respectively). In the example illustrated in FIG. 17, byte compare logic 275 may pass the 23-byte length forward match and the 3-byte length backward match determined for the current byte string at the current byte position 290 back to match controller 229 in the match vector.

Returning to FIG. 13, post processor 273 is configured to process the match vector from match datapath 270 and send the results to path block 232. Post processor 273 determines a match length for each of the matches included in the match vector. More specifically, post processor 273 counts the number of matching bytes for each history buffer access. The count starts at the current byte position and goes forward as many bytes as possible for the forward matches. For example, for each of the matches, match controller 229 may count until detecting a "match byte" as a first non-matching byte after a match or a "previous byte" as the last byte that gets matched. Post processor 273 may similarly count backwards from the current byte position for the backward matches. Post processor 273 sends the forward and backward match lengths for each of the matches to path block 232.

In some examples, the match lengths may be included in an indication sent from match block 228 to path block 232 of whether at least one match occurs for the current byte string. The indication may include the literal of original data at the current byte position, e.g., the literal "D" at current byte position 290 in the example of FIG. 17, and a number of matches, e.g., at least 1 in the example FIG. 17. For each of the matches, the indication may include a length of any forward match, e.g., 23-bytes in the example of FIG. 17, and a length of any backward match, e.g., 3-bytes in the example of FIG. 17, for the current byte string. In the case where no match occurs for the current byte sting, the indication may include the literal of original data at the current byte position with number of matches set equal to zero.

Figure 18:
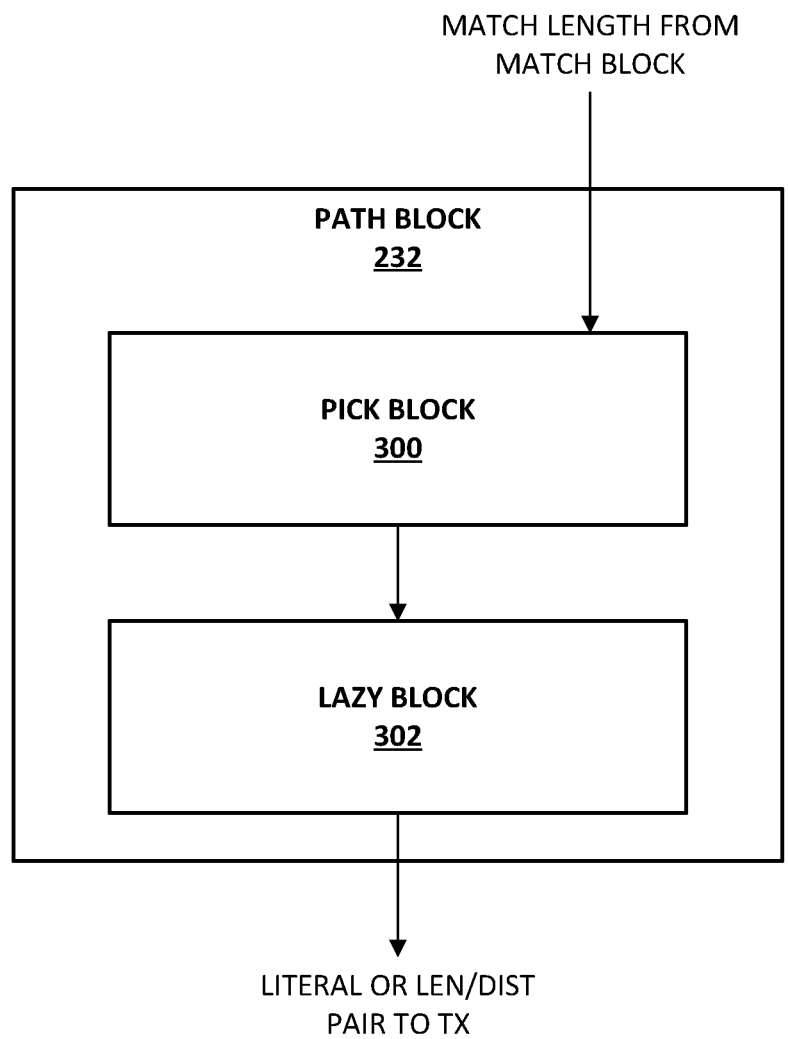
FIG. 18 is a block diagram illustrating an example architecture of a path block of the search block from FIG. 7B.

FIG. 18 is a block diagram illustrating an example architecture of path block 232 of search block 206 from FIG. 7B. In the illustrated example, path block 232 includes a pick block 300 and a lazy block 302. The architecture of path block 232 illustrated in FIG. 18 is shown for exemplary purposes only. In other examples, path block 232 may be configured in a variety of ways.

Path block 232 is configured to pick the best match (i.e., longest and closest, in that order) for each byte position of the input data stream based on the match lengths received from match block 228. Path block 232 may perform three main functions: find the best match at each byte position, select the best match within a lazy evaluation window, and/or apply post processing to merge consecutive matches to form a longer match.

Pick block 300 of path block 232 is configured to select the best match at each byte position in the input data stream, but lazy block 302 may be configured to make the final decision of whether that best match should be used for the current byte position. As one example, the selection process performed by pick block 300 may first identify the longest match for the current byte position, and, if there is a tie among two or more matches, pick block 300 may select the match having the smallest distance from the current byte position as the best match.

Pick block 300 may consider the following sources of potential matches: forward matches from the current byte position, backward matches from subsequent byte positions, and carry forward matches from previous byte positions. In the case of backward matches, match block 228 may perform backward matching, as described above with respect to FIG. 17, at each of the subsequent byte positions to explicitly look for matches at up to 4 bytes preceding each of the subsequent byte positions, i.e., including the current byte position. Pick block 300 may then consider the match lengths applied at the current byte position by any backward matches from the subsequent byte positions when selecting the best match for the current byte position. In this way, pick block 300 may allow up to 8 byte positions to be processed in parallel per thread, including the up to 4 byte positions per cycle per thread searched by hash block 222 and match block 228, and the previous 4 byte positions backward matched by match block 228.

Figure 19:
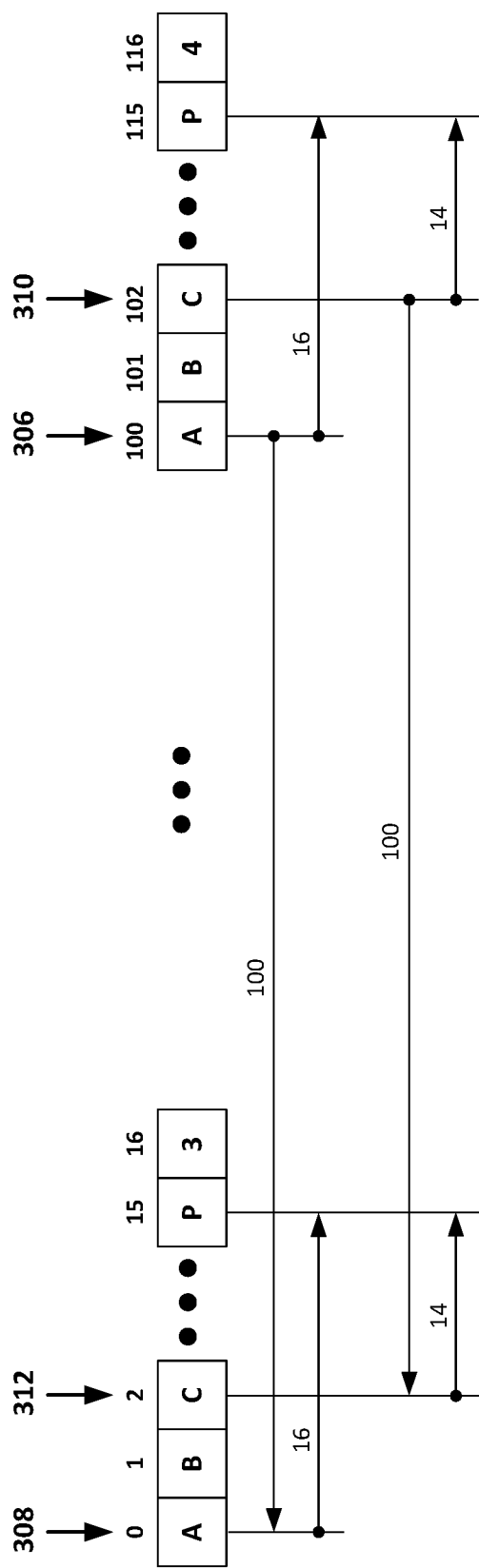
FIG. 19 is a conceptual diagram illustrating an example of carry forward matching performed by the path block of FIG. 18.

FIG. 19 a conceptual diagram illustrating an example of carry forward matching performed by path block 232 of FIG. 18. In the case of carry forward matches, pick block 300 of path block 232 may be configured to identify any matches from previous byte positions in the input data stream that overlap a current byte position, and determine truncated lengths of the matches at the current byte position. Pick block 300 may then consider the truncated match lengths applied at the current byte position by any matches from the previous byte positions when selecting the best match for the current byte position. For example, pick block 300 may look at a match of length 7 at a previous byte position that is truncated to a match of length 6 at the current byte position to identify the best match for the current byte position. Pick block 300 may look at the same match at a subsequent byte position that is truncated to a match of length of 5, and so on.

In the illustrated example of FIG. 19, a match occurs between a byte string beginning at previous byte position 306 (the second instance of letter "A" at position 100) and a previous occurrence of the byte string beginning at history address 308 (the first instance of letter "A" at byte position 0) having a length of 16 bytes in the forward direction of the input data stream. As shown, starting from both position 0 and position 100, the byte strings include the English alphabet from letter "A" to letter "P" and are followed by non-matching bytes (i.e., the number "3" at position 16 and the number "4" at position 116, respectively).

As can be seen in the example of FIG. 19, the match beginning at previous byte position 306 overlaps a current byte position 310 of the input data stream such that at least a portion of the match may be applied at the current byte position. In this case, pick block 310 determines a truncated length of the match at the current byte position to be equal to the initial length of the match beginning at previous byte position 306 less the position difference between current byte position 310 and the previous byte position 306. In the example of FIG. 19, the difference between current byte position 310 (i.e., position 102) and previous byte position 306 (i.e., position 100) is 2, and pick block 310 determines the truncated length of the match at current byte position 310 to be equal to 14 bytes (i.e., 16-2). In this way, pick block 310 may identify additional matches from previous byte positions applied at current byte position 310 and consider the match lengths of the additional matches when selecting the best match for the current byte position.

Returning to FIG. 18, in order to select the best match at the current byte position from among the forward matches, backward matches, and carry forward matches, pick block 300 may perform the following steps. First, at the current byte position "P," pick block 300 takes the backward matches received from match block 228 and attempts to extend match lengths at previous byte positions in the input data stream, i.e., byte positions (P-1), (P-2), and so on up to (P-4), based on the lengths of the backward matches. Second, pick block 300 determines a best match (i.e., longest and closest) from among the previous byte positions, and performs carry forward matching by applying the best match to the current byte position with a truncated match length. For example, if byte position (P-2) has a match length of 100 and is the best match from among byte positions (P-4) to (P-1), pick block 300 applies the match at byte position (P-2) to the current byte position P with a truncated match length of 98 (i.e., 100-2). Third, pick block 300 compares the truncated match length at the current byte position to lengths of forward matches from the current byte position to determine a longest match for the current byte position. As described above, if there is a tie for length among two or more matches, pick block 300 may select the match having the smallest distance from the current byte position as the best match.

Lazy block 302 of path block 232 is then configured to determine whether to emit a literal or a match, or nothing if a match is emitted at a previous position, for each byte position in the input data stream. Lazy block 302 may perform either a greedy match or a lazy match within a lazy window. For the greedy method, lazy block 302 uses the best match that is detected by pick block 300 for the current byte position. Lazy block 302 may select the output for the current byte position based on the best match from among all the matches received for the current byte position from match block 228 based on the history addresses identified by hash block 222. For a highest throughput mode, lazy block 302 may select the output based on the best match from among the 4 history addresses searched for the current byte position. For higher effort modes, lazy block 302 may select the output based on the best match from among the 8 or 16 history addresses searched for the current byte position.

For the lazy method, lazy block 302 looks at the next N byte positions within a lazy window and selects the output for the current byte position based on the best match across all of the positions within the lazy window. For example, if the best match at the current byte position is not the best match based on all of the byte positions within the lazy window, lazy block 302 may discard the best match at the current byte position and instead emit a literal of the original data at the current byte position. If any of the other byte positions within the lazy window affect the current byte position, lazy block 302 may update (e.g., merge or extend) the match lengths at the current byte position. After the match lengths are updated, lazy block 302 may determine the best match for the current byte position based on the current lazy window. The lazy window may then advance by 1 to the next byte position in the input data stream, and lazy block 302 may make the same determination within the new lazy window.

The lazy window may be configurable with size N set equal to an integer value between 0 and 2, where 0 is used to indicate the greedy method. For a lazy window of size 2, lazy block 302 may select the output for the current byte position based on the best match from among all the matches determined for the current byte position within the moving lazy window. For a highest throughput mode, lazy block 302 may select the output based on the best match from among 12 history addresses searched for the 3 positions within the lazy window. For higher effort modes, lazy block 302 may select the output based on the best match from among the 24 or 48 history addresses searched for the 3 positions within the lazy window.

In order to select the output for the current byte position after the three steps, described above, performed by pick block 200 to select the best match at the current byte position, lazy block 302 may perform the following steps. Fourth, lazy block 302 may determine the best match within the lazy window. If the best match at the current byte position is a best match among the byte positions within the lazy window, lazy block 302 emits a length-distance pair as a reference to the best match at the current byte position. The length-distance pair identifying the match for the current byte string includes a length set equal to a length of the repeated byte string beginning at the current byte position in the input data stream and a distance set equal to the distance from the current byte position to a history address of the previous occurrence of the byte string in history buffer 230. If the best match at the current byte position is not the best match among the byte positions within the window, lazy block 302 emits a literal of the original data at the current byte position.

Fifth, when a match is selected for the current byte position based on the current lazy window, lazy block 302 may hold the match instead of immediately outputting the match to transmitter block 234. Lazy block 302 may use the held matches to determine which byte positions in the input data stream have already been covered by a previous match such that nothing needs to be emitted for those byte positions. Lazy block 302 may also use the held matches to identify and merge consecutive matches to form longer matches. For example, when a match initially selected as output for the current byte position reaches a maximum match length without detecting an end of the initial match, lazy block 302 may determine whether matches at any subsequent byte positions within the moving lazy window extend the length of the initial match. As one example, lazy block 302 may determine whether an additional match occurs beginning one byte subsequent to the maximum match length of the initial match and having a same relative distance as the initial match.

If any of the matches extend the length of the initial match, i.e., if any of the matches at the subsequent byte positions have the same distance but extend further than the initial match, lazy block 302 may merge the matches to extend the maximum match length of the initial match beginning at the current byte position. Lazy block 302 may then select a length-distance pair identifying the initial match having the extended match length as output for the current byte position.

In some examples, the maximum match length may be 16 bytes or 32 bytes depending on the bank sizes in history buffer 230 of match block 228. Lazy block 302 may determine that the initial match reaches the maximum match length without detecting the end of the initial match based on the initial match having a length equal to the maximum match length without indicating either a "match byte" as a first non-matching byte after the initial match or a "previous byte" as a last byte of the initial match.

Once the output is selected for the byte positions being processed, lazy block 302 sends up to 4 literals and/or length-distance pairs per clock cycle per thread to transmitter block 234 for output from search block 206. For each output match, lazy block 302 may append the "match byte" as the first non-matching byte after the match or the "previous byte" as the last byte that gets matched. This information may be used by RED block 208 to generate context for encoding the next byte using LZMA compression.

Figure 20:
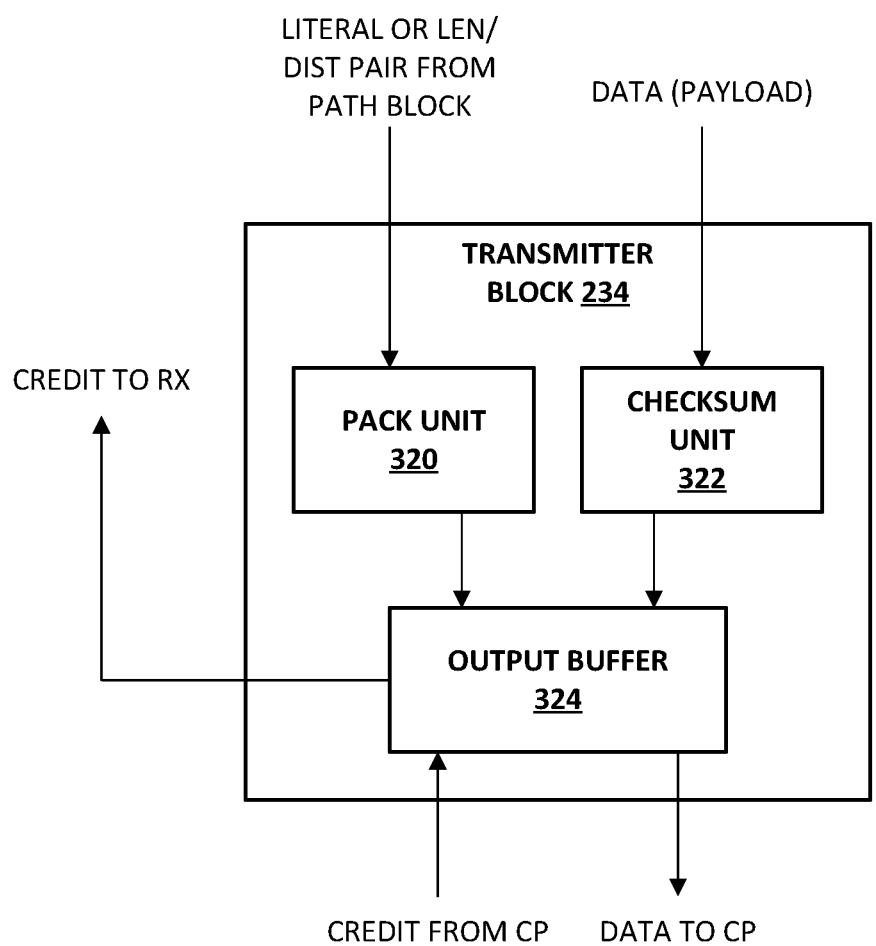
FIG. 20 is a block diagram illustrating an example architecture of a transmitter block of the search block from FIG. 7B.

FIG. 20 is a block diagram illustrating an example architecture of transmitter block 234 of search block 206 from FIG. 7B. In the illustrated example, transmitter block 234 includes a pack unit 320, a checksum unit 322, and an output buffer 324.

Pack unit 320 is configured to pack the raw output received from path block 232 into a space efficient output data stream. Pack unit 320 packs the raw literals or length-distance pairs from path block 232 into a byte aligned format before sending to CP 202 via output buffer 324. In one example, the byte aligned format of the packed data stream consists of 9 byte chunks, each with 1 byte of header data and 8 bytes of history-compressed data. In some examples, literals may consume 1 byte of data, and length-distance pairs may consume 2 bytes to 4 bytes of data. The packed data stream is then stored in output buffer 324 for transmission to CP 202. From CP 202, the data stream may be sent on to an external memory, RED block 208, or Huffman block 210.

Figure 21A:
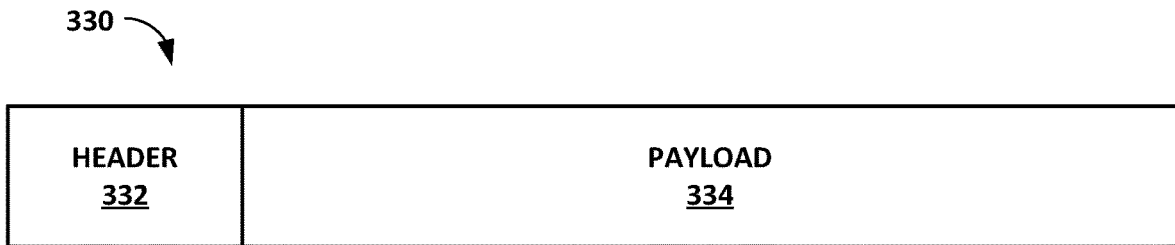
FIGS. 21A-21B are conceptual diagrams illustrating an example of a byte aligned format for packing raw literals or length-distance pairs into an output data stream output from the transmitter block of FIG. 20.
Figure 21B:
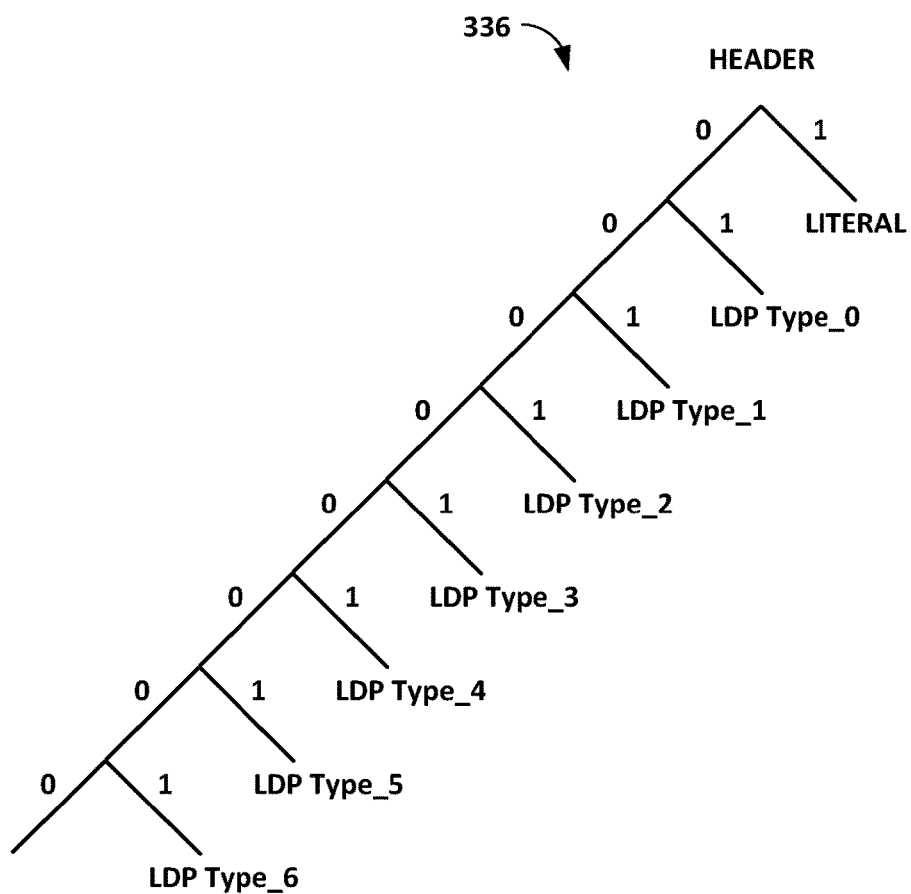

FIGS. 21A-21B are conceptual diagrams illustrating an example of a byte aligned format for packing raw literals or length-distance pairs into the output data stream output from transmitter block 234 of FIG. 20. FIG. 21A illustrates an example format of an output data stream 330 that includes a header 332 and a payload 334. Header 332 comprises 1 byte or 8 bits of header data and payload 334 includes 8 bytes or 64 bits of history-compressed data as literals and/or length-distance pairs. Each of the 8 bits of header data within header 332 describes one of the 8 bytes of history-compressed data within payload 334. In this way, output data stream 330 fits on a 72 bit bus between search block 206 and RED block 208 or Huffman block 210.

FIG. 21B illustrates an example tree structure 336 for header data included within header 332 of output data stream 330. As described above, each of the 8 bits of header data within header 332 describes one of the 8 bytes of history-compressed data within payload 334. More specifically, each of the 8 bits of header data indicates whether a literal or a length-distance pair is held at a given byte within payload 334.

According to the tree structure 336 illustrated in FIG. 21B, pack unit 302 sets the first bit of header data within header 332 equal to "1" to indicate that the first byte within payload 334 holds a literal. Alternatively, pack unit 302 sets the first bit of header data within header 332 equal to "0" to indicate that the first byte within payload 334 holds a length-distance pair. Pack unit 302 then follows tree structure 336 until it sets a subsequent bit of header data in header 332 equal to "1" to indicate a specific type of length-distance pair, e.g., LDP Type_0 through LDP Type_6, held by the corresponding bytes of history-compressed data within payload 334. The type of length-distance pair may be based on the length and the distance of the match to be output for the first byte position. Longer matches and/or larger distances from the current byte position in the input data stream typically consume more bytes within payload 334 and, thus, are indicated by a longer bit string within header 332.

As one example, according to the tree structure 336, the bit string "01" within header 332 indicates that the corresponding bytes within payload 334 hold a length-distance pair of LDP Type_0, which uses bits [15:0] within payload 334 with bits [15:12] defined for length and bits [11:0] defined for distance. As another example, according to the tree structure 336, the bit string "001" within header 332 indicates that the corresponding bytes within payload 334 hold a length-distance pair of LDP Type_1, which uses bits [23:0] within payload 334 with bits [23:15] defined for length and bits [14:0] defined for distance. The types of length-distance pairs for each of LDP Type_2 through LDP Type_6 may be similarly defined.

Once pack unit 302 sets a bit of header data within header 332 equal to "1," in order to indicate either a literal or a specific type of length-distance pair for the corresponding bytes within payload 334, pack unit 302 then returns to the top of tree structure 336 to determine the next bit or bit string for inclusion in header 332 for the next bytes within payload 302. For example, a bit string of "11111111" within header 332 indicates that each of the 8 bytes of data within payload 334 comprises a literal. As another example, a bit string of "10010101" within header 332 indicates that the 8 bytes of data within payload 334 comprise a literal, a length-distance pair of LDP Type_1, a first length-distance pair of LDP Type_0, and a second length-distance pair of LDP Type_0.

Returning to FIG. 20, checksum unit 322 is configured to compute a checksum, e.g., either CRC32 or Adler32, on the uncompressed data of the input data stream to detect errors that may have been introduced during processing and storage in the pipeline of search block 206. The checksum may be sent out during a final cycle of processing the input data stream when an end-of-stream is asserted along with other information, such as any determined error codes. The checksum may be preloaded to handle data files that are split across multiple packets. In this way, checksum unit 322 may resume checksum computation for partially processed input.

Output buffer 324 receives the packed data stream of the history compressed output from pack unit 320. Output buffer 324 may comprise a FIFO (first in, first out) buffer sized to hold data in flight in the pipeline of search block 206. Output buffer 324 is configured to handle flow control with receiver block 220 for the pipeline of search block 206. Output buffer 324 uses credit-based flow control by returning credits to receiver block 220 based on the amount of space available to store data in output buffer 324. Output buffer 324 is also configured to respond to flow control from CP 202 for the egress interface to avoid transmitting more data than the egress interface can handle. Output buffer 324 uses credit-based flow control based on credits received from CP 202 based on the amount of bandwidth available for the egress interface.

Figure 22:
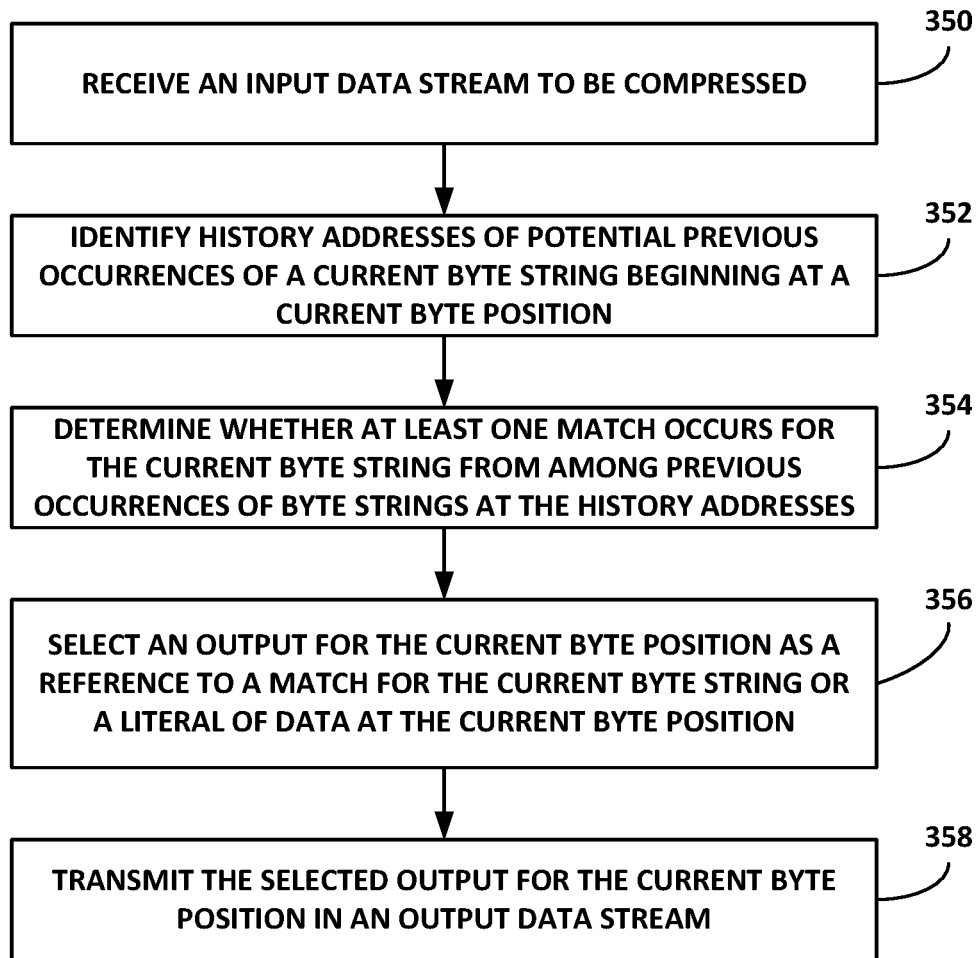
FIG. 22 is a flowchart illustrating an example history-based data compression operation performed in accordance with the techniques of this disclosure.

FIG. 22 is a flowchart illustrating an example history-based data compression operation performed in accordance with the techniques of this disclosure. The operation illustrated in FIG. 22 may be performed by, e.g., the components of search block 206 from FIGS. 7A and 7B, or other devices in other examples. Furthermore, the operation of FIG. 22 may be performed in a different order or with fewer operations than what is shown in FIG. 22. As illustrated in FIG. 7B, search block 206 is implemented as a pipeline for performing history-based compression on an input data stream. More specifically, search block 206 replaces a string of bytes in the input data stream with a previous occurrence of the same string of bytes to achieve compression.

Search block 206 receives an input data stream to be compressed (350). Hash block 222 of search block 206 identifies one or more history addresses of potential previous occurrences of a current byte string beginning at a current byte position in the input data stream (352). More specifically, hash block 222 is configured to prepare a 'key' at each input byte position by selecting 'N' number of bytes starting with the input byte at the respective position and use the key to calculate a hash index into hash table 224. Hash block 222 uses the hash index to access a bucket of hash table 224 that contains history addresses of any previous occurrences of the same string of bytes in the input data stream. Hash block 222 then sends the history addresses of the previous occurrences to match block 228 and records the current byte position address into the same bucket in hash table 224.

Match block 228 of search block 206 determines whether at least one match occurs for the current byte string from among one or more previous occurrences of byte strings at the history addresses (354). More specifically, match block 228 is configured to match the string of bytes at the current position with the string of bytes at the previous occurrences identified by the history addresses in history buffer 230, and send the matches to path block 232.

Path block 232 of search block 206 selects an output for the current byte position, wherein the output for the current byte position comprises one of a reference to a match for the current byte string or a literal of original data at the current byte position (356). More specifically, path block 232 is configured to pick the best match at each position (i.e., longest and closest, in that order) and send the best match as compressed output of search block 206. Search block 206 then transmits the selected output for the current byte position in an output data stream (358).

Figure 23:
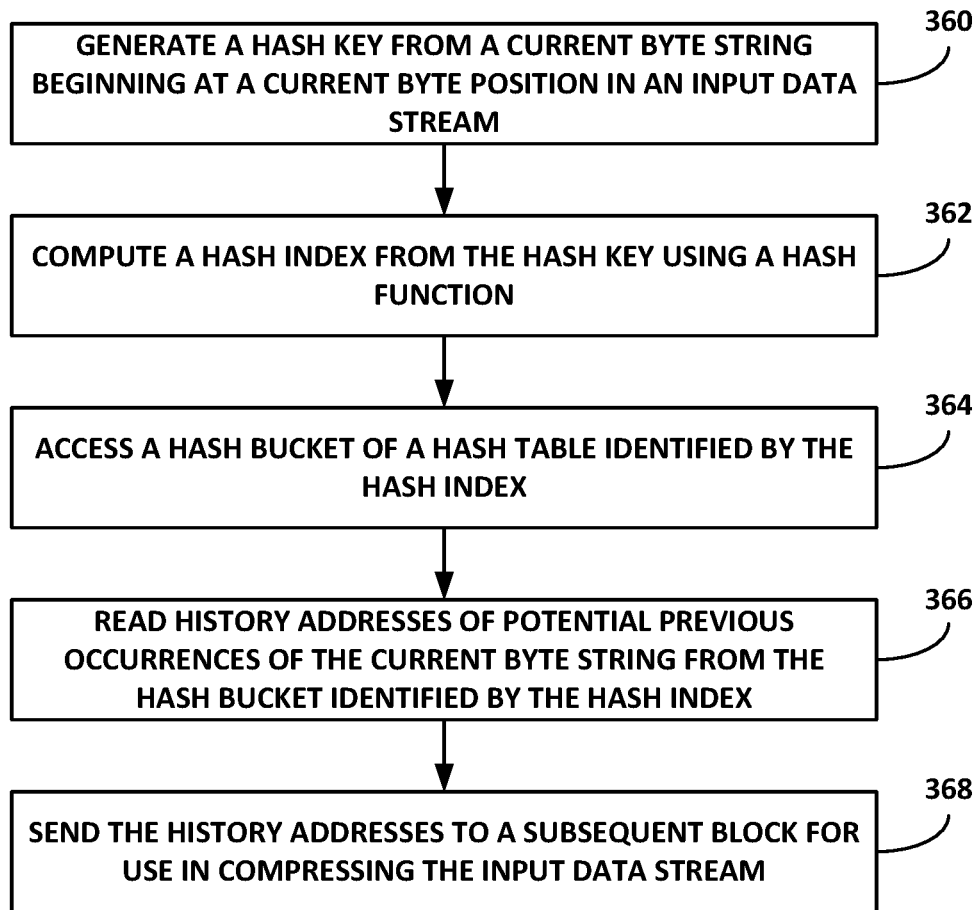
FIG. 23 is a flowchart illustrating an example hashing operation for history-based data compression performed in accordance with the techniques of this disclosure.

FIG. 23 is a flowchart illustrating an example hashing operation for history-based data compression performed in accordance with the techniques of this disclosure. The operation illustrated in FIG. 23 may be performed by, e.g., the components of hash block 222 from FIG. 10, or other devices in other examples. Furthermore, the operation of FIG. 23 may be performed in a different order or with fewer operations than what is shown in FIG. 23.

Hash block 222 generates a hash key from a current byte string beginning at a current byte position in an input data stream to be compressed (360). Hash block 222 computes a hash index from the hash key using a hash function (362) and accesses a hash bucket of hash table 224 identified by the hash index (364). In some examples, hash block 222 is configured to index a set of M keys generated using N-byte strings at M byte positions into hash table 224 in parallel during a single clock cycle by dividing hash table 224 into banks and accessing the banks in parallel. In this way, hash block 222 will process up to M byte positions per clock cycle. Hash block 222 may be configured to avoid hash collisions by performing adaptive hashing in which the key size is different for non-text or binary data than for text data. Hash block 222 may be further configured to resolve hash collisions by generating a tag for each key and then comparing the tag for the respective key against the tags of the entries stored in the hash bucket, where the tag bits are unique among colliding keys.

During the hash table access, hash block 222 reads one or more history addresses of potential previous occurrences of the current byte string in the input data stream from the hash bucket identified by the hash index, wherein the history addresses comprise byte positions of previous occurrences of byte strings (366). In the case of a bank conflict when attempting to read hash table 224 for two or more keys in the same cycle, hash block 222 may assign a first key position as a previous occurrence for a second key position. Hash block 222 then sends the one or more history addresses read from hash table 224 to a subsequent block in the pipeline of search block 206, e.g. match block 228, for use in compressing the input data stream (368).

Figure 24:
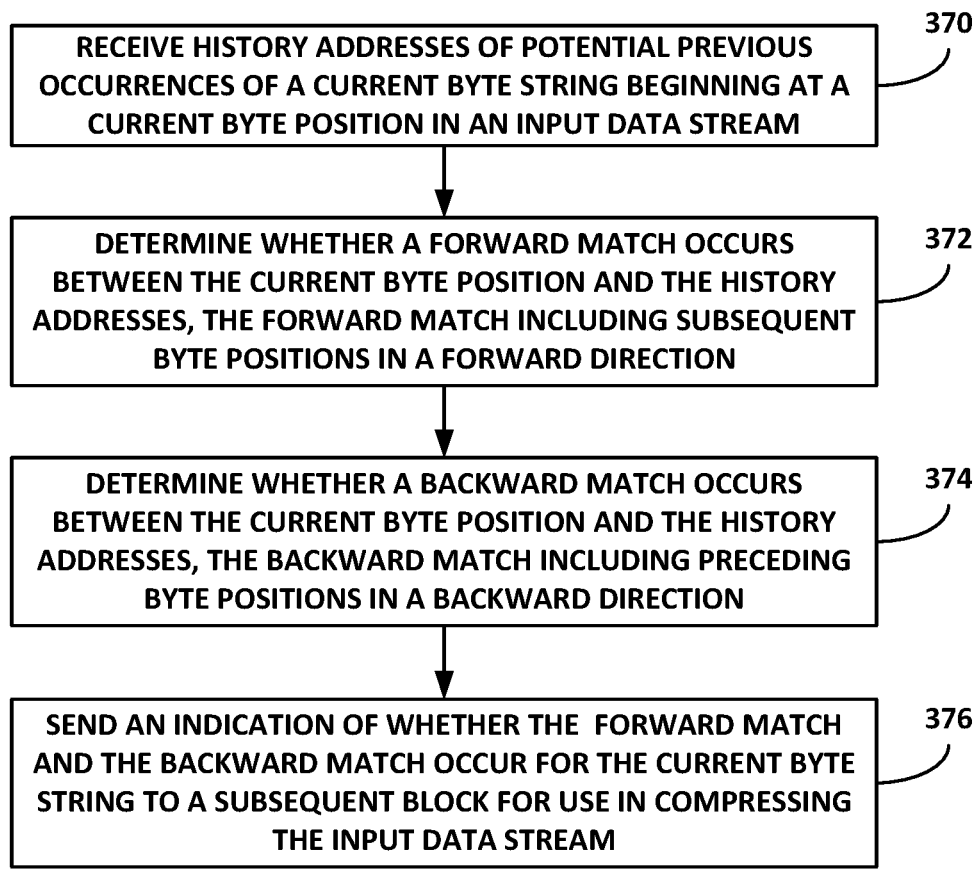
FIG. 24 is a flowchart illustrating an example matching operation for history-based data compression performed in accordance with the techniques of this disclosure.

FIG. 24 is a flowchart illustrating an example matching operation for history-based data compression performed in accordance with the techniques of this disclosure. The operation illustrated in FIG. 24 may be performed by, e.g., the components of match block 228 from FIG. 13, or other devices in other examples. Furthermore, the operation of FIG. 24 may be performed in a different order or with fewer operations than what is shown in FIG. 24.

Match block 228 receives one or more history addresses of potential previous occurrences of a current byte string beginning at a current byte position in an input data stream (370). Match block 228 determines whether at least one forward match occurs between the current byte position of the current byte string and the history addresses of one or more previous occurrences of byte strings, the forward match including subsequent byte positions in a forward direction of the input data stream, wherein the history addresses comprise byte positions of the previous occurrences of byte strings stored in history buffer 230 (372). Match block 228 is configured to determine whether string matches have occurred beginning at each byte position in a forward direction by comparing the previously processed input data stored at the history addresses received from hash block 222.

Match block 228 also determines whether at least one backward match occurs between the current byte position of the current byte string and the history addresses of the one or more previous occurrences of byte strings, the backward match including preceding byte positions in a backward direction of the input data stream (374). For backward matching, match block 228 may be configured to determine whether a byte sequence of one or more bytes beginning at each byte position in a backward direction matches a string of bytes at the identified history address. In this way, for each byte position, match block 228 may determine match lengths in both the forward direction and the backward direction beginning at the current byte position. Match block 228 then sends an indication of whether the at least one forward match and the at least one backward match occur for the current byte string to a subsequent block in the pipeline of search block 206, e.g. path block 232, for use in compressing the input data stream based on the matches (376).

Figure 25:
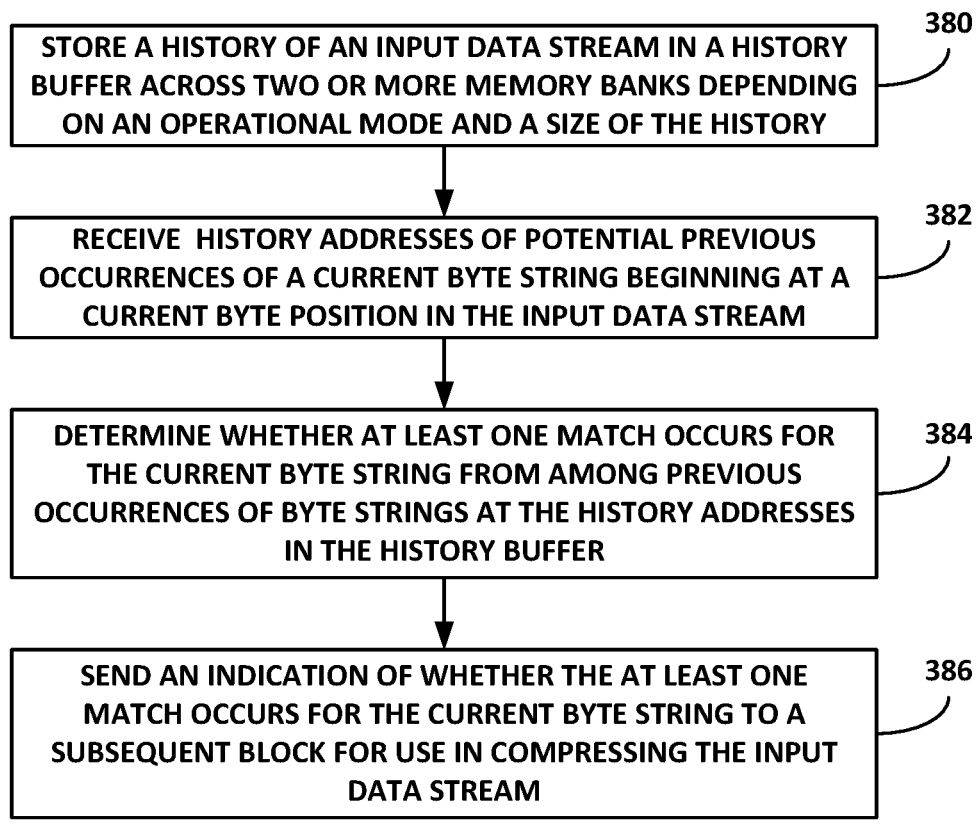
FIG. 25 is a flowchart illustrating an example data striping operation for history-based data compression performed in accordance with the techniques of this disclosure.

FIG. 25 is a flowchart illustrating an example data striping operation for history-based data compression performed in accordance with the techniques of this disclosure. The operation illustrated in FIG. 25 may be performed by, e.g., the components of match block 228 from FIG. 13, or other devices in other examples. Furthermore, the operation of FIG. 25 may be performed in a different order or with fewer operations than what is shown in FIG. 25.

Match block 228 stores a history of an input data stream in history buffer 230 across two or more memory banks of history buffer 230 depending on an operational mode of match block 228 and a size of the history (380). In some examples, the memory banks of history buffer 230 may be large enough to hold the entire history size allowed by a specific compression algorithm. In other examples, however, the memory banks of history buffer 230 may be smaller than the allowed history size. The entire history may be stored in the memory banks by striping the history data across the memory banks.

Match block 228 receives one or more history addresses of potential previous occurrences of a current byte string beginning at a current byte position in the input data stream (382). Match block 228 determines whether at least one match occurs for the current byte string from among one or more previous occurrences of byte strings stored at the one or more history addresses in history buffer 230 (384). Since most of the previous occurrence matches are close to the current byte position, data striping increases the available history size of smaller memory banks while reducing bank conflicts when attempting to access the history to perform match checking for two or more addresses in the same cycle. Match block 228 then sends an indication of whether the at least one match occurs for the current byte string to a subsequent block in the pipeline of search block 206, e.g. path block 232, for use in compressing the input data stream based on the match (386).

Figure 26:
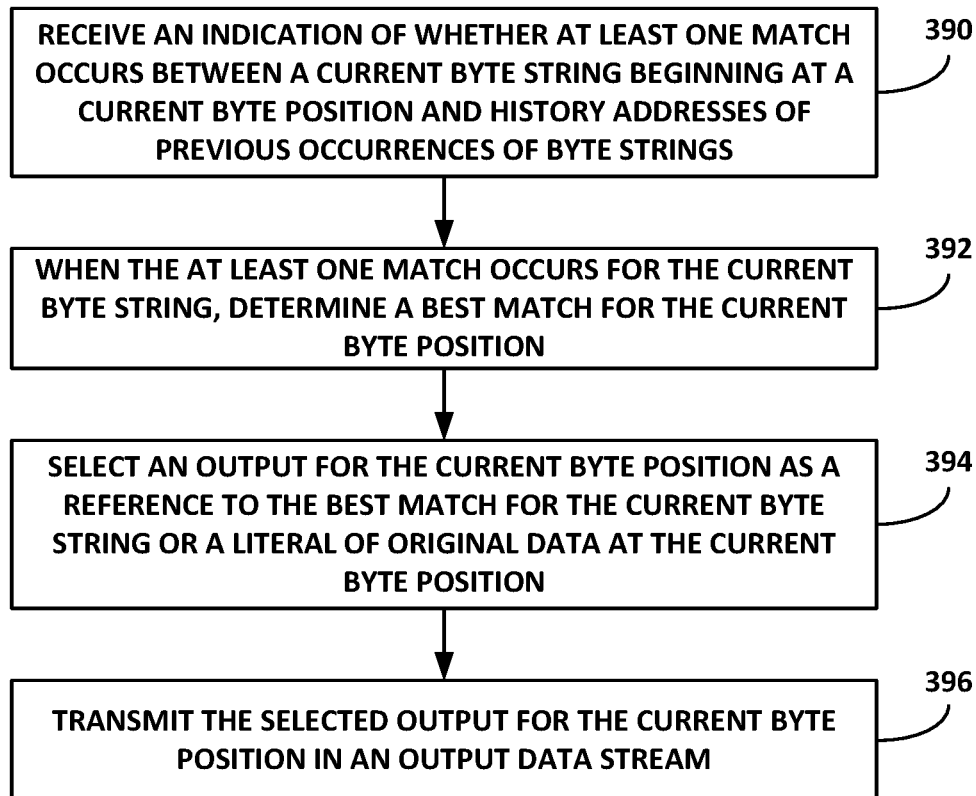
FIG. 26 is a flowchart illustrating an example merging and output selection operation for history-based data compression performed in accordance with the techniques of this disclosure.

FIG. 26 is a flowchart illustrating an example merging and output selection operation for history-based data compression performed in accordance with the techniques of this disclosure. The operation illustrated in FIG. 26 may be performed by, e.g., the components of path block 232 from FIG. 18, or other devices in other examples. Furthermore, the operation of FIG. 26 may be performed in a different order or with fewer operations than what is shown in FIG. 26.

Path block 232 receives an indication of whether at least one match occurs between a current byte string beginning at a current byte position in an input data stream and one or more history addresses of one or more previous occurrences of byte strings (390). When the at least one match occurs for the current byte string, path block 232 determines a best match for the current byte position (392). More specifically, path block 232 is configured to select the longest and closest match at each byte position and merge consecutive matches to form a longer match. When selecting the longest and closest match, path block 232 may consider the following sources of potential matches: forward matches from the current byte position, backward matches from subsequent byte positions, and carry forward matches from previous byte positions. In the case of carry forward matches, path block 232 may be configured to determine whether any matches from previous byte positions in the input data stream overlap a current byte position, and, if so, determine a truncated length of the match at the current byte position.

Path block 232 selects an output for the current byte position, wherein the output for the current byte position comprises one of a reference to the best match for the current byte string or a literal of original data at the current byte position (394). For example, path block 232 may be configured to support lazy match in which path block 232 determines whether it is better to output a length-distance pair to represent a match beginning at the current byte position or to output a literal for the current byte position based on matches at other byte positions within a configurable window. When a match initially selected as output for the current byte position has a maximum match length, path block 232 may determine whether matches at any subsequent byte positions extend the length of the initial match, and, if so, merge the matches to form a longer match at the current byte position. Path block 232 then transmits the selected output for the current byte position in an output data stream (396).

Various examples have been described. These and other examples are within the scope of the following claims.

What is claimed is:

1. A method comprising:
   storing, by a match block of a search engine of a processing device, a history of an input data stream in a history buffer across two or more memory banks of the history buffer depending on an operational mode of the match block and a size of the history;
   receiving, by the match block, one or more history addresses of potential previous occurrences of a current byte string beginning at a current byte position in the input data stream;
   determining, by the match block, whether at least one match occurs for the current byte string from among one or more previous occurrences of byte strings stored at the one or more history addresses in the history buffer; and
   sending, by the match block and to a subsequent block of the search engine, an indication of whether the at least one match occurs for the current byte string for use in compressing the input data stream based on the match.

2. The method of claim 1, wherein storing the history of the input data stream in the history buffer comprises storing the history using data striping across the two or more memory banks of the history buffer, wherein each of the memory banks comprises a plurality of non-contiguous stripes of data with each of the stripes including a fixed amount of contiguous data.

3. The method of claim 2, wherein storing the history of the input data stream in the history buffer using data striping across the two or more memory banks comprises:
   storing a first portion of the history in a first stripe of a first one of the memory banks of the history buffer;
   storing a second, subsequent portion of the history in a first stripe of a second one of the memory banks of the history buffer; and
   after storing another portion of the history in a first stripe of a last one of the memory banks of the history buffer, storing a next portion of the data in a second stripe of the first one of the memory banks of the history buffer.

4. The method of claim 1, further comprising configuring the history buffer to include a large history buffer with a set of two or more large memory banks per thread and a small history buffer with a set of two or more small memory banks per thread.

5. The method of claim 4, further comprising, when distances between the current byte position and the history addresses are less than or equal to a size of the small history buffer, scheduling accesses for the history addresses to each of the small memory banks of the small history buffer and each of the large memory banks of the large history buffer during the one or more clock cycles per thread.

6. The method of claim 4, further comprising, when distances between the current byte position and the history addresses are greater than a size of the small history buffer, scheduling accesses for the history addresses to each of the large memory banks of the large history buffer during the one or more clock cycles per thread.

7. The method of claim 4, wherein the match block is configured to operate in a multi-thread mode and the history comprises a small history, wherein storing the history of the input data stream in the history buffer comprises:
   storing a full history of the input data stream in each of the large memory banks in the set of large memory banks per thread; and
   storing a most recent portion of the full history using data striping across all of the small memory banks in the set of small memory banks per thread.

8. The method of claim 4, wherein the match block is configured to operate in a single thread mode and the history comprises a large history, and wherein storing the history of the input data stream in the history buffer comprises:
   storing a full history of the input data stream using data striping across all of the large memory banks in the set of large memory banks for the single thread; and
   storing a most recent portion of the full history using data striping across all of the small memory banks in the set of small memory banks for the single thread.

9. The method of claim 1, wherein the one or more history addresses are located in different memory banks of the history buffer, the method further comprising reading, by the match block, the one or more previous occurrences of byte strings stored at the one or more history addresses in the history buffer during one or more clock cycles.

10. The method of claim 1, wherein at least some of the one or more history addresses are located in a same one of the memory banks of the history buffer, the method further comprising:
   scheduling as many accesses as possible for the history addresses to different memory banks of the history buffer during one or more clock cycles depending on an effort level; and
   when accesses for two of the history addresses are scheduled to the same one of the memory banks of the history buffer during a same clock cycle and a scheduling entry for one of the history addresses cannot be rescheduled during a subsequent clock cycle, discarding the scheduling entry for the one of the history addresses and not reading a previous occurrence of a byte string stored at the one of the history addresses in the history buffer.

11. A processing device comprising:
   a memory configured to store a history buffer; and
   a match block of a search engine of the processing device, the match block configured to:
      store a history of an input data stream in the history buffer across two or more memory banks of the history buffer depending on an operational mode of the match block and a size of the history;
      receive one or more history addresses of potential previous occurrences of a current byte string beginning at a current byte position in the input data stream;
      determine whether at least one match occurs for the current byte string from among one or more previous occurrences of byte strings stored at the one or more history addresses in the history buffer; and
      send, to a subsequent block of the search engine, an indication of whether the at least one match occurs for the current byte string for use in compressing the input data stream based on the match.

12. The device of claim 11, wherein, to store the history of the input data stream in the history buffer, the match block is configured to store the history using data striping across the two or more memory banks of the history buffer, wherein each of the memory banks comprises a plurality of non-contiguous stripes of data with each of the stripes including a fixed amount of contiguous data.

13. The device of claim 12, wherein, to store the history of the input data stream in the history buffer using data striping across the two or more memory banks, the match block is configured to:
   store a first portion of the history in a first stripe of a first one of the memory banks of the history buffer;
   store a second, subsequent portion of the history in a first stripe of a second one of the memory banks of the history buffer; and
   after storing another portion of the history in a first stripe of a last one of the memory banks of the history buffer, store a next portion of the data in a second stripe of the first one of the memory banks of the history buffer.

14. The device of claim 11, wherein the match block is configured to configure the history buffer to include a large history buffer with a set of two or more large memory banks per thread and a small history buffer with a set of two or more small memory banks per thread.

15. The device of claim 14, wherein the match block is configured to, when distances between the current byte position and the history addresses are less than or equal to a size of the small history buffer, schedule accesses for the history addresses to each of the small memory banks of the small history buffer and each of the large memory banks of the large history buffer during the one or more clock cycles per thread.

16. The device of claim 14, wherein the match block is configured to, when distances between the current byte position and the history addresses are greater than a size of the small history buffer, schedule accesses for the history addresses to each of the large memory banks of the large history buffer during the one or more clock cycles per thread.

17. The device of claim 14, wherein the match block is configured to operate in a multi-thread mode and the history comprises a small history, and wherein, to store the history of the input data stream in the history buffer, the match block is configured to:
- store a full history of the input data stream in each of the large memory banks in the set of large memory banks per thread; and
- store a most recent portion of the full history using data striping across all of the small memory banks in the set of small memory banks per thread.

18. The device of claim 14, wherein the match block is configured to operate in a single thread mode and the history comprises a large history, and wherein, to store the history of the input data stream in the history buffer, the match block is configured to:
- store a full history of the input data stream using data striping across all of the large memory banks in the set of large memory banks for the single thread; and
- store a most recent portion of the full history using data striping across all of the small memory banks in the set of small memory banks for the single thread.

19. The device of claim 11, wherein the one or more history addresses are located in different memory banks of the history buffer, and wherein the match block is configured to read the one or more previous occurrences of byte strings stored at the one or more history addresses in the history buffer during one or more clock cycles.

20. The device of claim 11, wherein at least some of the one or more history addresses are located in a same one of the memory banks of the history buffer, and wherein the match block is configured to:
- schedule as many accesses as possible for the history addresses to different memory banks of the history buffer during one or more clock cycles depending on an effort level; and when accesses for two of the history addresses are scheduled to the same one of the memory banks of the history buffer during a same clock cycle and a scheduling entry for one of the history addresses cannot be rescheduled during a subsequent clock cycle, discard the scheduling entry for the one of the history addresses and not read a previous occurrence of a byte string stored at the one of the history addresses in the history buffer.

* * * * *